United States Patent
Chanemougame et al.

(10) Patent No.: US 10,090,193 B1
(45) Date of Patent: Oct. 2, 2018

(54) INTEGRATED CIRCUIT STRUCTURE INCORPORATING A STACKED PAIR OF FIELD EFFECT TRANSISTORS AND A BURIED INTERCONNECT AND METHOD

(71) Applicant: GLOBALFOUNDRIES INC., Grand Cayman (KY)

(72) Inventors: Daniel Chanemougame, Niskayuna, NY (US); Lars Liebmann, Mechanicville, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/814,445

(22) Filed: Nov. 16, 2017

(51) Int. Cl.
*H01L 21/768* (2006.01)
*H01L 29/66* (2006.01)
*H01L 21/8234* (2006.01)
*H01L 21/8252* (2006.01)
(Continued)

(52) U.S. Cl.
CPC .... *H01L 21/7681* (2013.01); *H01L 21/76843* (2013.01); *H01L 21/8252* (2013.01); *H01L 21/82345* (2013.01); *H01L 21/823431* (2013.01); *H01L 21/823456* (2013.01); *H01L 21/823475* (2013.01); *H01L 27/092* (2013.01); *H01L 29/0673* (2013.01); *H01L 29/66446* (2013.01)

(58) Field of Classification Search
CPC ........... H01L 21/823871; H01L 27/092; H01L 27/0922; H01L 29/0673
See application file for complete search history.

(56) References Cited

U.S. PATENT DOCUMENTS

| 8,274,119 | B2 * | 9/2012 | Xiao | ................. | H01L 29/78696 |
| | | | | | 257/350 |
| 8,492,220 | B2 | 7/2013 | Erickson et al. | | |
| 9,431,388 | B1 * | 8/2016 | Gauthier, Jr. | ....... | H01L 27/0255 |

(Continued)

OTHER PUBLICATIONS

U.S. Appl. No. 15/814,435, Office Action Communication dated Jun. 15, 2018, pp. 1-9.

(Continued)

*Primary Examiner* — Bryan Junge
(74) *Attorney, Agent, or Firm* — Gibb & Riley, LLC; Yuanmin Cai

(57) ABSTRACT

Disclosed is an integrated circuit (IC) structure that incorporates stacked pair(s) of field effect transistors (FETs), where each stacked pair has a shared gate. The structure also includes an irregular-shaped buried interconnect that connects source/drain regions that are on opposite sides of the shared gate and at different levels (i.e., a lower FET's source/drain region on one side of the shared gate to an upper FET's source/drain region on the opposite side). Also disclosed is a method for forming the structure by forming, during different process stages, different sections of an irregular-shaped cavity (including sections that expose surfaces of the source/drain regions at issue and a section with sidewalls lined by a dielectric spacer) and filling the different sections with sacrificial material. When all of the sections are completed, the sacrificial material is selectively removed, thereby creating the irregular-shaped cavity. Then, the buried interconnect is formed within the cavity.

20 Claims, 46 Drawing Sheets

(51) Int. Cl.
    *H01L 27/092*     (2006.01)
    *H01L 29/06*     (2006.01)

(56) References Cited

U.S. PATENT DOCUMENTS

| | | |
|---|---|---|
| 9,508,712 B2 | 11/2016 | Wahl et al. |
| 9,685,564 B2 | 6/2017 | Sengupta et al. |
| 9,837,414 B1 * | 12/2017 | Balakrishnan ...... H01L 27/0921 |
| 2007/0007601 A1 | 1/2007 | Hsu et al. |
| 2008/0173944 A1 | 7/2008 | Coronel et al. |
| 2009/0050941 A1 * | 2/2009 | Yamazaki ......... H01L 21/76254 257/255 |
| 2009/0142888 A1 * | 6/2009 | Tsuchiya ............. H01L 21/8221 438/151 |
| 2010/0295021 A1 * | 11/2010 | Chang ................ H01L 27/1203 257/24 |
| 2011/0254013 A1 | 10/2011 | Xiao et al. |
| 2013/0341704 A1 | 12/2013 | Rachmady et al. |
| 2016/0043074 A1 * | 2/2016 | Hurley ................ H01L 21/8258 257/351 |
| 2016/0111513 A1 | 4/2016 | Liu et al. |
| 2017/0005106 A1 | 1/2017 | Zhang |
| 2017/0040321 A1 | 2/2017 | Mitard |
| 2017/0133279 A1 * | 5/2017 | Peng ............... H01L 21/823821 |
| 2017/0162687 A1 | 6/2017 | Miyairi et al. |
| 2017/0243866 A1 * | 8/2017 | Then ...................... H01L 27/092 |
| 2018/0061766 A1 * | 3/2018 | Goktepeli ........... H01L 23/5386 |
| 2018/0108577 A1 | 4/2018 | Zhu et al. |

OTHER PUBLICATIONS

Guillaume Bouche, "F800 CFET Integration," IMEC Partner Technical Week Presentation, Apr. 25, 2017, Slide 14.

Diederik Verkest, "Y107," IMEC Partner Technical Week Presentation, Apr. 24, 2017, Slides 40-41.

* cited by examiner

US 10,090,193 B1

INTEGRATED CIRCUIT STRUCTURE INCORPORATING A STACKED PAIR OF FIELD EFFECT TRANSISTORS AND A BURIED INTERCONNECT AND METHOD

BACKGROUND

Field of the Invention

The present invention relates to integrated circuit (IC) structures and, more particularly, to an IC structure that incorporates at least one stacked pair of field effect transistors (FETs) (e.g., at least one stacked pair of gate-all-around field effect transistors (GAAFETs)) and a buried interconnect between source/drain regions, which are on opposite sides of a shared gate and at different levels (i.e., in different FETs), and to a method of forming the IC structure.

Description of Related Art

Integrated circuit (IC) design decisions are often driven by device scalability, device density, manufacturing efficiency and costs. For example, size scaling of planar field effect transistors (FETs) resulted in the development of planar FETs with relatively short channel lengths but, unfortunately, the smaller channel lengths resulted in a corresponding increase in short channel effects.

In response, fin-type FETs (FINFETs) were developed. A FINFET is a non-planar FET that incorporates a semiconductor fin (i.e., an elongated, relatively tall and thin, essentially rectangular-shaped, semiconductor body) and, within the semiconductor fin, a channel region positioned laterally between source/drain regions. A gate structure is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits improved gate control over the channel region. It should be noted that, because the semiconductor fin is so thin, any field effects exhibited at the top surface are insignificant (i.e., negligible).

Recently, to improve drive current and electrostatics and to allow for further device size scaling, gate-all-around field effect transistors (GAAFETs) (e.g., nanowire-type GAAFETs or nanosheet-type GAAFETs) have been developed. A GAAFET includes elongated nanoshape(s) (e.g., nanowires or nanosheets), which extend laterally between source/drain regions, and a wrap-around gate structure, which wraps around the nanoshape(s) such that the nanoshape(s) function as channel region(s).

Also recently, to allow for area scaling, integrated circuits that incorporate stacked FETs, as opposed to side-by-side FETs, have been developed. Specifically, a conventional IC structure layout with multiple FETs will typically have a row of N-type FETs (e.g., a row of N-type GAAFETs) on one-side, a corresponding row of P-type FETs (e.g., a row of P-type GAAFETs) on the opposite side, and shared gates that traverse and are adjacent to the channel regions of the side-by-side pairs of N-type and P-type FETs. For example, in the case of a side-by-side pair of GAAFETs, each shared gate extends laterally across and wraps around the channel regions of the N-type and P-type GAAFETs in the side-by-side pair. Contrarily, a layout with multiple stacked pairs of FETs will have: P-type FETs on one-level; N-type FETs on an adjacent level (i.e., above or below); dielectric layers that electrically isolate the source/drain regions of the lower FETs from those of the upper FETs; and shared gates that traverse and are adjacent to the channel regions of the stacked pairs of N-type and P-type FETs. For example, in the case of a stacked pair of GAAFETs, each shared gate extends vertically across and wraps around the channel regions of the N-type and P-type GAAFETs in the stacked pair.

Unfortunately, while stacked pairs of FETs consume less chip area than side-by-side pairs of FETs, providing the necessary power and/or signal connections to and/or between the source/drain regions of the FETs can be complex and may limit the area savings. For example, an IC design may require a source/drain region of a lower FET in a stacked pair of FETs to be electrically connected to a source/drain region of an upper FET in the same stacked pair. Such a connection becomes complex when the two source/drain regions are on opposite sides of a shared gate.

SUMMARY

In view of the foregoing, disclosed herein are embodiments of an integrated circuit (IC) structure that incorporates one or more stacked pairs of field effect transistors (FETs) (e.g., one or more stacked pairs of gate-all-around FETs (GAAFETs), where each stacked pair has a shared gate. Additionally, within a stacked pair of FETs, an irregular-shaped buried interconnect electrically connects source/drain regions that are on opposite sides of the shared gate and at different levels. That is, the irregular-shaped buried interconnect electrically connects a lower FET's source/drain region on one side of a shared gate to an upper FET's source/drain region on the opposite side. Also disclosed herein are embodiments of a method of forming such an IC structure by forming, during different process stages, different sections of an irregular-shaped cavity (including sections that expose surfaces of the source/drain regions at issue and a section with sidewalls lined by a dielectric spacer) and filling at least some of the different sections with sacrificial material. When all of the sections are completed, the sacrificial material is selectively removed, thereby creating the irregular-shaped cavity. The buried interconnect is then formed within the cavity.

More particularly, disclosed herein are embodiments of an integrated circuit (IC) structure. The IC structure includes a stacked pair of field effect transistors (FETs) (e.g., a stacked pair of gate-all-around FETs (GAAFETs)). Each stacked pair of FETs includes a first FET and a second FET stacked above the first FET. Specifically, the first FET includes two first source/drain regions and one or more first channel regions positioned laterally between the two first source/drain regions. A conformal dielectric layer covers the two first source/drain regions. The second FET includes two second source/drain regions on the dielectric layer above the two first source/drain regions, respectively, and one or more second channel regions positioned laterally between the two second source/drain regions. The first FET and the second FET have a shared gate that is adjacent to both the first channel region(s) and the second channel region(s) and the shared gate can have a gate sidewall spacer. The IC structure further includes a buried interconnect, which electrically connects one first source/drain region of the two first source/drain regions to one second source/drain region of the two second source/drain regions and, more specifically, a first FET's first source/drain that is on a first side of the shared gate to a second FET's second source/drain region that is on a second side of the shared gate opposite the first side. Thus, the buried interconnect has an irregular shape that extends upward from the first FET's first source/drain region on the first side of the shared gate and that further wraps around an upper portion of the shared gate to the second FET's second source/drain region on the second side. Spacers and other dielectric elements ensure that the buried interconnect is electrically isolated from other components of the stacked pair of FETs. For example, a dielectric spacer electrically isolates the buried interconnect from a second source/drain region that is on the same side of the shared gate as the first source/drain region. Additionally, the gate sidewall spacer electrically isolates the buried interconnect from the shared gate.

Also disclosed herein are embodiments of a method of forming an integrated circuit (IC) structure. Generally, the method embodiments include forming a stacked pair of field effect transistors (FETs) that includes the following: a first FET with two first source/drain regions and one or more first channel regions positioned laterally between the two first source/drain regions; a conformal dielectric layer above the two first source/drain regions; a second FET with two second source/drain regions on the conformal dielectric layer above the two first source/drain regions, respectively, and one or more second channel regions positioned laterally between the two second source/drain regions; and a shared gate with a gate sidewall spacer, wherein the shared gate is adjacent to the first channel region(s) and the second channel region(s). The method embodiments can further include, during the forming of the stacked pair of FETs, forming a buried interconnect that electrically connects a first source/drain region of the two first source/drain regions to a second source/drain region of the two second source/drain regions, wherein the connected source/drain regions are on opposite sides of the shared gate. That is, the buried interconnect is formed so as to electrically connect a first FET's first source/drain region on a first side of the shared gate to a second FET's second source/drain region on a second side of the shared gate opposite the first side. Thus, the buried interconnect is formed so as to have an irregular shape that extends upward from the first FET's first source/drain region on the first side of the shared gate and that further wraps around an upper portion of the shared gate to the second FET's second source/drain region on the second side.

For example, in one specific method embodiment, the buried interconnect can be formed by forming an irregular-shaped cavity where surfaces of the irregular-shaped cavity include dielectric material surfaces, a surface of one of the first source/drain regions of the first transistor on a first side of the shared gate and a surface of one of the second source/drain regions of the second transistor on a second side of the shared gate. Different sections of this irregular-shaped cavity can be formed at different stages during the forming of the stacked pair of FETs and at least some of the cavity sections can be filled with a sacrificial material. Then, when all sections of the irregular-shaped cavity are completed, the sacrificial material can be selectively removed to expose the various surfaces of the entire cavity including the dielectric material surfaces, the surface of the first source/drain region and the surface of the second source/drain region. The buried interconnect can then be formed within this irregular-shaped cavity such that it electrically connects the first source/drain region of the first transistor and the second source/drain region of the second transistor.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, recently integrated circuit (IC) designs that incorporate one or more stacked pairs of field effect transistors (FETs), such as gate-all-around field effect transistors (GAAFETs), have been developed to allow for area scaling.

Figure 1A:
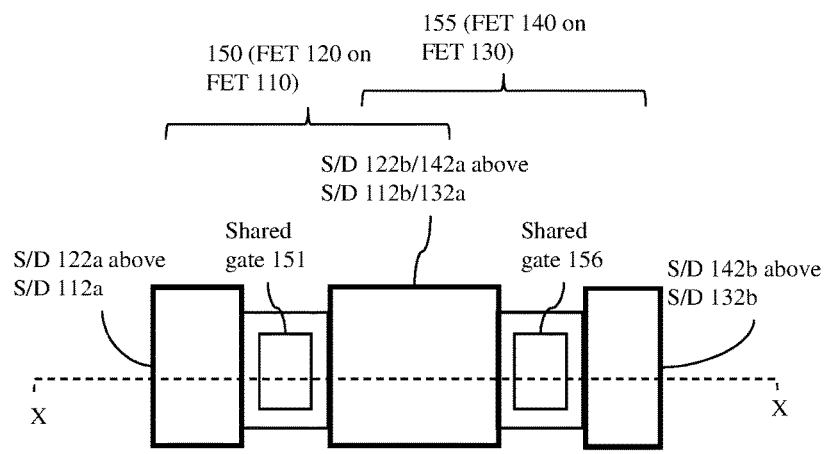
FIGS. 1A and 1B are layout and cross-section diagrams, respectively, of an integrated circuit (IC) structure with stacked pairs of field effect transistors.
Figure 1B:
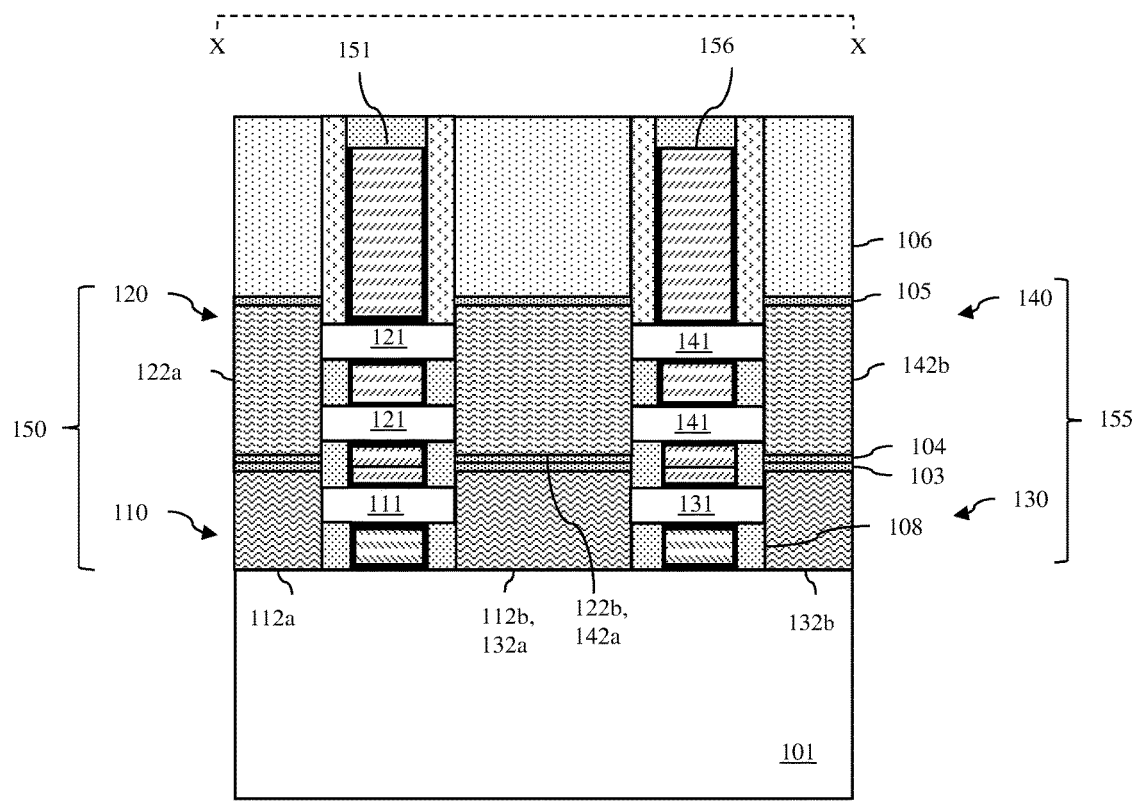

For example, FIGS. 1A and 1B are general layout and cross-section diagrams, respectively, of an exemplary integrated circuit (IC) structure that incorporates multiple immediately adjacent stacked pairs 150, 155 of FETs (e.g., GAAFETs). Each stacked pair 150, 155 of FETs includes a first FET 110, 130 (also referred to herein as a lower FET), a second FET 120, 140 (also referred to herein as an upper FET) stacked above the first FET 110, 130, and a shared gate 151, 156 for the two FETs. The first FET 110, 130 includes first source/drain regions 112a-112b, 132a-132b and at least one first channel region 111, 131 positioned laterally between the first source/drain regions 112a-112b, 132a-132b. Similarly, the second FET 120, 140 includes second source/drain regions 122a-122b, 142a-142b and at least one second channel region 121, 141 positioned laterally between the second source/drain regions 122a-122b, 142a-142b. The second source/drain regions 122a-122b, 142a-142b are aligned above the first source/drain regions 112a-112b, 132a-132b and the second channel region(s) 121, 141 are aligned above the first channel region(s) 111, 131. The second source/drain regions 122a-122b, 142a-142b are electrically isolated from the first source/drain regions 112a-112b, 132a-132b by one or more conformal dielectric layers 103, 104. The shared gate 151, 156 (e.g., a shared replacement metal gate (RMG)) has a lower section adjacent to the first channel region(s) 111, 131 of the first FET 110, 130 and an upper section adjacent to the second channel region(s) 121, 141 of the second FET 120, 140. One or more additional dielectric layers (e.g., see additional conformal dielectric layer 105 of the first dielectric material and the blanket dielectric layer of the second dielectric material 106) can cover the stacked pairs 150, 155 of FETs. By stacking the FETs, the amount of chip area consumed by the IC structure is reduced.

However, to be functional, the IC structure also requires various metal components (not shown in FIGS. 1A-1B) to enable power and/or signal connections to the first source/drain regions of the first FET 110, 130 (i.e., a lower FET) and to the second source/drain regions of the second FET 120, 140 (i.e., the upper FET) in each stacked pair 150, 155 of FETs. Unfortunately, prior art techniques for making these connections are often complex and can limit any area savings that would otherwise be achieved by the stacking the FETs. One particularly problematic connection is the connection between a first source/drain region of a lower FET in a stacked pair of FETs and a second source/drain region of an upper FET in the same stacked pair, when the first source/drain region and the second source/drain region are on opposite sides of a shared gate. For example, electrically connecting the first source/drain region 112b of the first FET 110 in the stacked pair 150 of FETs and the second source/drain region 122a of the second FET 120 in that same stacked pair 150 is problematic because the first source/drain region 112b of the first FET 110 is on one side of the shared gate 151 and the second source/drain region 122a of the second FET 120 is on the opposite side of the shared gate 151.

In view of the foregoing, disclosed herein are embodiments of an integrated circuit (IC) structure that incorporates one or more stacked pairs of field effect transistors (FETs) (e.g., one or more stacked pairs of gate-all-around FETs (GAAFETs)), where each stacked pair has a shared gate. Additionally, within a stacked pair of FETs, an irregular-shaped buried interconnect electrically connects source/drain regions that are on opposite sides of the shared gate and at different levels. That is, the irregular-shaped buried interconnect electrically connects a lower FET's source/drain region on one side of a shared gate to an upper FET's source/drain region on the opposite side. Also disclosed herein are embodiments of a method of forming such an IC structure by forming, during different process stages, different sections of an irregular-shaped cavity (including sections that expose surfaces of the source/drain regions at issue and a section with sidewalls lined by a dielectric spacer) and filling at least some of the different sections with sacrificial material. When all of the sections are completed, the sacrificial material is selectively removed, thereby creating the irregular-shaped cavity. The buried interconnect is then formed within the cavity.

Figure 2A:
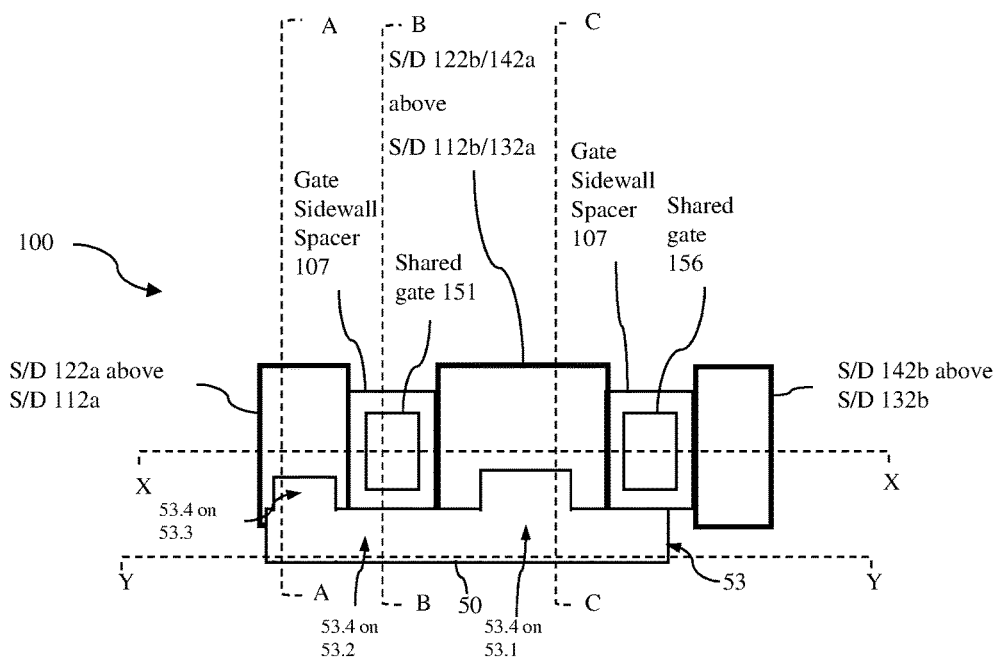
FIG. 2A is a layout diagram and FIGS. 2B-2F are different cross-section diagrams of the IC structure of FIGS. 1A-1B further including a buried interconnect between source/drain regions at different levels and on different sides of a shared gate.

More particularly, FIG. 2A is a layout diagram and FIGS. 2B-2F are different cross-section diagram illustrating an embodiment of an integrated circuit (IC) structure 100, as disclosed herein. Referring to FIGS. 2A-2F in combination, the IC structure 100 can include a semiconductor substrate 101. The substrate 101 can be a bulk semiconductor substrate, such as a bulk silicon substrate. Alternatively, the substrate 101 can be the semiconductor layer of a semiconductor-on-insulator (SOI) structure. In any case, a semiconductor fin 10 can be patterned in an upper portion of the semiconductor substrate 101 such that the semiconductor fin 10 extends vertically upward from a lower portion of the semiconductor substrate 101. The semiconductor substrate 101 can be made, for example, of a first semiconductor material (e.g., monocrystalline silicon).

The IC structure 100 can further include an isolation region 102 (e.g., a trench isolation region), which is on the lower portion of the semiconductor substrate 101 and which laterally surrounds the semiconductor fin 10. The isolation region 102 can include, for example, an optional conformal dielectric layer (not shown) made of a first dielectric material (e.g., silicon nitride). The isolation region 102 can further include an additional dielectric layer made of a second dielectric material that is different from the first dielectric material. For example, the second dielectric material can be an interlayer dielectric (ILD) material, such as silicon dioxide, or any other suitable ILD material.

The IC structure 100 can further include at least one stacked pair of field effect transistors (FETs) above the semiconductor fin 10 and the isolation region 102. For purposes of illustration, FIGS. 2A-2F show a portion of an exemplary cell that includes two adjacent stacked pairs 150, 155 of of FETs and, particularly, gate-all-around field effect transistors (GAAFETs). However, FIGS. 2A-2F are not intended to be limiting. It should be understood that, alternatively, the IC structure 100 could include one or more stacked pairs of different types of FETs (e.g., any other type of FETs suitable for stacking) and can further include different combinations of the metal components to enable power and/or signal connections to the FET source/drain regions.

In any case, each stacked pair 150, 155 of FETs can include a first FET 110, 130 (also referred to herein as a lower FET) on the semiconductor substrate 101 above the level of the isolation region 102, a second FET 120, 140 (also referred to herein as an upper FET) stacked above the first FET 110, 130, and a shared gate 151, 156 (e.g., a shared single or dual work function replacement metal gate (RMG)).

The first FET 110, 130 can be a first-type FET (e.g., a P-type FET) and can include two first source/drain regions 112a-112b, 132a-132b and at least one first channel region 111, 131 positioned laterally between the two first source/drain regions 112a-112b, 132a-132b. That is, the first channel region(s) 111, 131 can have opposing ends that are immediately adjacent to the first source/drain regions 112a-112b, 132a-132b. For purposes of illustration, the first FET 110, 130 in each stacked pair is shown as having one first channel region 111, 131. However, it should be understood that, alternatively, the first FET 110, 130 could have any number of one or more first channel regions.

The first source/drain regions 112a-112b, 132a-132b can be made of an epitaxial semiconductor material, which is doped so as to have a first-type conductivity (e.g., P-type conductivity) at a relatively high conductivity level. The first channel region(s) 111, 131 can be made of a semiconductor material, which is either undoped or, optionally, doped so as to have a second-type conductivity (e.g., N-type conductivity) at a relatively low conductivity level. The epitaxial semiconductor material of the first source/drain regions 112a-112b, 132a-132b and the semiconductor material of the first channel region(s) 111, 131 can be the same semiconductor material (e.g., silicon or any other suitable semiconductor material). Alternatively, the epitaxial semiconductor material of the first source/drain regions 112a-112b, 132a-132b and the semiconductor material of the first channel region(s) 111, 131 can be different and pre-selected for optimal charge carrier mobility within the first channel region(s).

The second FET 120, 140 can be a second-type FET that is different from the first-type conductivity (e.g., an N-type FET). The second FET 120, 140 can include two second source/drain regions 122a-122b, 142a-142b and at least one second channel region 121, 141 positioned laterally between the two second source/drain regions 122a-122b, 142a-142b. That is, the second channel region(s) 121, 141 can have opposing ends that are immediately adjacent to the second source/drain regions 122a-122b, 142a-142b. The second source/drain regions 122a-122b, 142a-142b and the second channel region(s) 121, 141 can be aligned above the first source/drain regions 112a-112b, 132a-132b and the first channel region(s) 111, 131, respectively, and the second source/drain regions 122a-122b, 142a-142b can be electrically isolated from the first source/drain regions 112a-112b, 132a-132b by at least one relatively thin conformal dielectric layer 103, 104, which is made of the first dielectric material (e.g., silicon nitride) and which covers the first source/drain regions 112a-112b, 132a-132b. For purposes of illustration, the second FET 120, 140 in each stacked pair of FETs is shown as having two second channel regions 121, 141. However, it should be understood that, alternatively, the second FET 120, 140 could have any number of one or more second channel regions 121, 141.

The second source/drain regions 122a-122b, 142a-142b can be made of an epitaxial semiconductor material, which is doped so as to have the second-type conductivity (e.g., N-type conductivity) at a relatively high conductivity level. The second channel region(s) 121, 141 can be made of a semiconductor material, which is either undoped or, optionally, doped so as to have the first-type conductivity (e.g., P-type conductivity) at a relatively low conductivity level. The epitaxial semiconductor material of the second source/drain regions 122a-122b, 142a-142b and the semiconductor material of the second channel region(s) 121, 141 can be the same semiconductor material (e.g., silicon or any other suitable semiconductor material). Alternatively, the epitaxial semiconductor material of the second source/drain regions 122a-122b, 142a-142b and the semiconductor material of the second channel region(s) 121, 141 can be different and pre-selected for optimal charge carrier mobility within the second channel region(s).

It should be noted that, for purposes of illustration, the FETs in a given stacked pair of FETs are described above as having different type conductivities. For example, as described, a given stacked pair of FETs could include an N-type FET on a P-type FET or vice versa. However, it should be understood that, alternatively, a given stacked pair of FETs could include FETs having the same type conductivity (e.g., an N-type FET on another N-type FET or a P-type FET on another P-type FET).

It should further be understood that, when the IC structure includes multiple stacked pairs of FETs, adjacent first FETs (e.g., adjacent lower FETs) can have a shared first source/drain region and adjacent second FETs (e.g., adjacent upper FETs) can have a shared second source/drain region. That is, instead of having discrete, source/drain regions that are electrically isolated from each other (e.g., by an isolation region) adjacent FETs can have a shared source/drain region that extends between their respective channel regions. For example, as shown in FIG. 1A, the first FET 110 is adjacent to the first FET 130 and a shared first source/drain region 112b/132a extends between the first channel region(s) 111 of the first FET 110 and the first channel region(s) 131 of the first FET 130. Similarly, the second FET 120 is adjacent to the second FET 140 and a shared second source/drain region 122b/142a extends between the second channel region(s) 121 of the second FET 120 and the second channel region(s) 141 of the second FET 140.

It should further be understood that in one specific embodiment wherein the IC structure includes one or more stacked pairs of GAAFETs (as illustrated), the first channel region(s) 111, 131 of the first GAAFET 110, 130 and the second channel region(s) 121, 141 of the second GAAFET 120, 140 can be in the form of elongated semiconductor nanoshapes (NSs). For purposes of this disclosure, an elongated semiconductor nanoshape (NS) refers to a feature having a length that is relatively long as compared to its thickness (also referred to herein as its height) and/or its width (also referred to herein as its depth) and further having its thickness and/or its width dimensions constrained to tens of nanometers or less (i.e., constrained to 100 nm or less). Nanoshapes include nanowires, nanosheets and nanofins. Specifically, a nanowire (NW) refers to a nanoshape having both its thickness (or height) and its width dimensions constrained to tens of nanometers or less (i.e., constrained to 100 nm or less) and preferably having the ratio of the thickness dimension to the width dimension being, for example, approximately 1 to 1. A nanosheet refers to a nanoshape having its thickness dimension (or height) constrained to tens of nanometers or less (i.e., constrained to 100 nm or less), having its width dimension above 100 nm, and having the ratio of the thickness dimension to the width dimension being, for example, significantly over 1 to 1 (e.g., 2 to 1, 5 to 1, 10 to 1, 100 to 1, etc.). That is, a nanosheet is relatively short and wide. A nanofin refers to a nanoshape having its width dimension constrained to tens of nanometers or less (i.e., constrained to 100 nm or less), having its thickness (or height) dimension being greater than 100 nm and having the ratio of the thickness dimension to the width dimension being, for example, significantly less than 1 to 1 (e.g., 1 to 2, 1 to 5, 1 to 10, 1 to 100, etc.). That is, a nanofin is relatively tall and thin. In any case, these elongated semiconductor nanoshapes are horizontally oriented relative to the top surface the substrate. The lowest first channel region can be physically separated from the top surface of the substrate. Each additional first channel region (if any) can be aligned above, parallel to, and physically separated from the one below. The lowest second channel region can be aligned above, parallel to, and physically separated from the highest first channel region. Each additional second channel region (if any) can be aligned above, parallel to, and physically separated from the one below.

In any case, another conformal dielectric layer 105 of the first dielectric material (e.g., silicon nitride) covers the second source/drain regions 122a-122b, 142a-142b. A blanket dielectric layer of the second dielectric material 106 (e.g., an interlayer dielectric (ILD) material, such as silicon dioxide, or any other suitable ILD material) can be on the conformal dielectric layer 105.

In each stacked pair of FETs, the shared gate 151, 156 can be on the substrate, can have a lower section (l) adjacent to the first channel region(s) 111, 131 and can have an upper section (u) adjacent to the second channel region(s) 121, 141 and further extending vertically upward through the blanket dielectric layer of the second dielectric material 106. In one specific embodiment wherein the IC structure includes one or more stacked pairs of GAAFETs (as illustrated), the lower section (l) can be on the substrate and can wrap around the first channel region(s) 111, 131 (i.e. can be above, below and on the opposing sides of the first channel region(s) 111, 131) of the first GAAFET 110, 130 and the upper section (u) can be above the lower section (l) and can wrap around the second channel region(s) 121, 141 (i.e. can be above, below and on the opposing sides of the second channel region(s) 121, 141) of the second GAAFET 120, 140.

In any case, the shared gate 151, 156 can, for example, be a single work function replacement metal gate (RMG). Alternatively, the shared gate 151, 156 can be a dual work function RMG. That is, in both the lower and upper sections, the shared gate 151, 156 can include a conformal gate dielectric layer (e.g., a conformal high-K gate dielectric layer) immediately adjacent to (e.g., wrapping around) the first channel region(s) and the second channel region(s). In the lower section (l), the shared gate 151, 156 can further include a conformal first work function metal layer immediately adjacent to that portion of the gate dielectric layer on the first channel region(s). The first work function metal layer can be preselected for optimal performance of a first-type FET (e.g., a P-type FET). In the upper section (u), the shared gate 151, 156 can further include a conformal second work function metal layer, which is different from the first work function metal layer, which is immediately adjacent to the portion of the gate dielectric layer on the second channel region(s), and which is preselected for optimal performance of a second-type FET (e.g., an N-type FET). Optionally, the shared gate 151, 156 can further include a conductive fill material adjacent to the first work function metal layer in the lower section and further adjacent to the second work function metal layer in the upper section. Shared dual work function RMGs for stacked pairs of FETs are well known in the art. Thus, in order to avoid clutter in the drawings and allow the reader to focus on the salient aspects of the disclosed embodiments, only the shared RMGs 151, 156, as a whole, are identified in the figures and the individual components of these shared RMGs (e.g., the gate dielectric layer, the different work function metal layers, the conductive fill material, etc.) are not specifically identified.

Figure 2B:
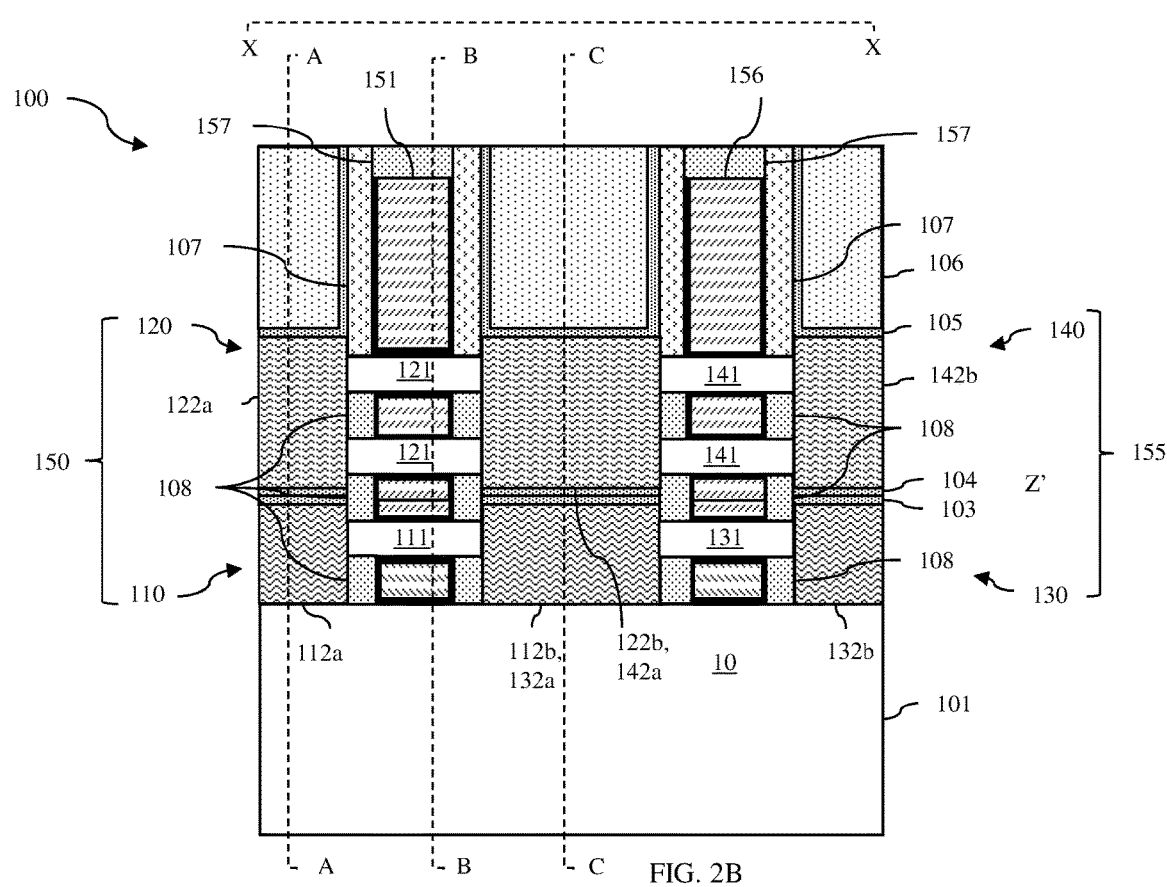
Figure 2C:
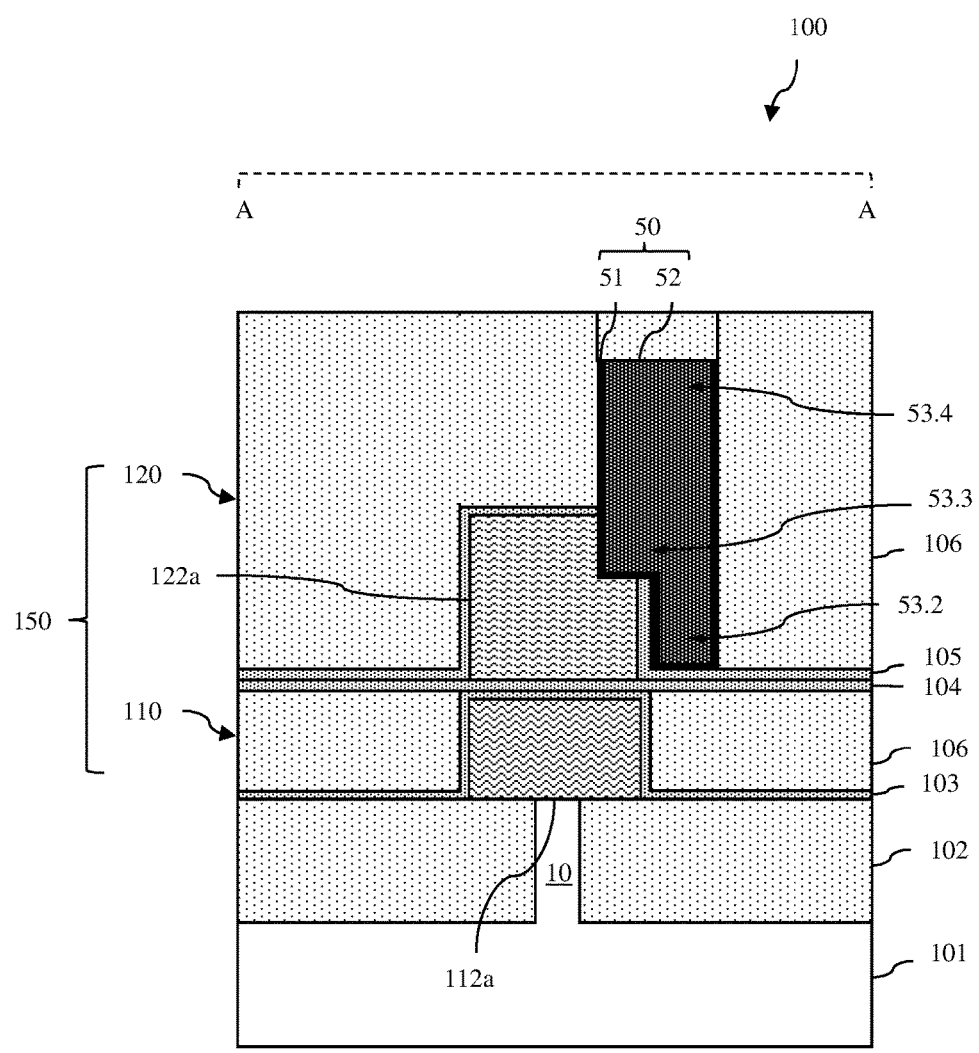
Figure 2D:
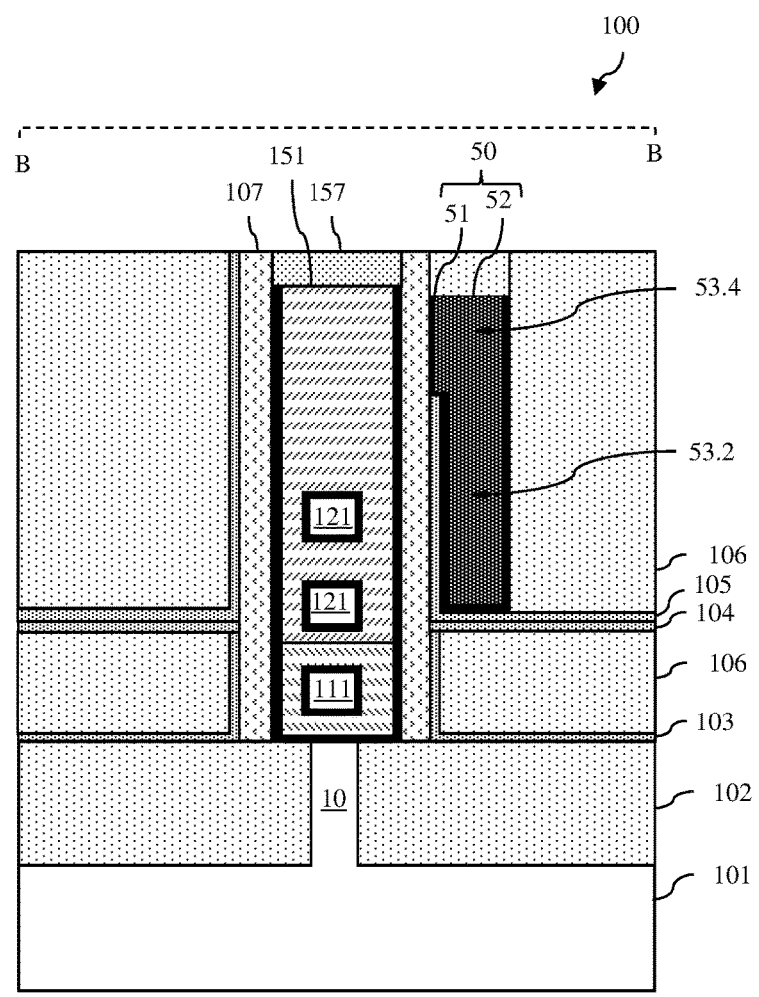

Additionally, as illustrated in FIGS. 2B and 2D, each shared gate 151, 156 can have a dielectric gate cap 157 and dielectric gate sidewalls spacers 107. The gate cap 157 and gate sidewall spacers 107 can be made of the same dielectric material (e.g., silicon nitride or any other suitable dielectric material). Alternatively, the gate cap 157 and gate sidewall spacers 107 can be made of different dielectric materials. For example, the gate cap 157 can be made of silicon nitride and the gate sidewall spacers 107 can be made of silicon carbon nitride, silicon boron carbon nitride or any other suitable dielectric material.

Furthermore, in one specific embodiment wherein the IC structure 100 includes one or more stacked pairs of GAAFETS (as illustrated), a combination of the gate sidewall spacers 107 and vertically-oriented isolation elements 108 can electrically isolate the shared gate 151, 156 from the adjacent source/drain regions. The vertically-oriented isolation elements 108 can be on opposing sides of each shared gate 151, 156 positioned laterally adjacent to sections of vertical surfaces of the shared gate that extend from the top of the substrate to the bottom of the lowest first channel region and that further extend between adjacent channel regions. The isolation elements can be, for example, nitride layers (e.g., silicon nitride layers) or layers of any other suitable isolation material.

The IC structure 100 can further include various metal components that enable power and/or signal connections to and/or between the source/drain regions of the FETs and that facilitate size scaling of cells that incorporate the stacked pairs by reducing the number of metal tracks required. For example, in each of the IC structure 100 embodiments disclosed herein, the metal components can specifically include a buried interconnect 50, which is an irregular-shaped contiguous conductive element and which electrically connects source/drain regions that are on opposite sides of a shared gate and at different levels. For example, as illustrated in FIGS. 2A-2F, the irregular-shaped buried interconnect 50 can electrically connect a first FET's source/drain region at one level and on one side of the shared gate 151 in the stacked pair 150 (e.g., see the first source/drain region 112b, which as discussed above is shared with the first source/drain region 132a of the first FET 130) to a second FET's source/drain region at a different level and on an opposite side of that same shared gate 151 (e.g., see the second source/drain region 122a). Additional metal components can include, for example, combinations of any one or more of the following metal components: embedded contact(s) in the source/drain regions, buried wire(s) (also referred to as front end of the line (FEOL) wire(s)) positioned laterally adjacent to or below the source/drain regions, insulated contact(s) that extend through the source/drain regions, middle of the line (MOL) contacts, back end of the line (BEOL) metal level wire(s), etc. In order to allow the reader to focus on the salient aspects of the disclosed structure and to avoid clutter in the figures, these additional metal components are not shown in the drawings or discussed below.

More specifically, as illustrated in FIGS. 2A-2F, the IC structure 100 can include an irregular-shaped cavity 53 with multiple sections 53.1-53.4, which in combination expose dielectric surfaces and also semiconductor surfaces of both the first source/drain region 112b of the first FET 110 (i.e., the lower FET 110) on the first side of the shared gate 151 and the second source/drain region 122a of the second FET 120 (i.e., the upper FET) on the second side of the same shared gate 151 opposite the first side. The irregular-shaped cavity 53 can be filled with and can define the shape of the buried interconnect 50. That is, the buried interconnect 50 can include an optional liner 51, which lines the irregular-shaped cavity 53 so as to be immediately adjacent to the exposed semiconductor surfaces of the first source/drain region 112b and the second source/drain region 122a within the cavity 53, and a conductor 52, which is on the optional liner 51 and which fills the irregular-shaped cavity 53 such that the first source/drain region 112b is electrically connected to the second source/drain region 122a. The liner 51 can be, for example, conformal adhesion and/or diffusion barrier layers and the conductor 52 can be one or more layers of metal and/or metal alloy materials (e.g., ruthenium, tungsten, cobalt, nickel, aluminum, copper, or any other suitable conductor material).

Figure 2E:
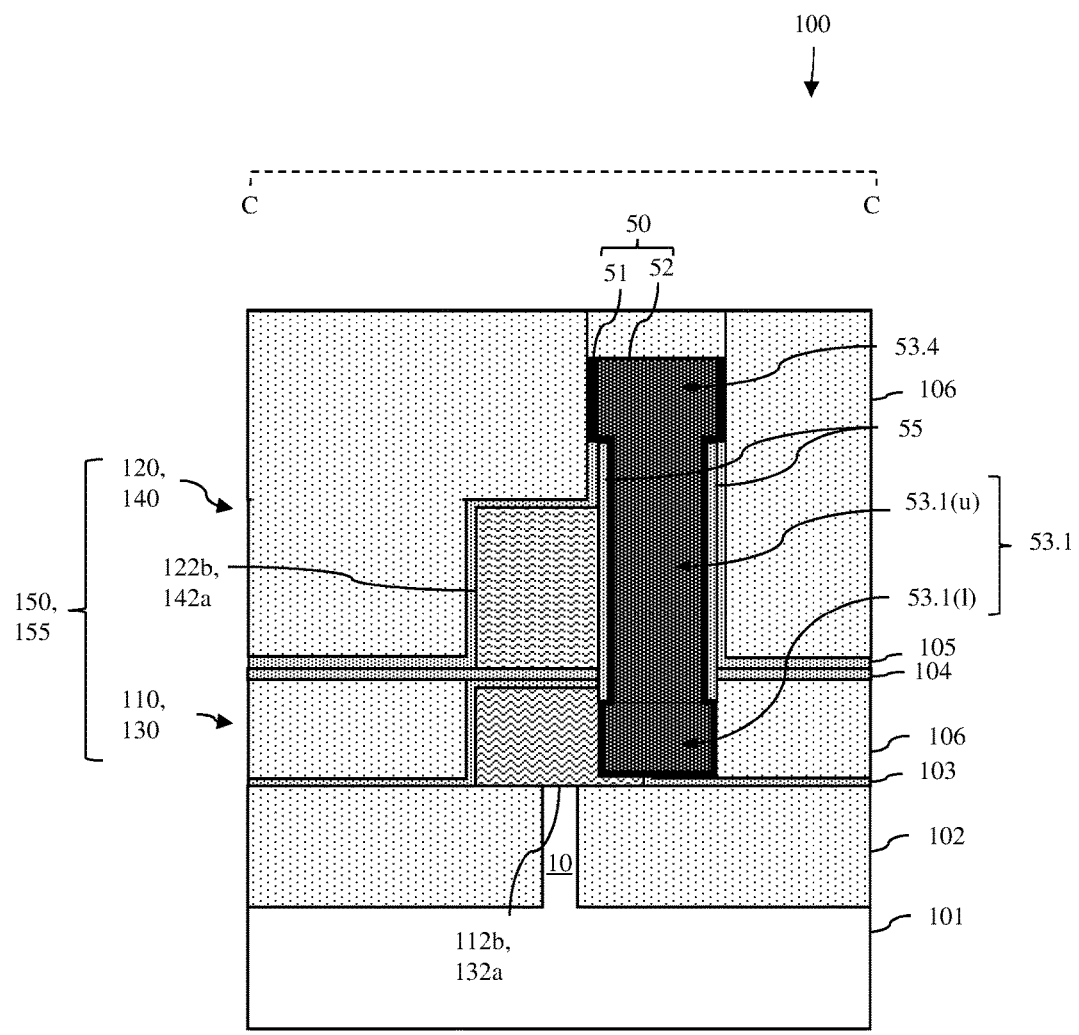
Figure 2F:
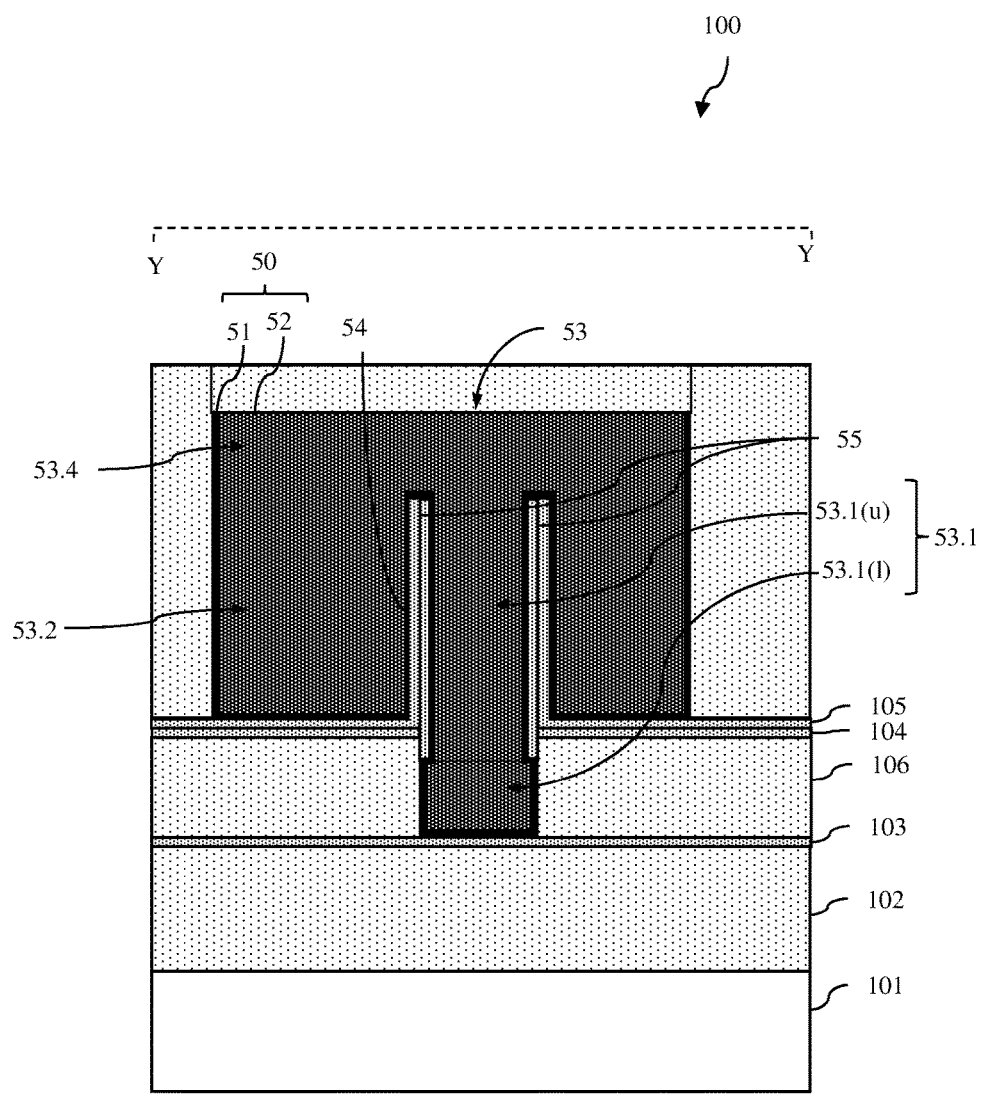

The multiple sections of the irregular-shaped cavity 53 can include a first section 53.1 on the first side of the shared gate 151 (see FIGS. 2A, 2E and 2F). The first section 53.1 can be essentially vertically oriented, can have a lower portion 53.1(1), and can have an upper portion 53.1(u) above the lower portion 53.1(1). The lower portion 53.1(1) can expose a semiconductor surface of the first source/drain region 112b of the first FET 110. For example, the lower portion 53.1(1) of the first section 53.1 can land on the first source/drain region 112b so as to expose the top surface of the first source/drain region 112b. Optionally, the lower portion 53.1(1) of the first section 53.1 can extend vertically through all or a portion of the first source/drain region 112b so as to expose a side surface of the first source/drain region 112b. The upper portion 53.1(u) of the first section 53.1 can extend vertically upward from the first source/drain region 112b through the conformal dielectric layers 104, 105 of the first dielectric material, through the second source/drain region 122b above (e.g., at the interface between a side of the second source/drain region 122b and dielectric material positioned laterally adjacent to the second source/drain region) and into the second dielectric material 106 above the second source/drain region 122b. The upper portion 53.1(u) can further have sidewalls lined by a dielectric spacer 55 (e.g., a silicon nitride sidewall spacer) such that no semiconductor surface of the second source/drain region 122b is exposed within the upper portion of the first section 53.1(u).

The multiple sections of the cavity 53 can further include a second section 53.2 (see FIGS. 2A, 2C, 2D and 2F). This second section 53.2 can be essentially horizontally oriented and can abut the first section 53.1. More specifically, this second section 53.2 can be in the second dielectric material 106 above the conformal dielectric layer 105 and can be in the form of a wire trench that has at least one vertical surface positioned laterally adjacent to the dielectric spacer 55, as shown in FIG. 2F. Additionally, as illustrated in the layout diagram of FIG. 2A, the second section 53.2 can further extend in a first direction from the dielectric spacer 55 and passed the shared gate 151 such that the second section 53.2 is also positioned laterally adjacent to the second source/drain region 122a. Optionally, as shown in FIG. 2F, instead of the second section 53.2 of the cavity terminating at the dielectric spacer 55, the upper portion 53.1(u) of the first section 53.1 of the cavity can extend vertically through and essentially bifurcate the second section 53.2 such that discrete portions (e.g., a left-side portion and a right-side portion) of the second section 53.2 are located on opposing sides of the upper portion 53.1(u) of the first section 53.1.

The multiple sections of the cavity 53 can further include a third section 53.3 (see FIGS. 2A and 2C). This third section 53.3 can be essentially horizontally oriented at the same level and essentially perpendicular to the second section 53.2. Specifically, this third section 53.3 can extend in a second direction, which is perpendicular to the first direction, from the second section 53.2 to the second source/drain region 122a such that a side surface of the second source/drain region 122a is exposed within the third section 53.3 of the cavity. Thus, in combination, the second section 53.2 and the third section 53.3 of the cavity wrap around the shared gate 151 (or, more particularly, wrap around the gate sidewall spacer 107 on the shared gate 151) from the dielectric spacer 55 within the first section 53.1 of the cavity to the second source/drain region 122a.

The multiple sections of the cavity 53 further include a fourth section 53.4 (see FIGS. 2A, 2C, 2D, 2E and 2F). This fourth section 53.4 is an open space in the second dielectric material 106 above and immediately adjacent to the first section 53.1, the dielectric spacer 55, the second section 53.2 and the third section 53.3. That is, this fourth section 53.4 connects the first section 53.1, the second section 53.2 and the third section 53.3.

The buried interconnect 50 can include the optional liner 51, which optionally lines the surfaces of the irregular-shaped cavity 53, and the conductor 52, which fills each of the sections 53.1-53.4 of the irregular-shaped cavity 53. Thus, the buried interconnect 50 has portions that correspond to the different sections of the irregular-shaped cavity including: a vertically oriented portion that extends between different levels of the stacked pair 150 of FETs; horizontally oriented portions that wrap around the gate sidewall spacer 107 on the shared gate 151 to the second source/drain region 122a; and a connecting portion above the other portions. Spacers and other dielectric features ensure that the buried interconnect 50 is electrically isolated from other components of the stacked pair 150. For example, the dielectric spacer 55 electrically isolates the buried interconnect 50 from the second source/drain region 122b (which is above and on the same side of the shared gate as the first source/drain region 112b). Additionally, the gate sidewall spacer 107 electrically isolates the buried interconnect 50 from the shared gate 151.

As mentioned above, FIGS. 2A-2F are not intended to be limiting and different embodiments of the disclosed IC structure can include one or more stacked pairs of different types of FETs (e.g., one or more stacked pairs of any other type FET suitable for stacking). Additionally, different embodiments of the disclosed IC structure can include, not only the buried interconnect 50 as described, but also additional metal components that are not shown and that enable power and/or signal connections. As mentioned above, the additional metal components can include, for example, combinations of any one or more of the following metal components: embedded contact(s) in the source/drain regions, buried wire(s) (also referred to as front end of the line (FEOL) wire(s)) positioned laterally adjacent to or below the source/drain regions, insulated contact(s) that extend through the source/drain regions, middle of the line (MOL) contacts, back end of the line (BEOL) metal level wire(s), etc.

Figure 3A:
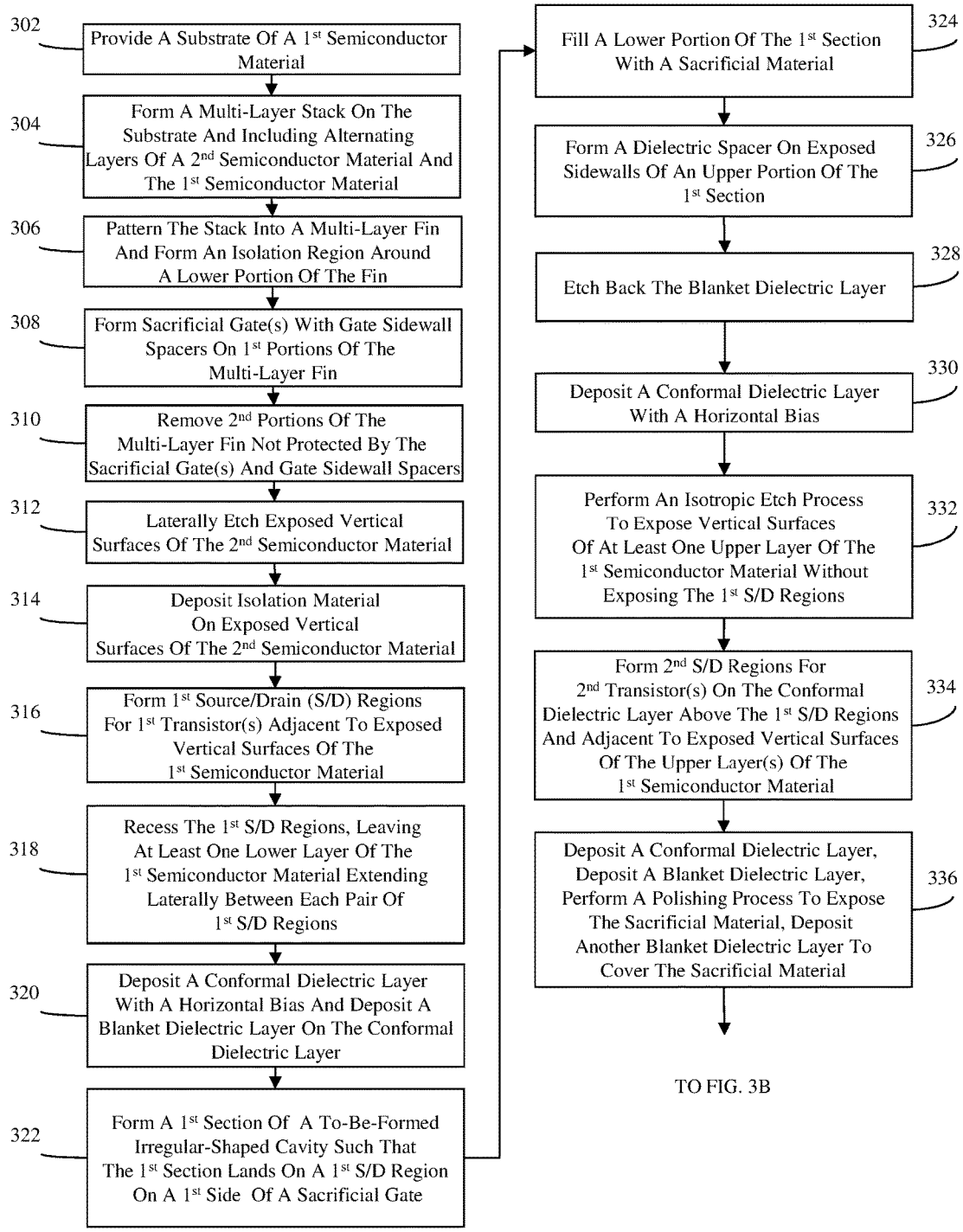
FIGS. 3A-3B are a flow diagram illustrating an embodiment of a method of forming the IC structure of FIGS. 2A-2F.
Figure 3B:
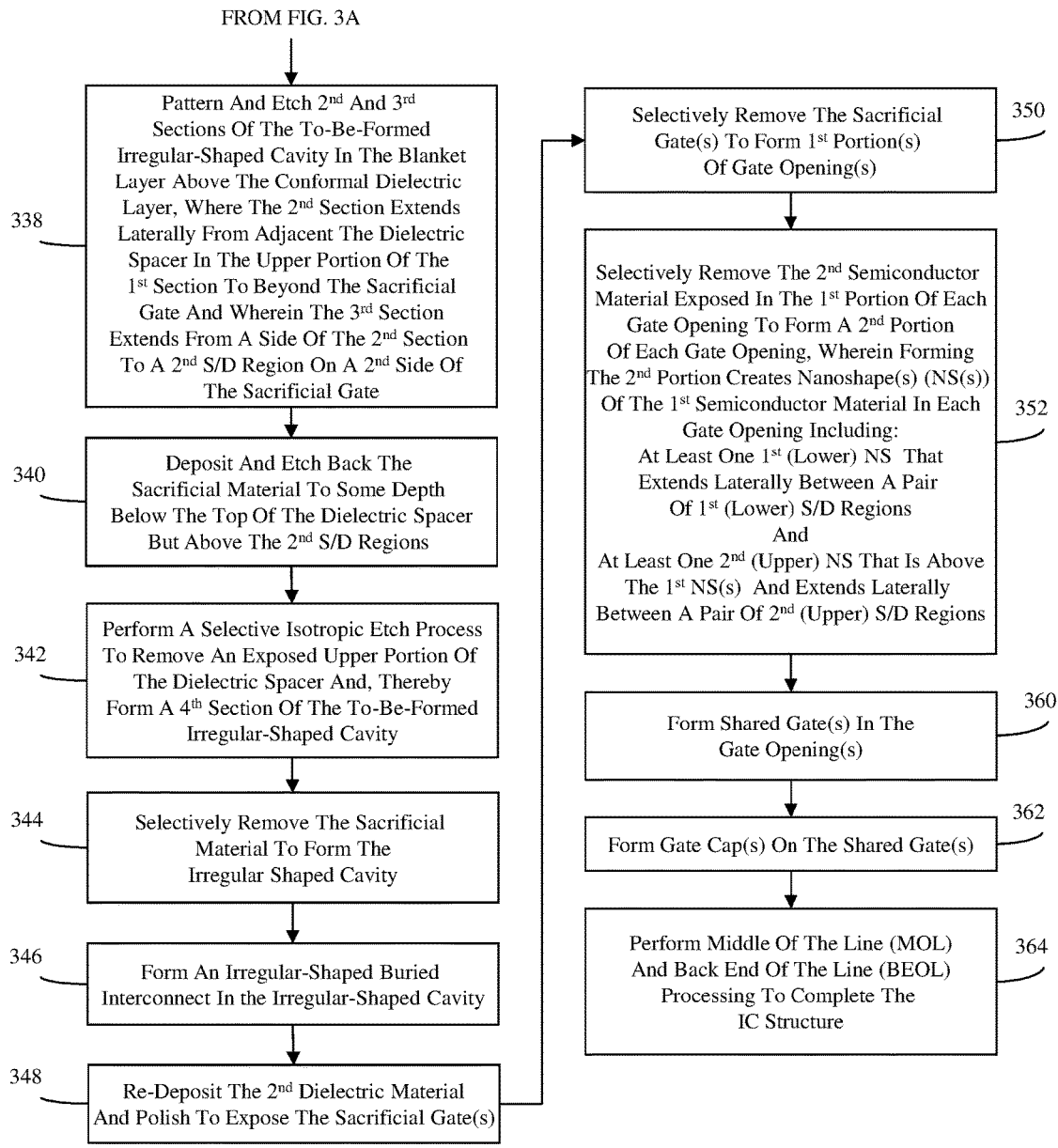

The flow diagram of FIGS. 3A-3B illustrates an exemplary method for forming the IC structure 100, as it is shown in FIGS. 2A-2F, with one or more stacked pairs of GAAF-ETs. It should, however, be understood that the description of the method and the figures are not intended to be limiting.

Figure 4A:
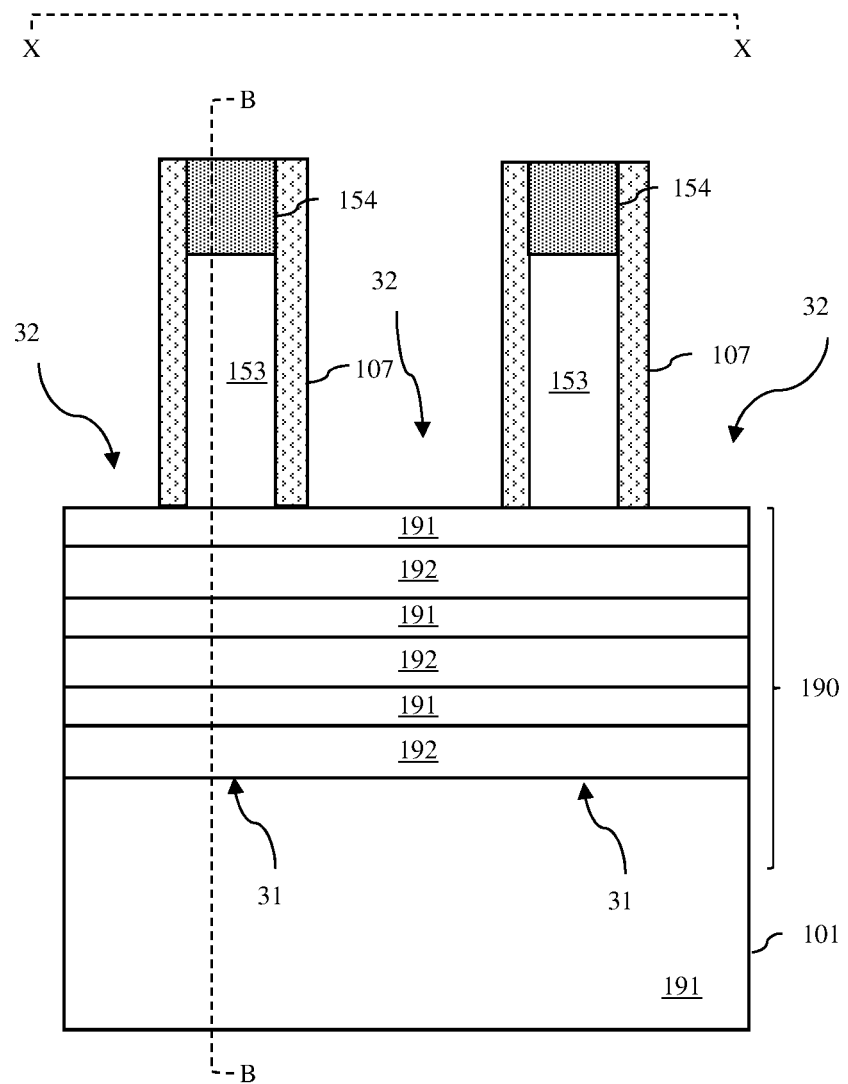
FIGS. 4A-4B are different cross-section diagrams of a partially completed IC structure formed according to the flow diagram of FIGS. 3A-3B.
Figure 4B:
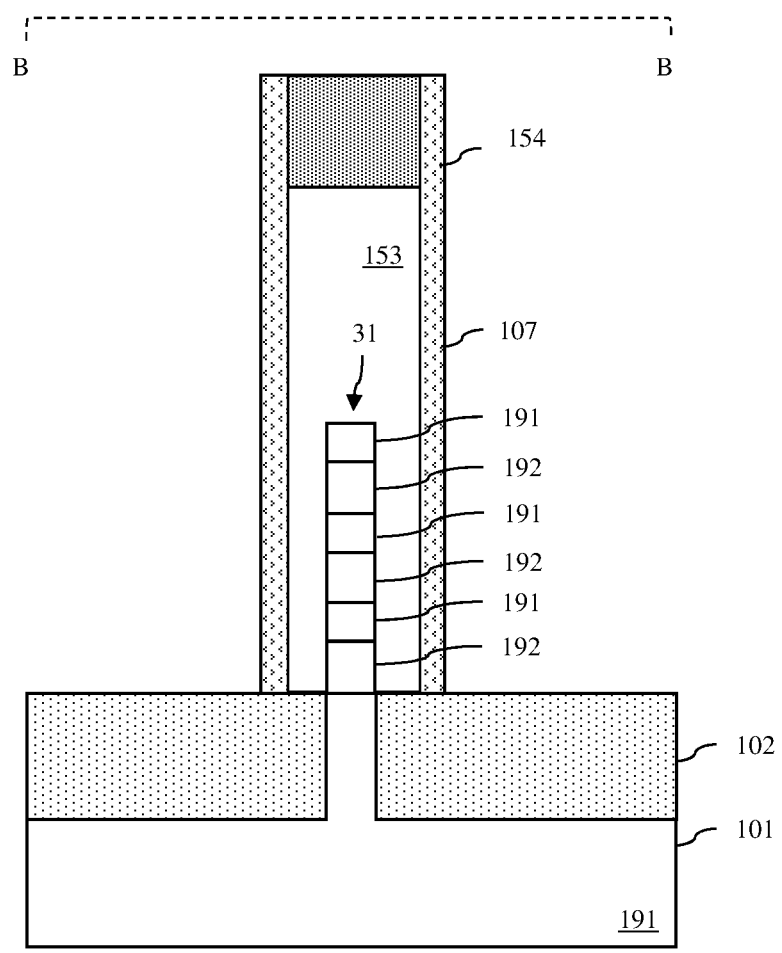

The method can include providing a semiconductor substrate 101 (see process 302 and FIGS. 4A-4B). The semiconductor substrate 101 can be made of a first semiconductor material 191. This first semiconductor material 191 can be, for example, monocrystalline silicon. The semiconductor substrate 101 can be a bulk semiconductor structure (as shown). Alternatively, the semiconductor substrate 101 could be the semiconductor layer of a semiconductor-on-insulator (SOI) structure.

The method can further include forming a multi-layer stack on the substrate 101 (see process 304, see FIGS. 4A-4B). This multi-layer stack can include alternating semiconductors layers of a second semiconductor material 192 and the first semiconductor material 191. That is, an initial layer of the second semiconductor material 192 can be immediately adjacent to the top surface of the semiconductor substrate 101 (e.g., to the top surface of a bulk semiconductor substrate or to the top surface of a semiconductor layer of an SOI structure), an initial layer of the first semiconductor material 191 can be on the initial layer of the second semiconductor material, another layer of the second semiconductor material 192 can be on the initial layer of the first semiconductor material 191, and so on. These alternating semiconductor layers can be formed, for example, by epitaxial deposition such that the second semiconductor material 192 and the first semiconductor material 191 are different monocrystalline semiconductor materials. For example, as mentioned above, the first semiconductor material 191 can be monocrystalline silicon. The second semiconductor material 192 can be monocrystalline silicon germanium or any other suitable semiconductor material, which can be used to grow monocrystalline silicon and which can be selectively etched away from monocrystalline silicon during subsequent processing. Optionally, the lowest portion of the lowest layer of the second semiconductor material 192, which is immediately adjacent to the semiconductor substrate 101, can be in situ doped during epitaxial deposition so that this lowest portion can effectively function as an etch stop layer during subsequent processing. For example, if the second semiconductor material 192 is silicon germanium, the lowest portion of the initial layer can be epitaxially deposited so as to have a relatively high germanium concentration compared to that of any subsequently deposited silicon germanium.

For purposes of illustration, the multi-layer stack is shown in FIG. 4A as having six total layers including three layers of the second semiconductor material 192 and three layers of the first semiconductor material 191. However, it should be understood that the figures are not intended to be limiting and that, alternatively, the multi-layer stack could include a total of at least four alternating layers including at least two layers of the first semiconductor material 191 so that, in the resulting stacked pairs of GAAFETs, the first GAAFET will have at least one first channel region and the second GAAFET will have at least one second channel region. Additionally, it should be noted that the thickness of each of the layers of the first semiconductor material 191 in the multi-layer stack should be equal to the desired height of the elongated nanoshapes, which will form the first and second channel regions. Furthermore, the thickness of each of the layers of the second semiconductor material should be equal to the desired spacing between stacked elongated nanoshapes and, particularly, should be great enough to allow for gate material deposition around stacked elongated nanoshapes.

It should be noted that, if the substrate 101 is an SOI structure as opposed to a bulk semiconductor structure, the multi-layer stack would be formed above and immediately adjacent to the semiconductor layer of the SOI structure with the buried oxide (BOX) layer and the semiconductor substrate below. In this case, the first layer of the multi-layer stack could be a layer of the first semiconductor material 191 and not a layer of the second semiconductor material 192.

A multi-layer fin 190 can be formed from the multi-layer stack on the substrate 101 and an isolation region 102 can be formed around the lower region of the fin 190 and particularly around the region of the fin 190 etched into the upper portion of the substrate 101 (see process 306 and FIGS. 4A-4B). For purposes of this disclosure, a "fin" refers to an elongated, relatively tall, essentially rectangular-shaped body. The multi-layer fin 190 can be formed using conventional processing techniques (e.g., lithographic patterning and etch techniques, sidewall image transfer (SIT) techniques, etc.). The isolation region 102 can be formed, for example, by depositing a conformal dielectric layer made of a first dielectric material (e.g., silicon nitride). Then, a blanket dielectric layer of the second semiconductor material (e.g., silicon dioxide) can be deposited onto the conformal dielectric layer, polished (e.g., using a chemical mechanical polishing (CMP)) and etched back to expose the alternating semiconductor layers of the multi-layer fin.

The method can further include using the multi-layer fin 190 to form at least one stacked pair of field effect transistors (FETs) (e.g., a stacked pair of gate-all-around field effect transistors (GAAFETs)) and, during formation of the stacked pair(s) of FETs, forming a buried interconnect that electrically connects a first source/drain region of a first FET (i.e., a lower FET in a stacked pair) to a second source/drain region of a second FET (i.e., an upper FET), wherein the first source/drain region is on a first side of a shared gate and the second source/drain region is on a second side of the shared gate opposite the first side.

For purposes of illustration, the method is described below and illustrated in the figures with respect to the formation of two immediately adjacent pairs of stacked GAAFETs. However, it should be understood that, alternatively, any number of one or more stacked pairs of FETs or one or more stacked pairs of GAAFETs could be formed using the disclosed method.

In any case, in the method, sacrificial gates 153 with sacrificial gate caps 154 and gate sidewall spacers 107 can be formed on first portions 31 (i.e., designated channel areas) of the multi-layer fin 190 such that second portions 32 (i.e., designated source/drain areas) of the multi-layer fin 190 remain exposed (see process 308 and FIGS. 4A-4B). For example, a thin conformal silicon dioxide layer (not shown) can be deposited over the multi-layer fin 190. A blanket sacrificial gate layer can be deposited onto the conformal silicon dioxide layer. This blanket sacrificial gate layer can be, for example, a polysilicon layer, an amorphous silicon layer or any other suitable sacrificial gate material that is different from the materials of the multi-layer fin (i.e., different from the first semiconductor material 191 and the second semiconductor material 192) and that can be selectively and isotropically etched away from the multi-layer fin during subsequent processing. The sacrificial gate layer can then be polished (e.g., using a chemical mechanical polishing (CMP) process) and a sacrificial cap layer (e.g., a silicon nitride cap layer) can be deposited onto the sacrificial gate layer, thereby forming a sacrificial gate stack. The sacrificial gate stack can then be lithographically patterned and etched to form the sacrificial gates 153 (with sacrificial gate caps 154), wherein the sacrificial gates 153 are positioned adjacent to the top surface and the opposing sides of the first portions 31 of the multi-layer fin 190 and are oriented essentially perpendicular to the fin 190. Gate sidewall spacers 107 can then be formed on the sidewalls of the sacrificial gates 153 using conventional sidewall spacer formation techniques. Such sidewall spacer formation techniques are well known in the art and, thus, the details of those techniques have been omitted from the specification in order to allow the reader to focus on the salient aspects of the disclosed method. In any case, the gate sidewall spacers 107 can be made of silicon nitride, silicon carbon nitride, silicon boron carbon nitride or any other suitable sidewall spacer material that is different from the material used for the sacrificial gate 153.

Figure 5:
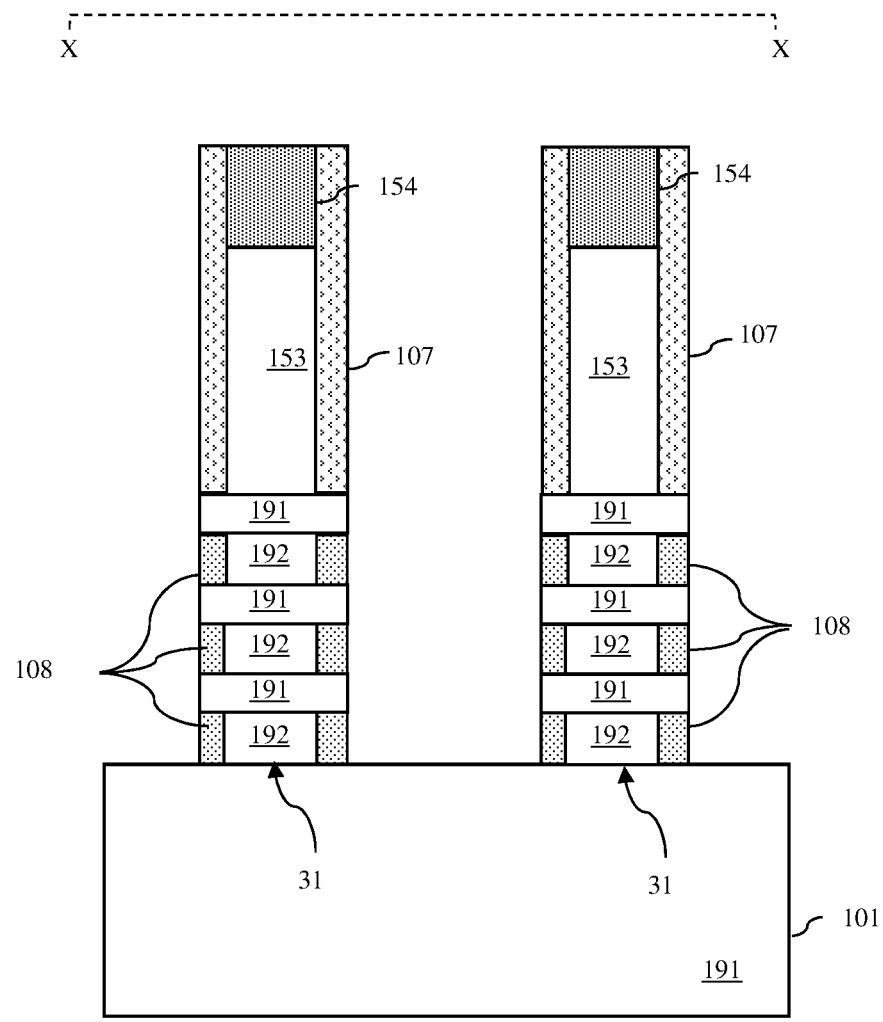
FIG. 5 is a cross-section diagram illustrating a partially completed IC structure formed according to the flow diagram of FIGS. 3A-3B.

The exposed second portions 32 of the multi-layer fin 190 can be selectively removed (see process 310 and FIG. 5). Specifically, an anisotropic etch process can be performed, wherein the etch chemistries used are selective for the materials of the multi-layer fin over the adjacent materials of the isolation region 102, the gate sidewall spacers 107 and the sacrificial gate caps 154. The etch process can be timed so as to stop once the top surface of the isolation region 102 is exposed. Additionally, exposed vertical surfaces of the second semiconductor material 192 in the remaining portions of the multi-layer fin 190 can then be laterally etched to form shallow cavities that undercut the first semiconductor material 191 and these shallow cavities can be filled with an isolation material (e.g., silicon nitride), thereby forming vertically-oriented isolation elements 108 (see processes 312-314 and FIG. 5). Techniques for etching back the vertical surfaces of the second semiconductor material and for forming the isolation elements 108 are well known in the art. Thus, the details of such techniques have been omitted from the specification in order to allow the reader to focus on the salient aspects of the disclosed method.

Figure 6A:
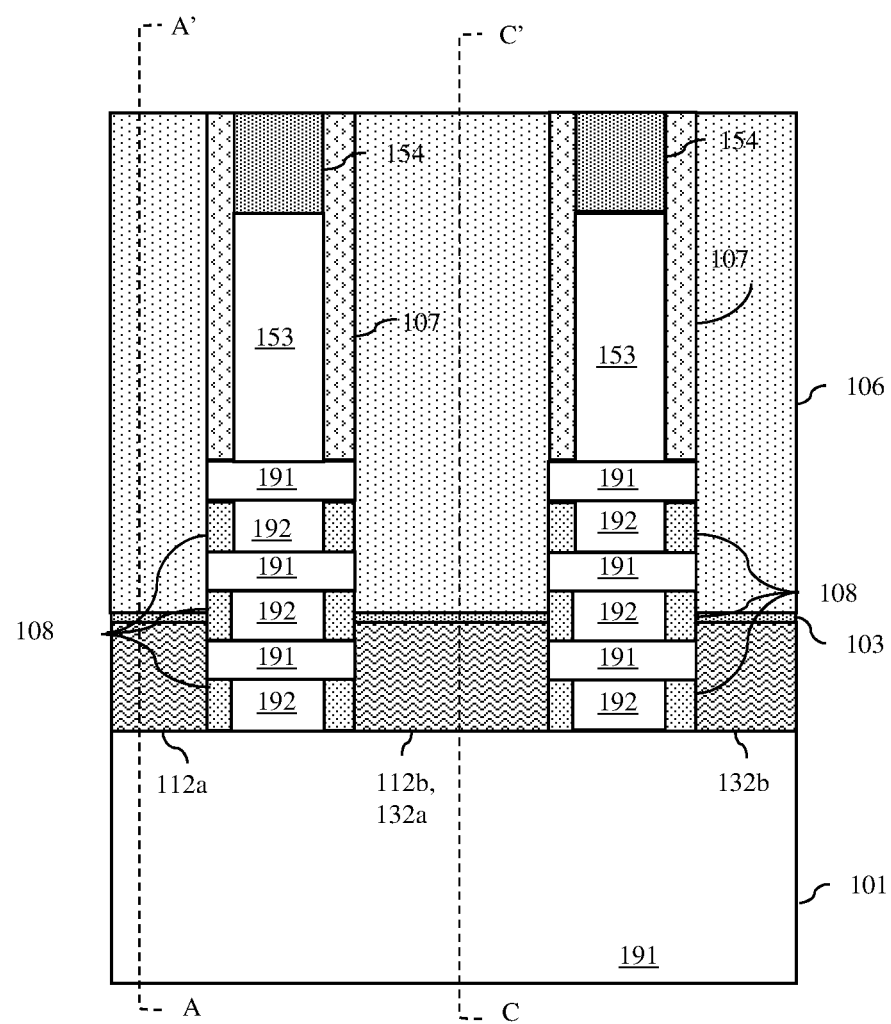
FIGS. 6A-6B are different cross-section diagrams illustrating a partially completed IC structure formed according to the flow diagram of FIGS. 3A-3B.
Figure 6B:
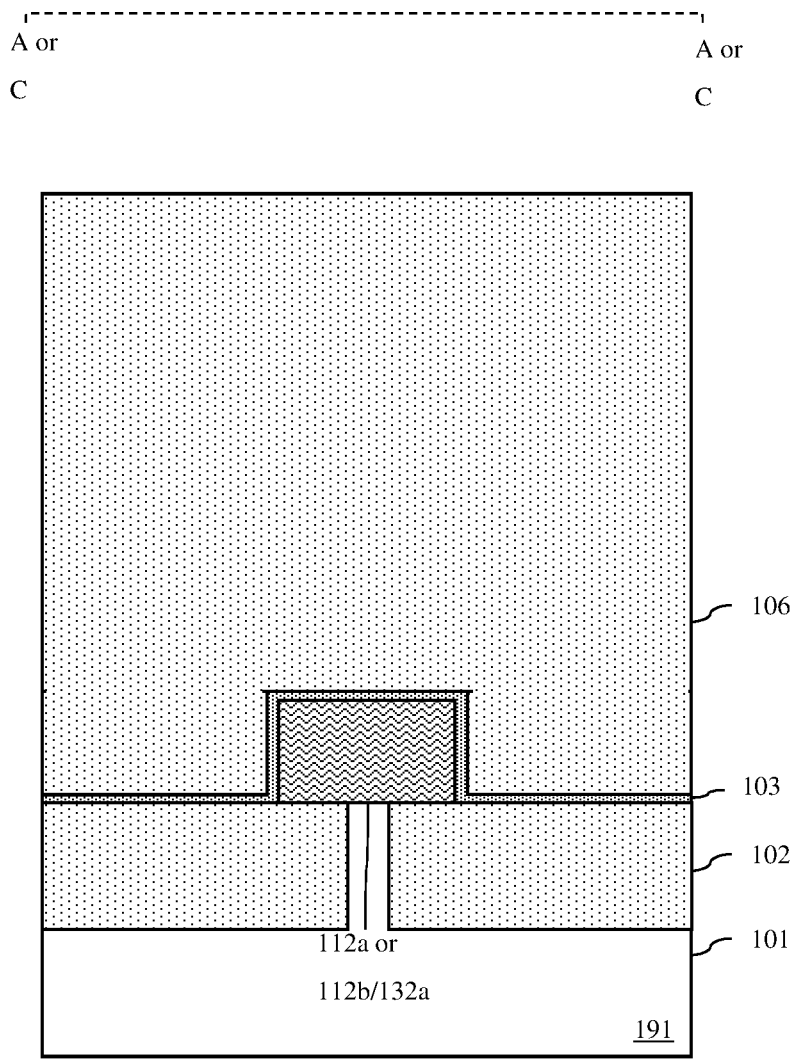

First source/drain regions for first FETs (e.g., for P-type GAAFETs) can then be formed on opposing sides of the sacrificial gates 153 such that they are positioned laterally immediately adjacent to the exposed vertical surfaces of at least one layer of the first semiconductor material 191, but not all of the layers of the first semiconductor material 191 (see processes 316-318 and FIGS. 6A-6B). Specifically, an in situ-doped epitaxial semiconductor material can be deposited on the exposed vertical surfaces of the first semiconductor material 191 and then etched back (i.e., recessed) to the desired level for the first source/drain regions 112a-112b, 132a-132b on opposing sides of the sacrificial gates 153. For example, the in-situ doped semiconductor material can be recessed to a level above only one layer of the first semiconductor material so that in the resulting structure the first FETs will have only one first channel region. Alternatively, the in-situ doped semiconductor material can be recessed to a level above two layers of the first semiconductor material so that in the resulting structure the first FETs will have two first channel regions, and so on. In any case, the in-situ doped semiconductor material should be recessed so that it is below the level of at least one layer of the first semiconductor material so the subsequently formed second FETs will have at least one second channel region, as discussed in greater detail below. It should be noted that the specific layer of the second semiconductor material 192, which separates the only or uppermost layer of the first semiconductor material 191 to be used for the first FETs (i.e., the lower FETs) and the only or lowermost layer of the first semiconductor material 191 to be used for the second FETs (i.e., the upper FETs) can optionally be made thicker than the other layers of the multi-layer stack formed at process 304 in order to allow more process margin and control.

After the first source/drain regions 112a-112b, 132a-132b are formed, a conformal dielectric layer 103 of the first dielectric material (e.g., silicon nitride) can be deposited over the partially completed structure (see process 320 and FIGS. 6A-6B). This conformal dielectric layer 103 can, for example, be deposited with a horizontal bias (i.e., so that horizontal portions of the layer will be relatively thick as compared to vertical portions). A blanket dielectric layer of the second dielectric material 106 (e.g., an ILD material, such as silicon dioxide) can then be deposited over the partially completed structure and polished (e.g., using a CMP process) to expose the tops of the sacrificial gate caps 154.

Figure 7:
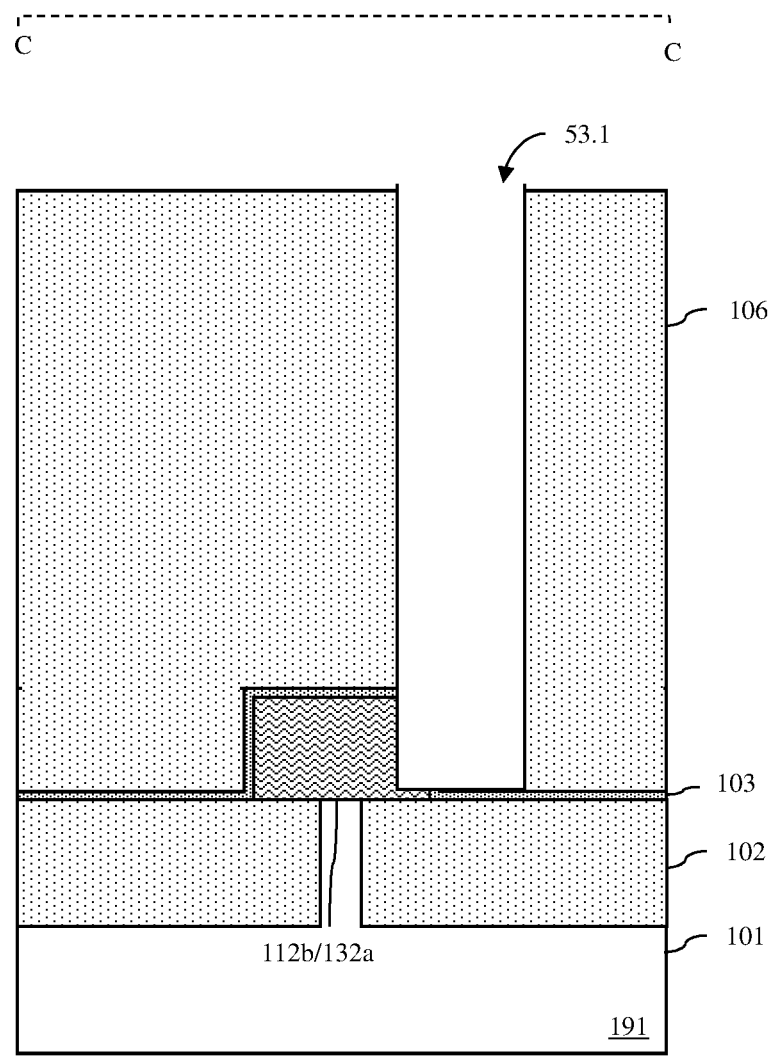
FIG. 7 is a cross-section diagram illustrating a partially completed IC structure formed according to the flow diagram of FIGS. 3A-3B.

Lithographic patterning and etch processes can be performed in order to form, in the second dielectric material 106, a first section 53.1 of a to-be-formed multi-section irregular-shaped cavity (see process 322 and FIG. 7). For example, as illustrated in FIG. 7, this first section 53.1 of the multi-section irregular-shaped cavity can be patterned and etched as a contact opening or via opening that is positioned on a first side of the sacrificial gate and that extends vertically through the second dielectric material 106 and at least lands on the top of a side edge portion of the first source/drain region 112b. Optionally, as illustrated, this first section 53.1 can extend entirely through the first source/drain region 112b at the interface between the side edge portion and the adjacent dielectric material landing on the conformal dielectric layer 103. Thus, the lower portion 53.1(1) of this first section 53.1 of the cavity can expose a side surface of the first source/drain region 112b. It should be noted that other sections of the multi-section irregular-shaped cavity will be formed during subsequent process steps, as described below, in order to complete formation of the multi-section irregular-shaped cavity.

Figure 8:
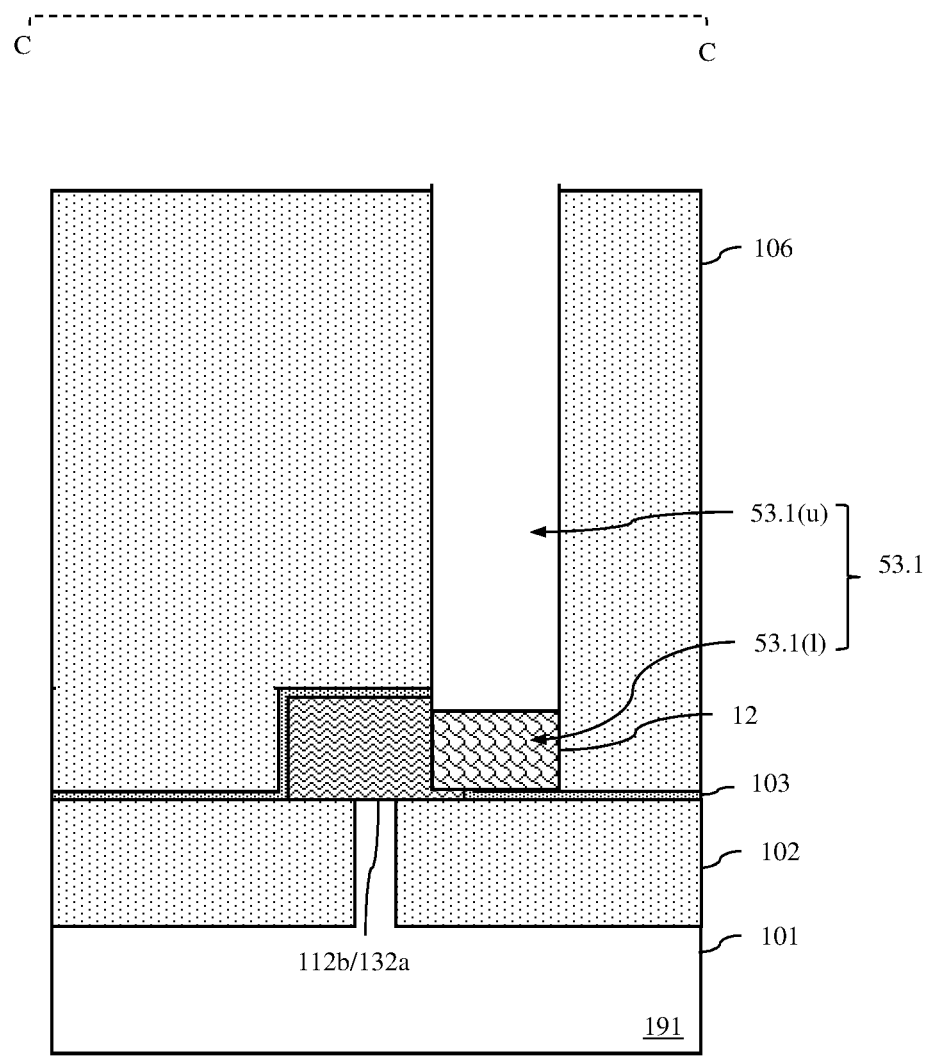
FIG. 8 is a cross-section diagram illustrating a partially completed IC structure formed according to the flow diagram of FIGS. 3A-3B.

A sacrificial material 12 can be deposited so as to fill the first section 53.1 and this sacrificial material 12 can subsequently be etch backed (i.e., recessed) so that only the lower portion 53.1(1) of the first section remains filled with the sacrificial material and so that the sidewalls of the upper portion 53.1(u) are exposed (see process 324 and FIG. 8). The sacrificial material 12 can be, for example, amorphous silicon or any other suitable sacrificial material that will protect the lower portion of the first section during subsequent processing and the can be selectively etched away when necessary. The sacrificial material 12 can be etched back (i.e., recessed), for example, so that it is at or below the level of the top of the first source/drain region 112b. It should be noted that, optionally, prior to deposition and etching back of the sacrificial material 12, a thin dielectric liner (e.g., a thin silicon oxide layer) (not shown) can be deposited so as to line the first section 53.1.

Figure 9:
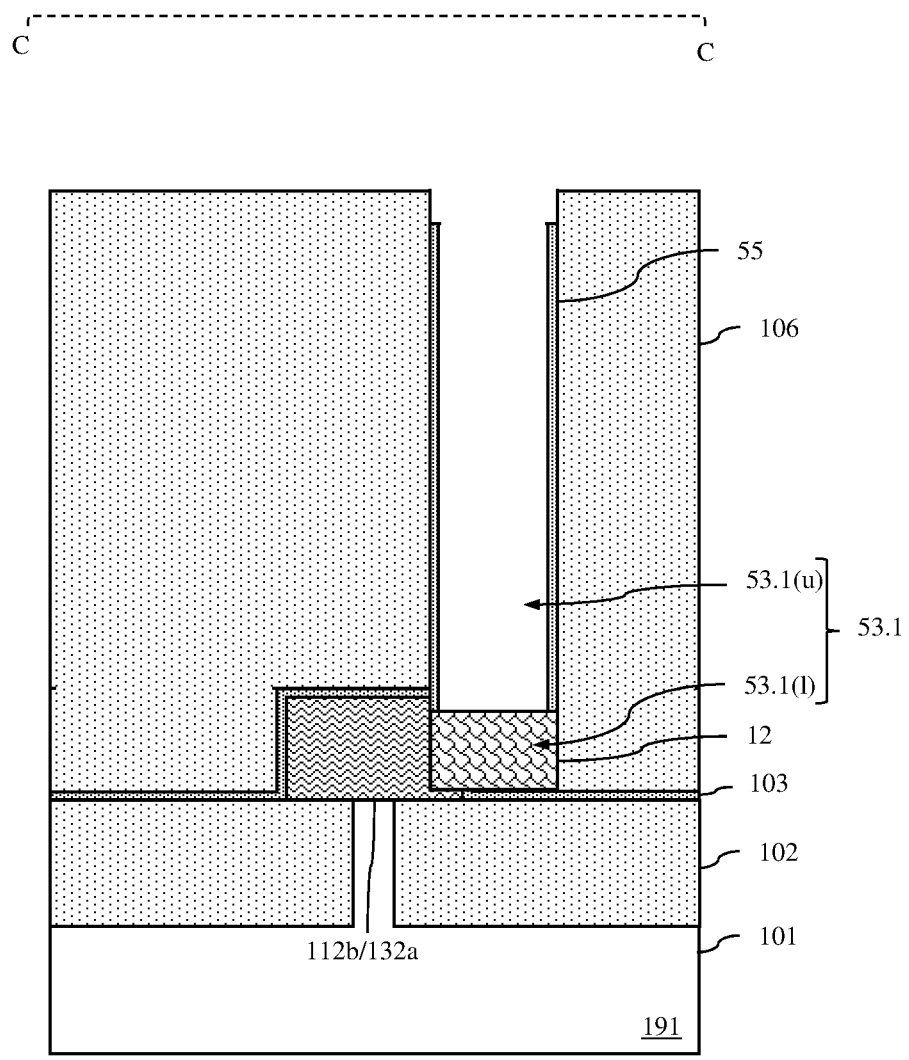
FIG. 9 is a cross-section diagram illustrating a partially completed IC structure formed according to the flow diagram of FIGS. 3A-3B.
Figure 10A:
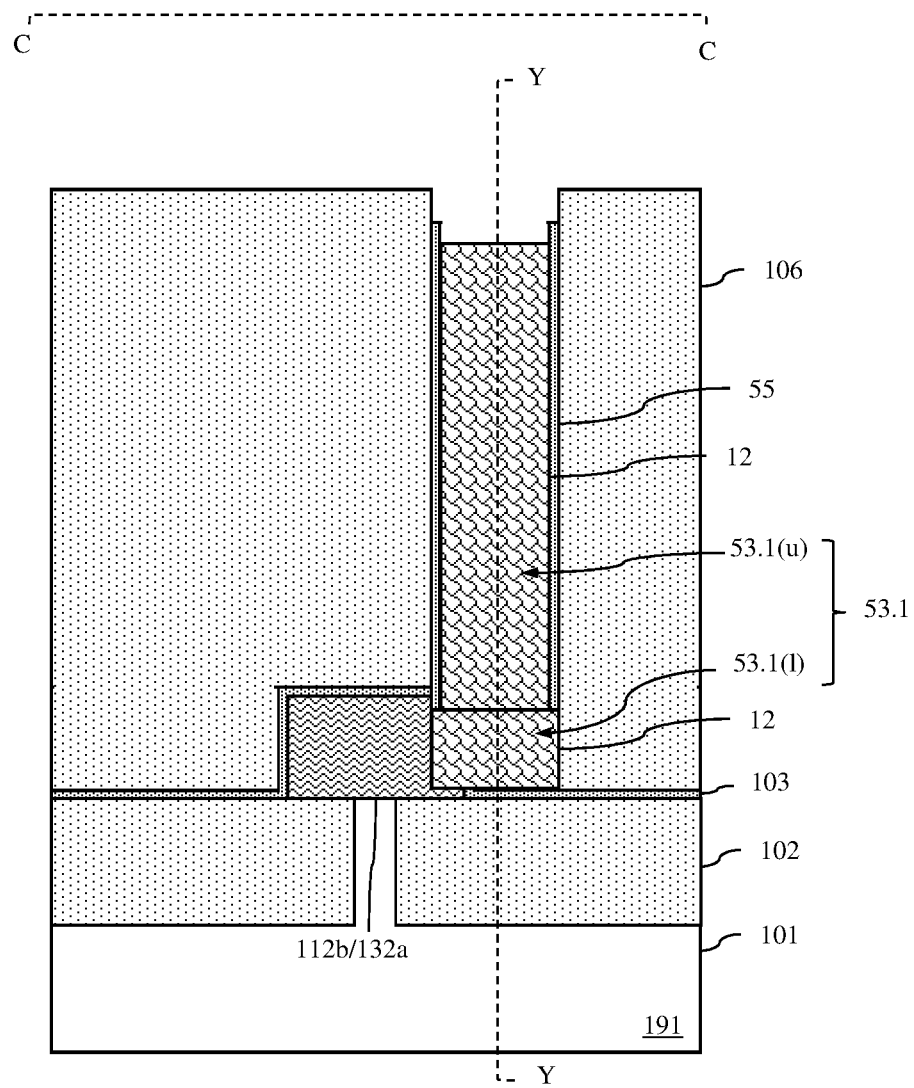
FIGS. 10A-10B are different cross-section diagrams illustrating a partially completed IC structure formed according to the flow diagram of FIGS. 3A-3B.
Figure 10B:
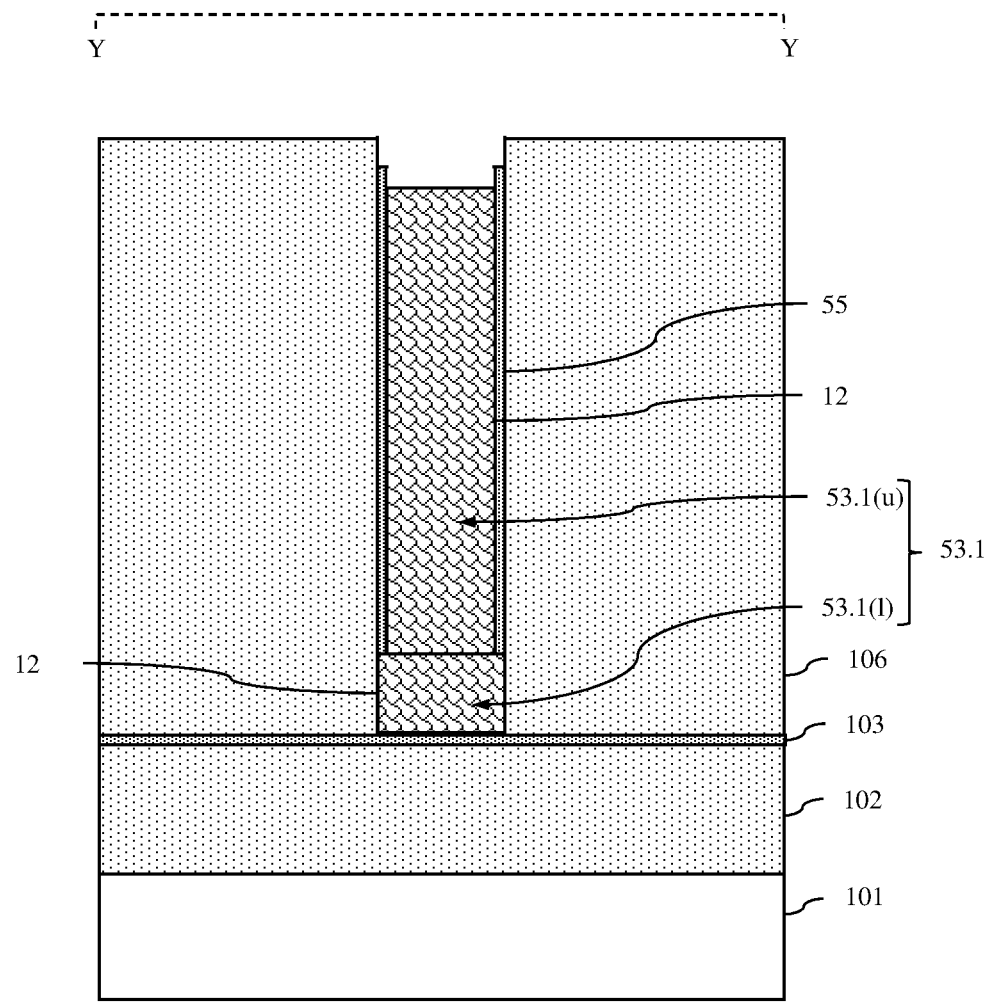

Next, a dielectric spacer 55 made of the first dielectric material (e.g., silicon nitride) can be formed on the exposed sidewalls of the upper portion 53.1(u) (see process 326 and FIG. 9). Such a dielectric spacer 55 can be formed, for example, using conventional sidewall spacer formation techniques. The sacrificial material 12 can again be deposited and etched back slightly so as to essentially fill the upper portion 53.1(u) (see process 328 and FIGS. 10A-10B).

Figure 11A:
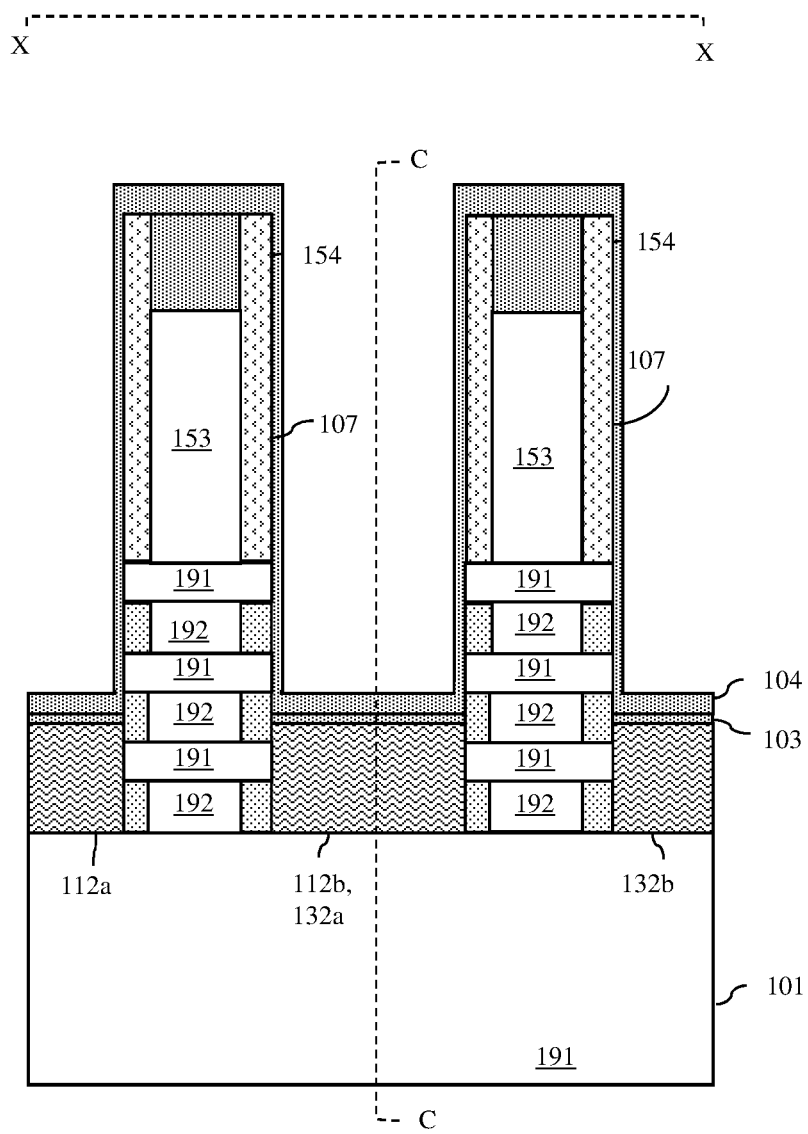
FIGS. 11A-11C are different cross-section diagrams illustrating a partially completed IC structure formed according to the flow diagram of FIGS. 3A-3B.
Figure 11B:
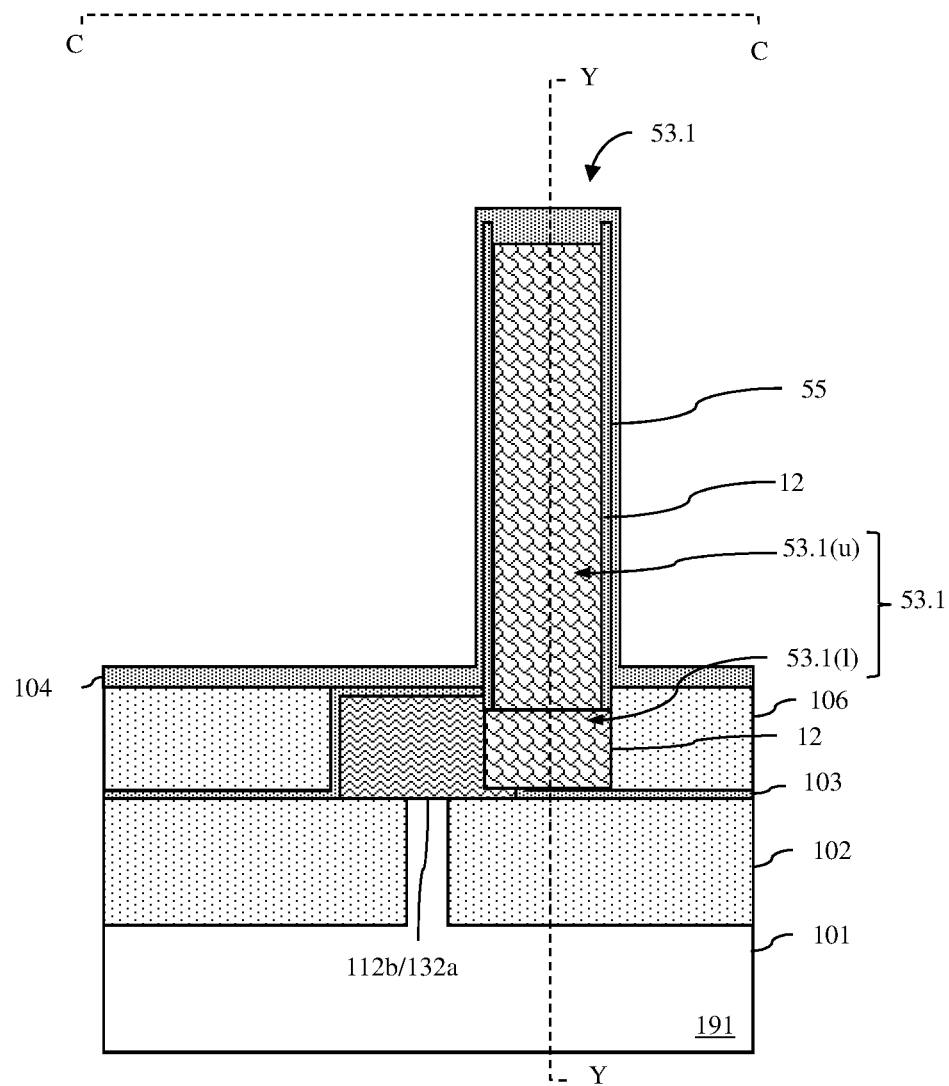
Figure 11C:
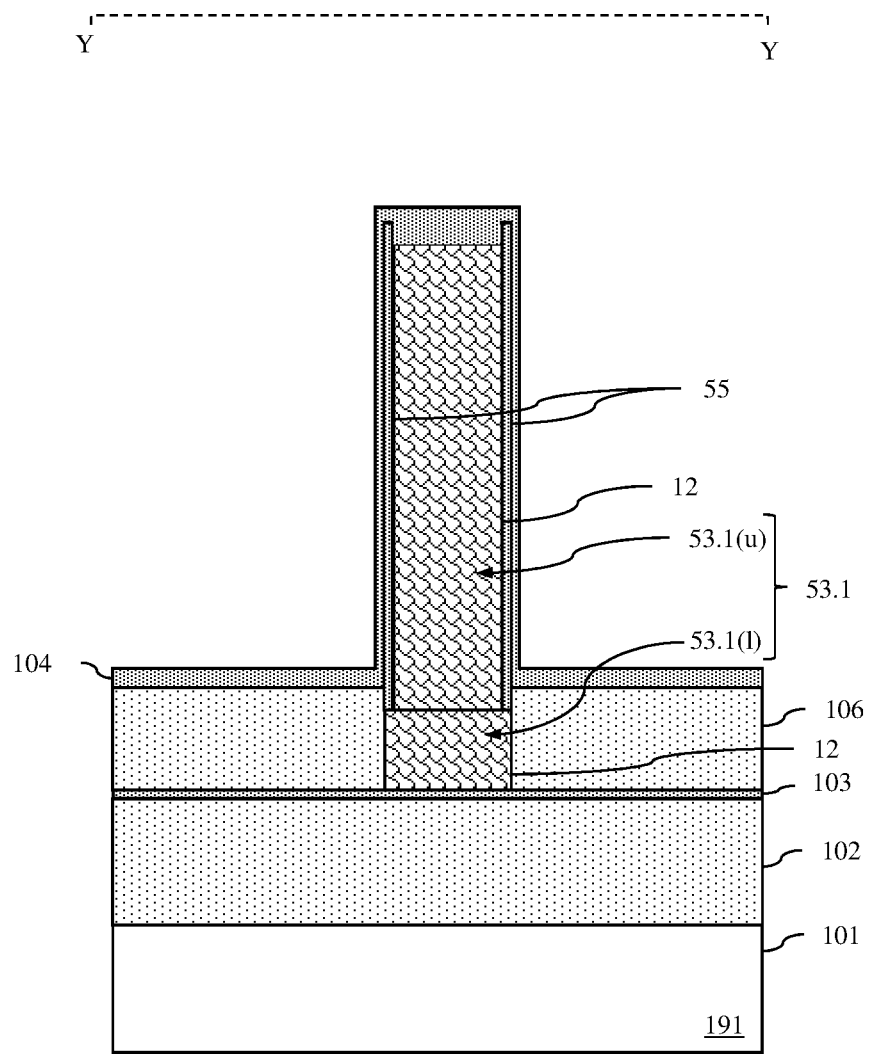

After the sacrificial material 12 is deposited into the upper portion 53.1(u), the second dielectric material 106 can be selectively etched back (i.e., recessed) so that the top of the second dielectric material 106 is approximately level with the top of the first source/drain regions 112a-112b, 132a-132b and, particularly, below the level of the bottom surface of any layer of the first semiconductor material 191 that is to be incorporated into the second FETs as a second channel region (see process 328). Then, another conformal dielectric layer 104 of the first dielectric material (e.g., silicon nitride) can be deposited over the partially completed structure and, particularly, over the first source/drain regions, the dielectric spacer 55, and the sacrificial material 12 laterally surrounded by the dielectric spacer 55 (see process 330 and FIGS. 11A-11C). This conformal dielectric layer 104 can be deposited with a horizontal bias (i.e., so that horizontal portions of the layer will be relatively thick as compared to vertical portions).

Figure 12A:
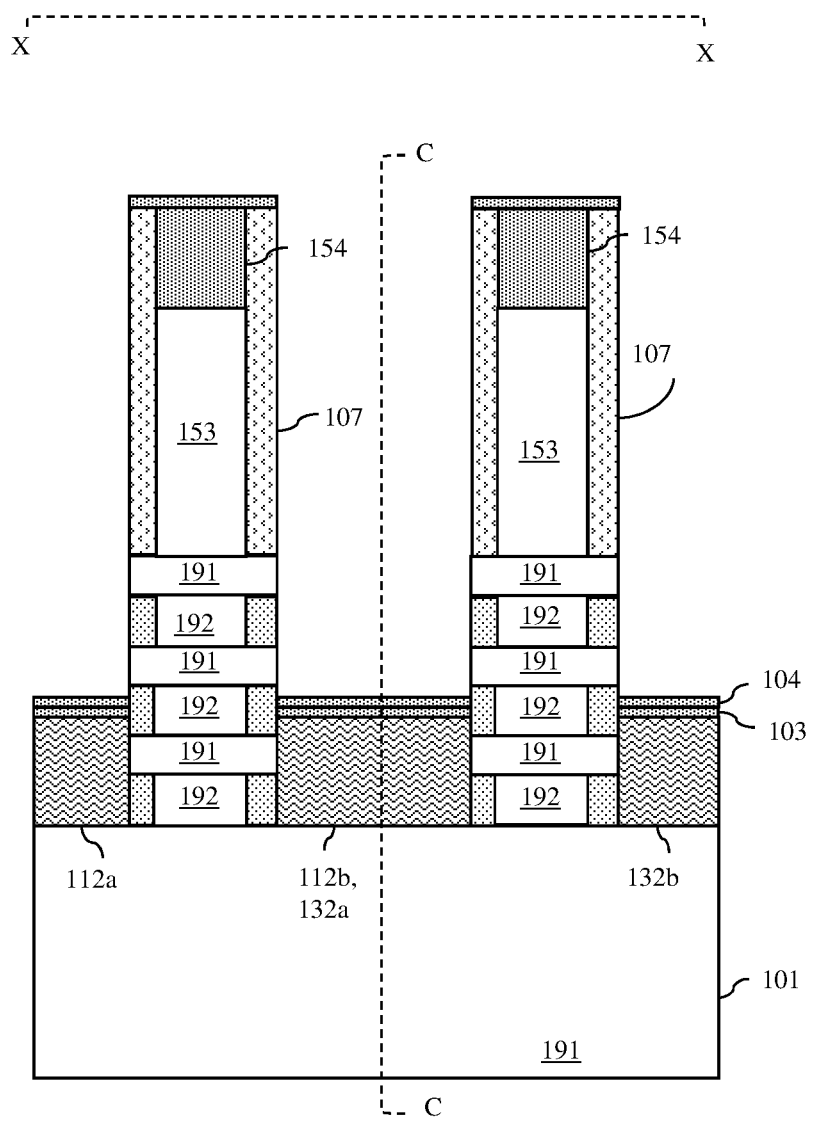
FIGS. 12A-12C are different cross-section diagrams illustrating a partially completed IC structure formed according to the flow diagram of FIGS. 3A-3B.
Figure 12B:
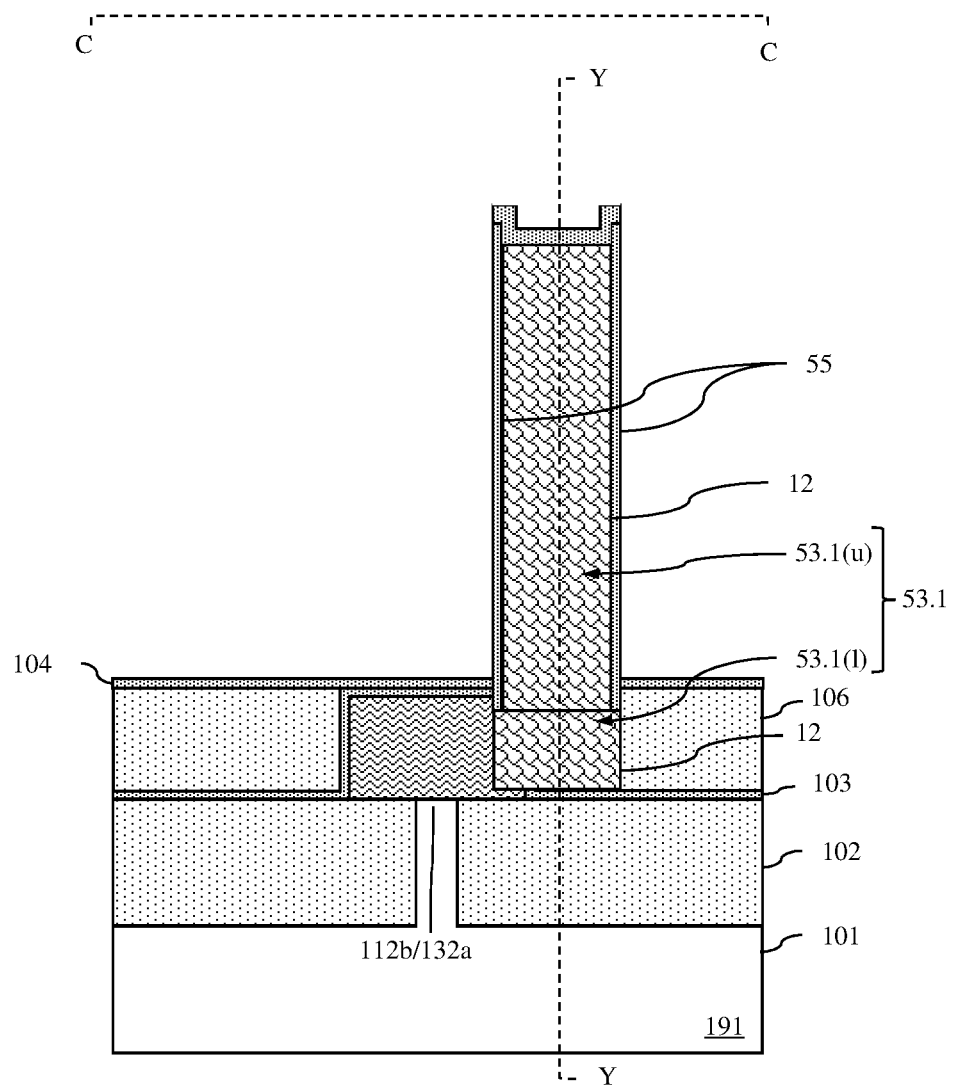
Figure 12C:
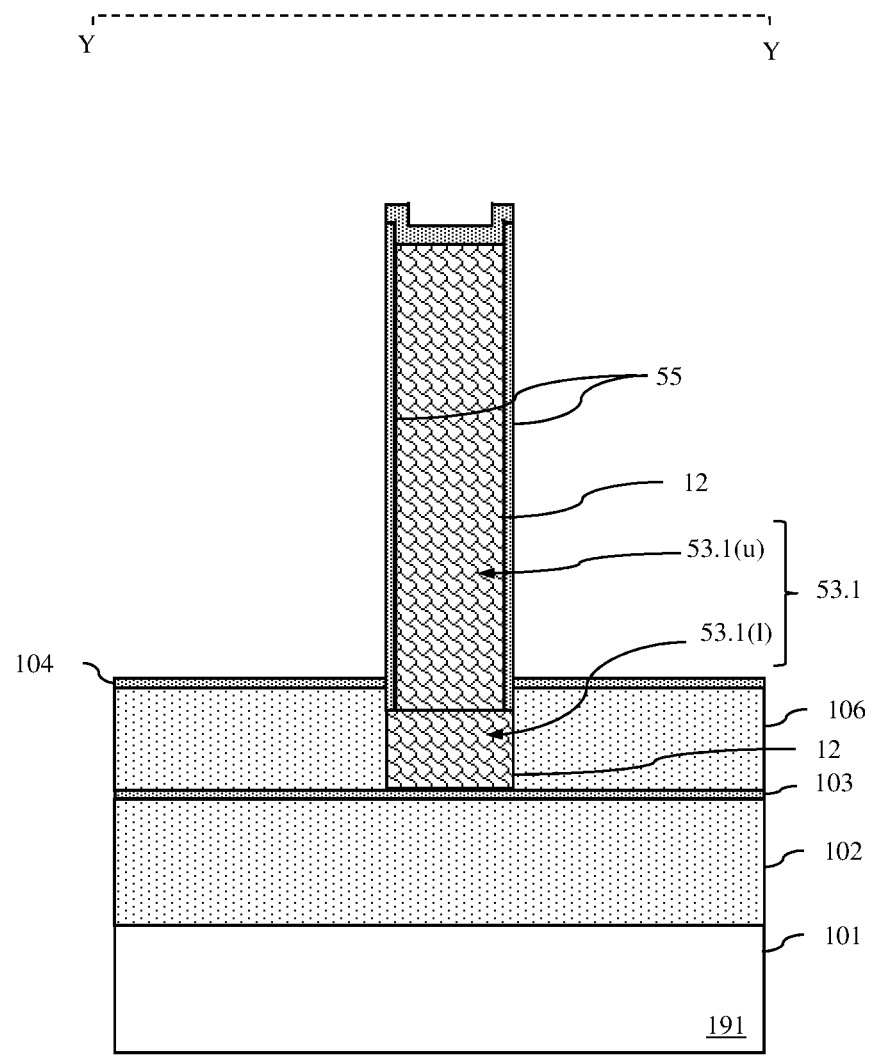

After deposition of the conformal dielectric layer 104, an isotropic etch process can be performed so as to remove relatively thin vertical portions of the conformal dielectric layers 103 and 104 (see process 332 and FIGS. 12A-12C). This isotropic etch process can specifically be used to expose, on opposing sides of the sacrificial gates 153, vertical surfaces of at least one upper layer of the first semiconductor material 191 in the remaining portions of the fin. Since the conformal dielectric layers 103 and 104 were previously deposited with a horizontal bias (i.e., such that the horizontal portions were thicker than the vertical portions), this isotropic etch process can be stopped prior to complete removal of the horizontal portions of the conformal dielectric layers 103 and 104 and, particularly, prior to exposure of the first source/drain regions 112a-b, 132a-b below.

Figure 13A:
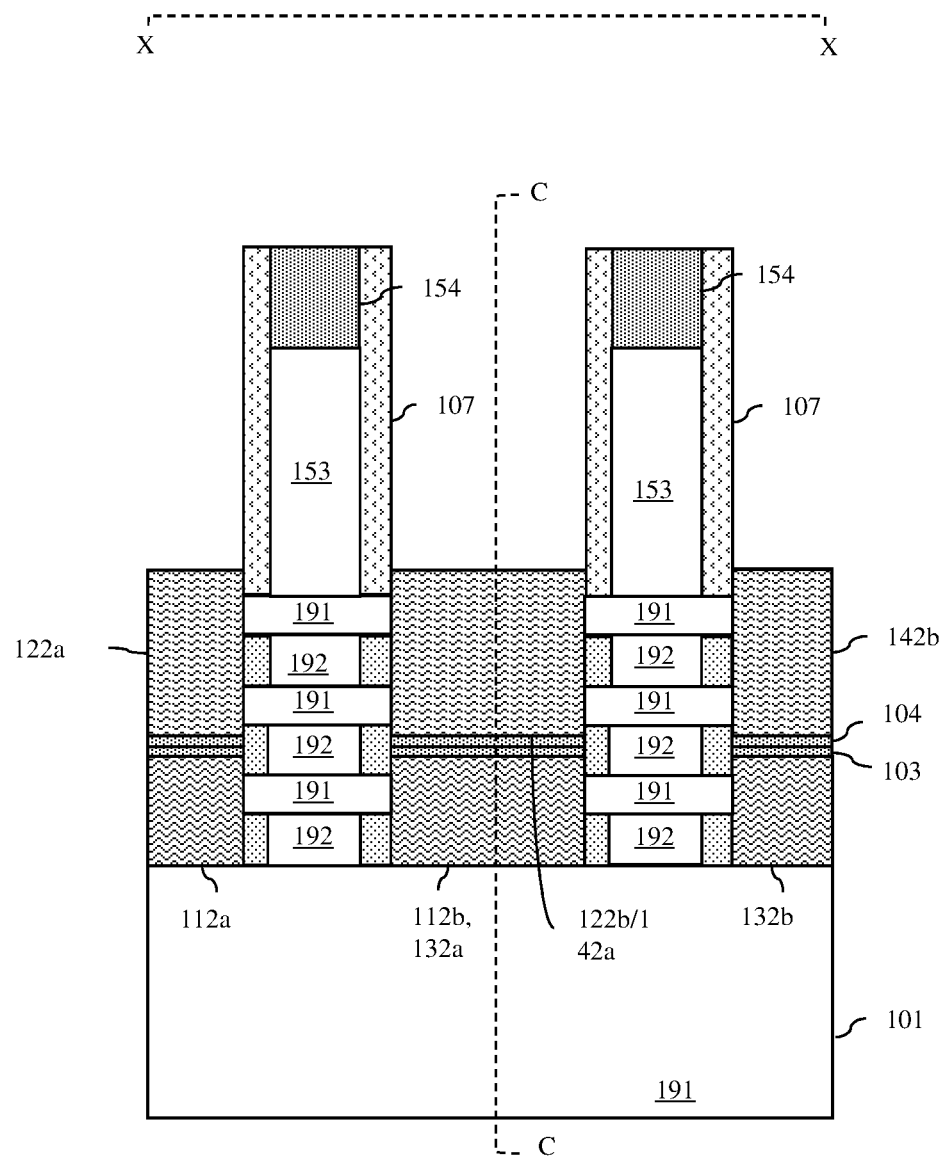
FIGS. 13A-13B are different cross-section diagrams illustrating a partially completed IC structure formed according to the flow diagram of FIGS. 3A-3B.
Figure 13B:
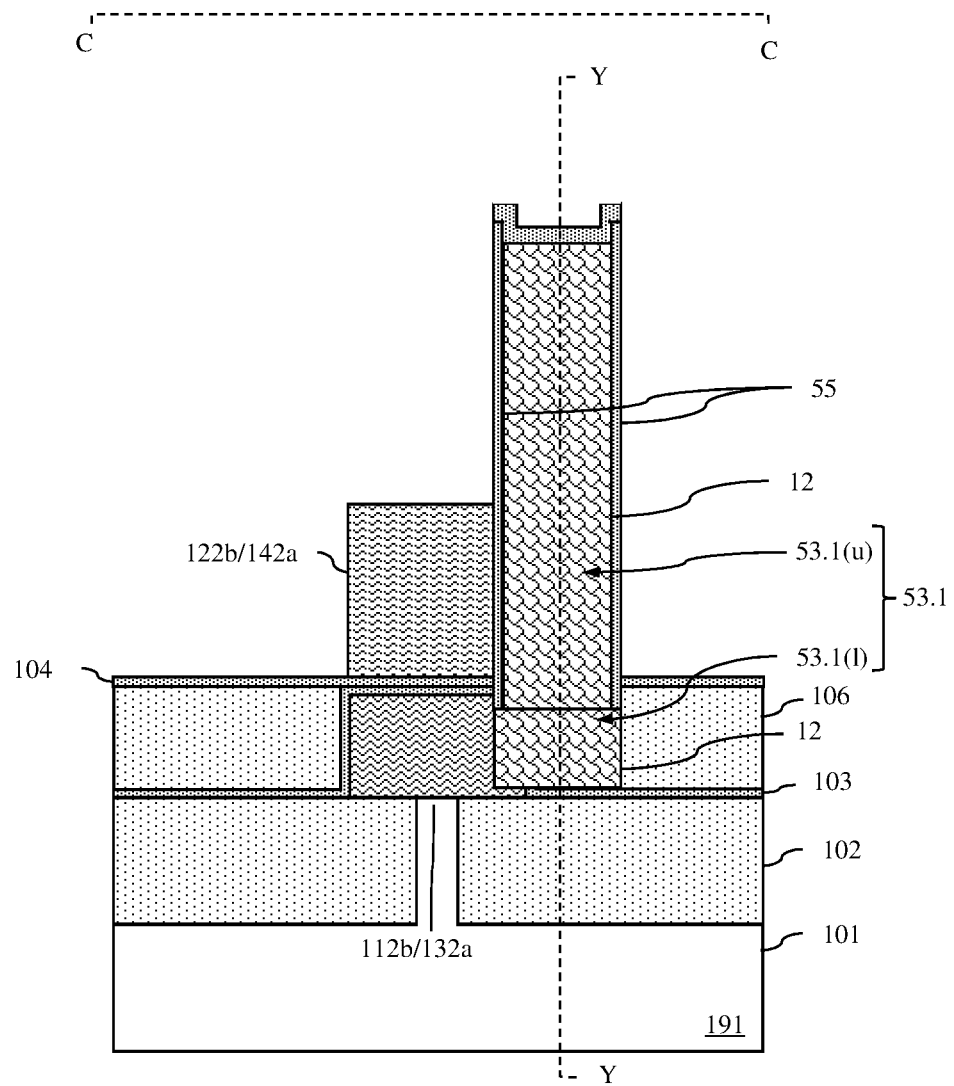
Figure 14A:
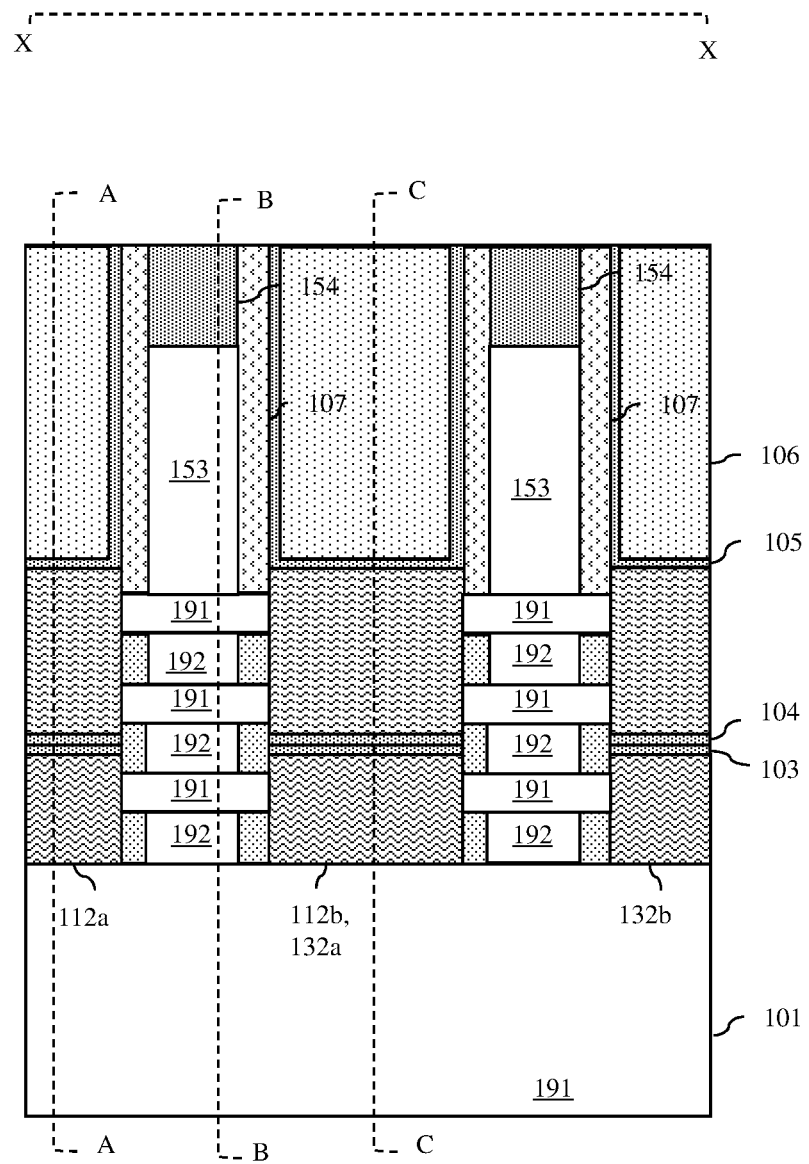
FIGS. 14A-14E are different cross-section diagrams illustrating a partially completed IC structure formed according to the flow diagram of FIGS. 3A-3B.
Figure 14B:
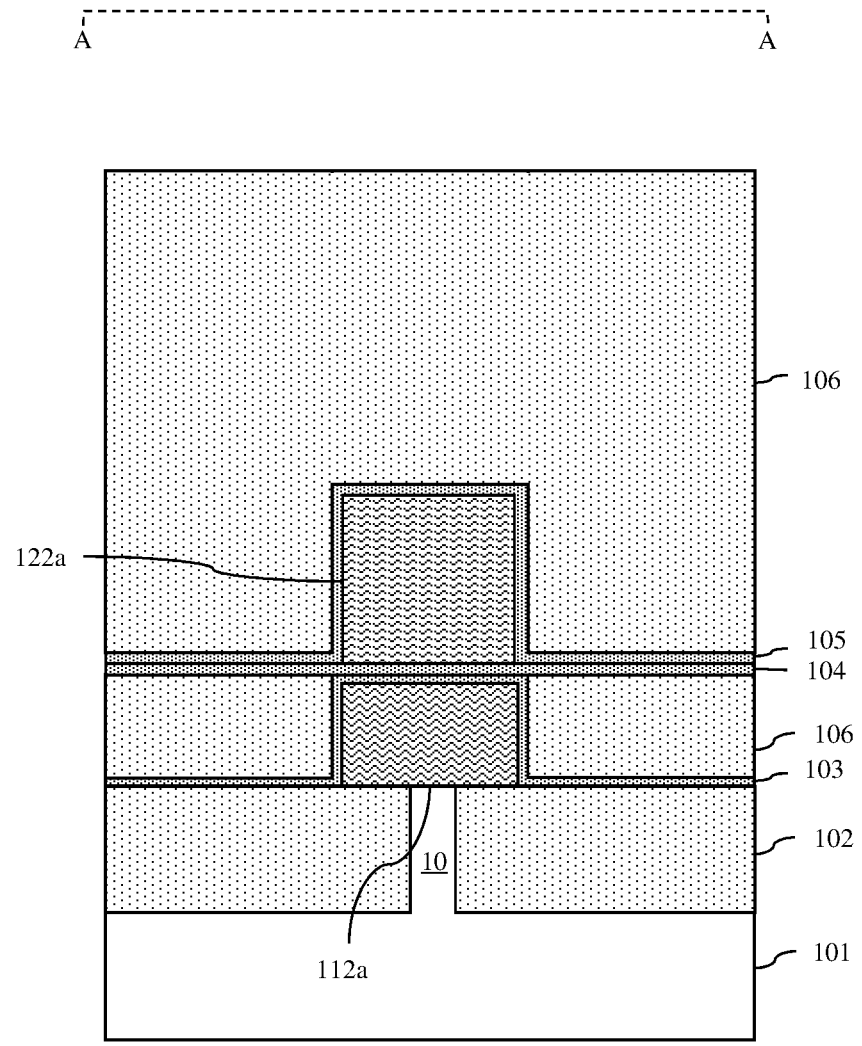
Figure 14C:
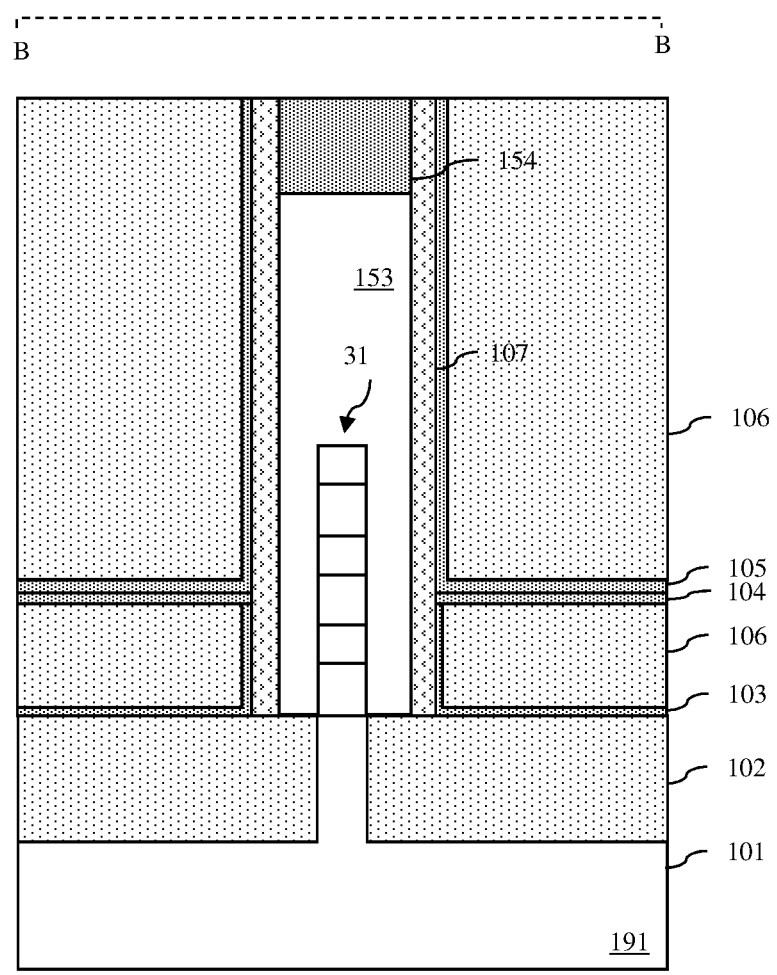
Figure 14D:
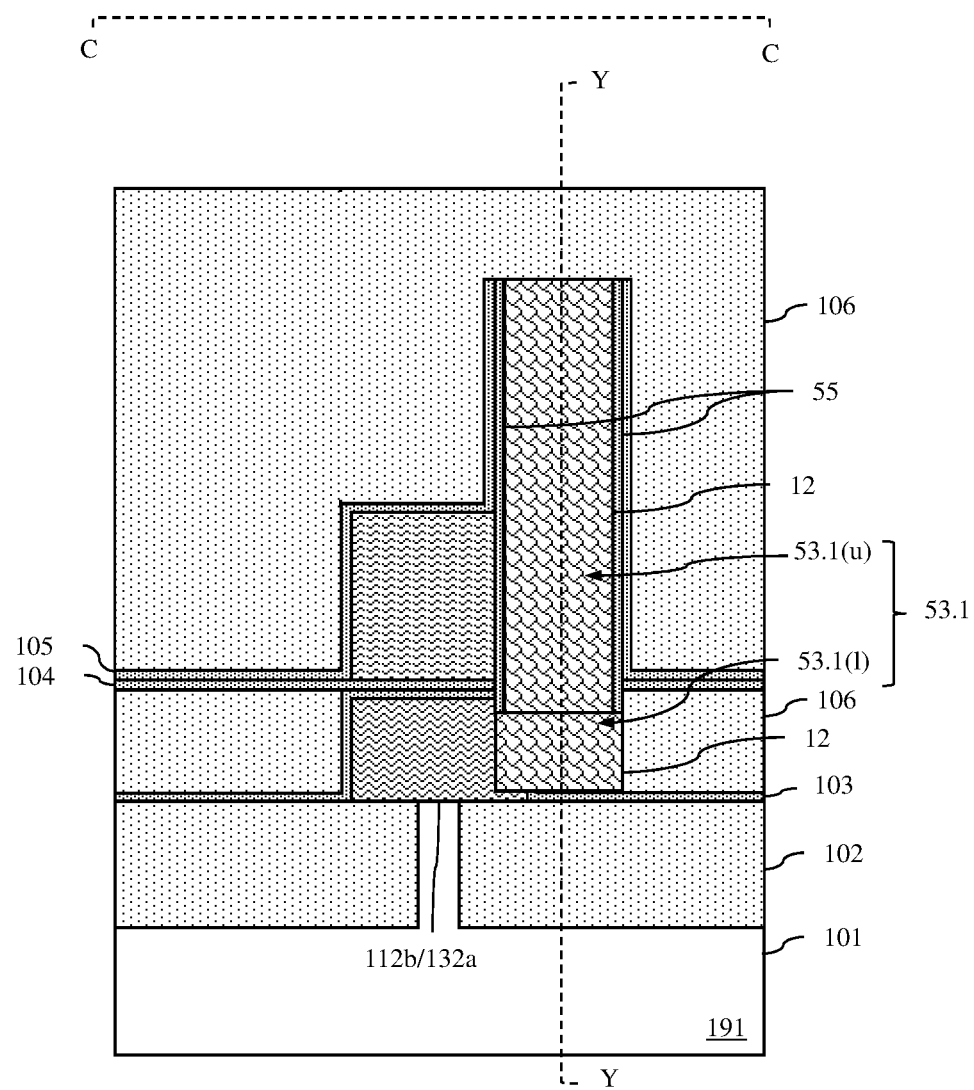
Figure 14E:
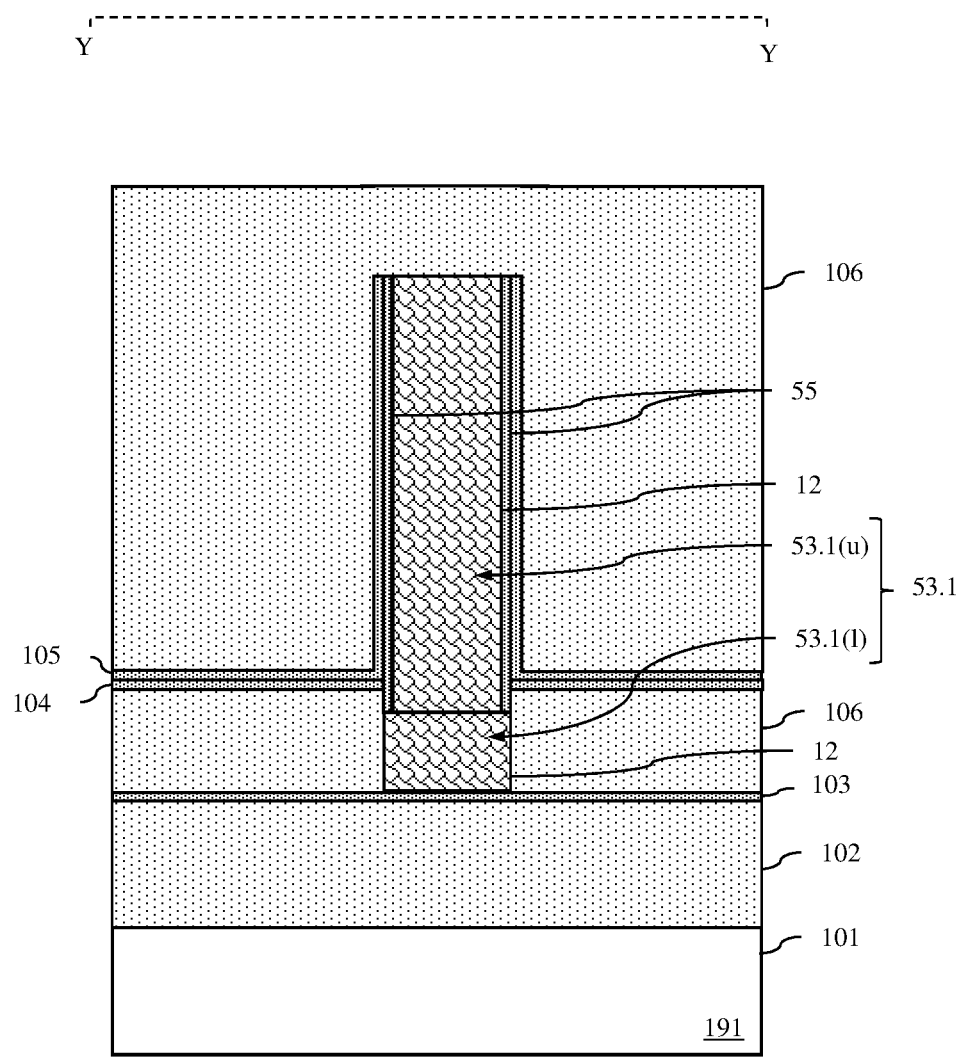
Figure 15A:
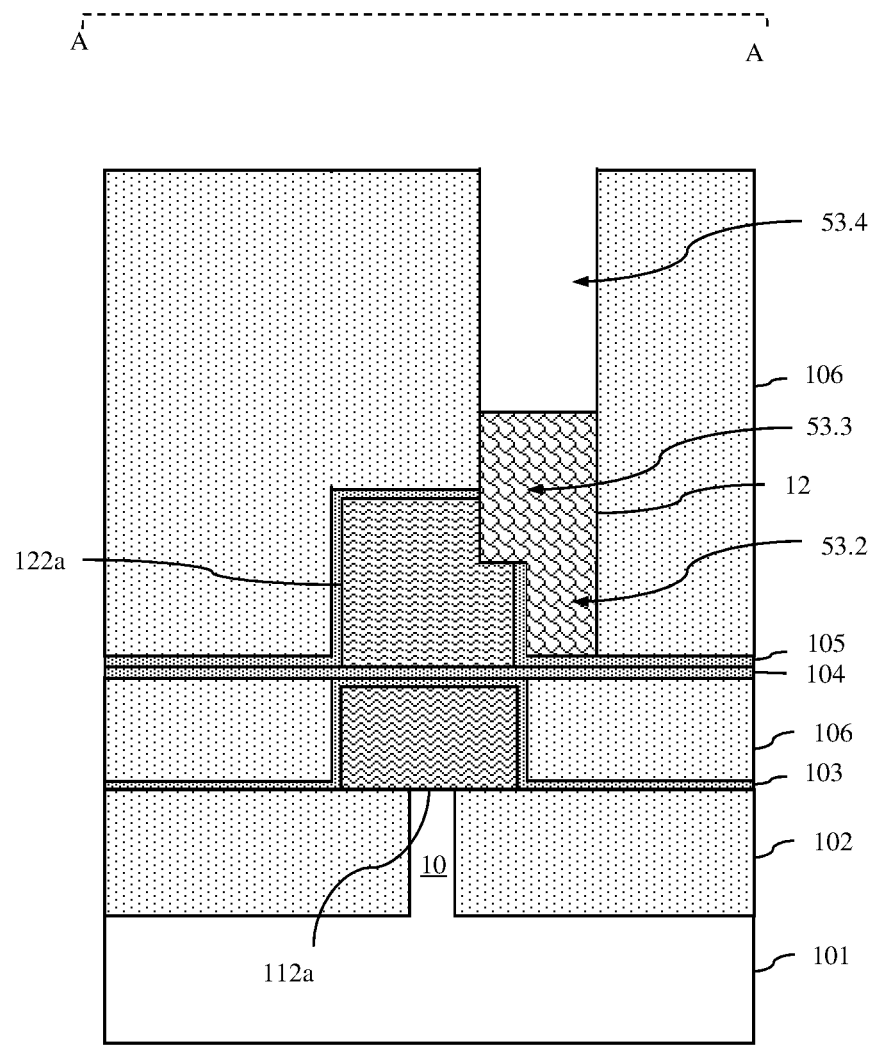
FIGS. 15A-15D are different cross-section diagrams illustrating a partially completed IC structure formed according to the flow diagram of FIGS. 3A-3B.
Figure 15B:
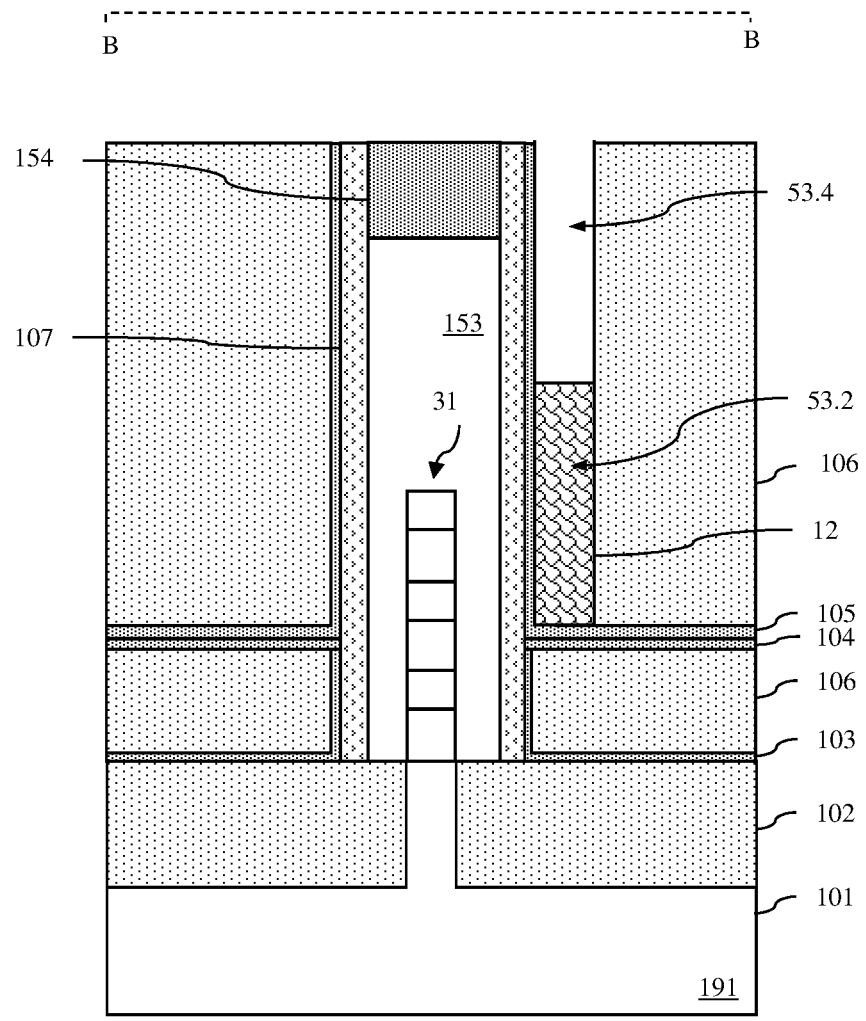
Figure 15C:
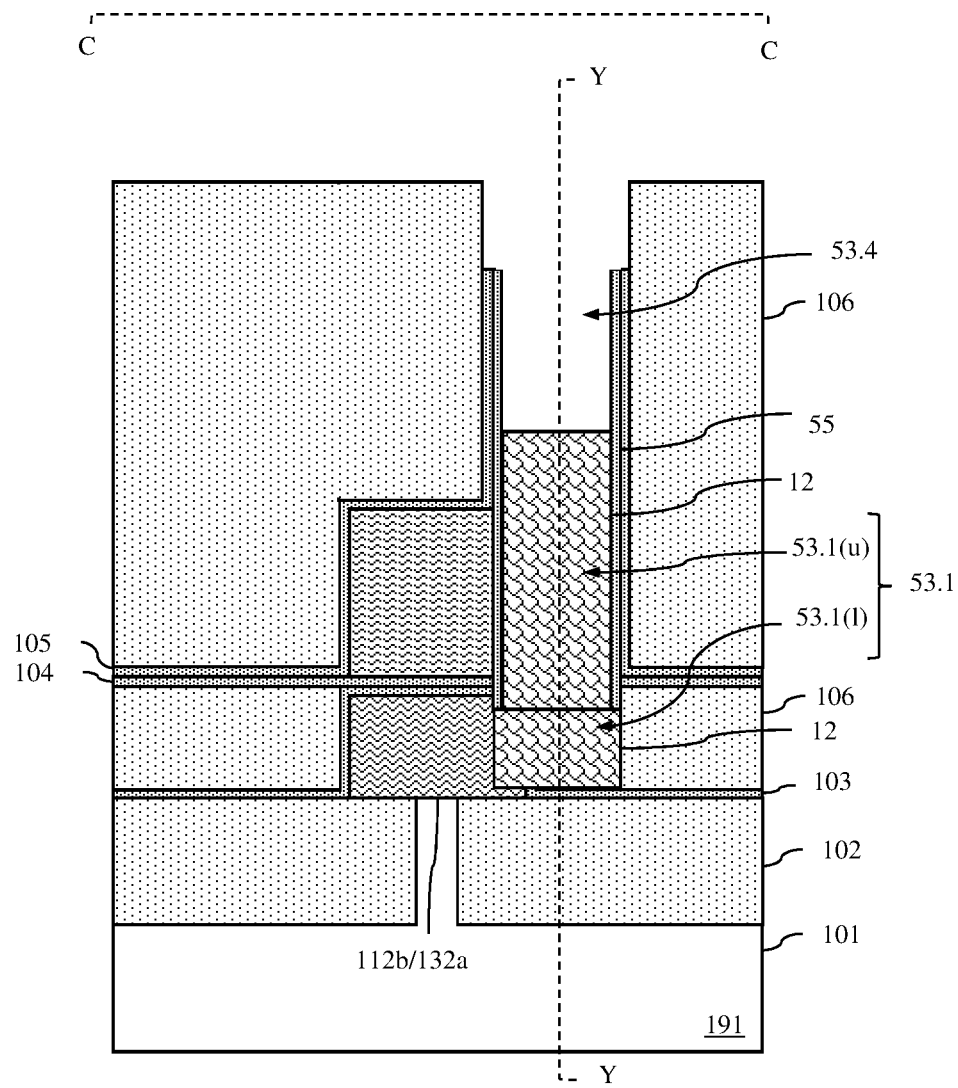
Figure 15D:
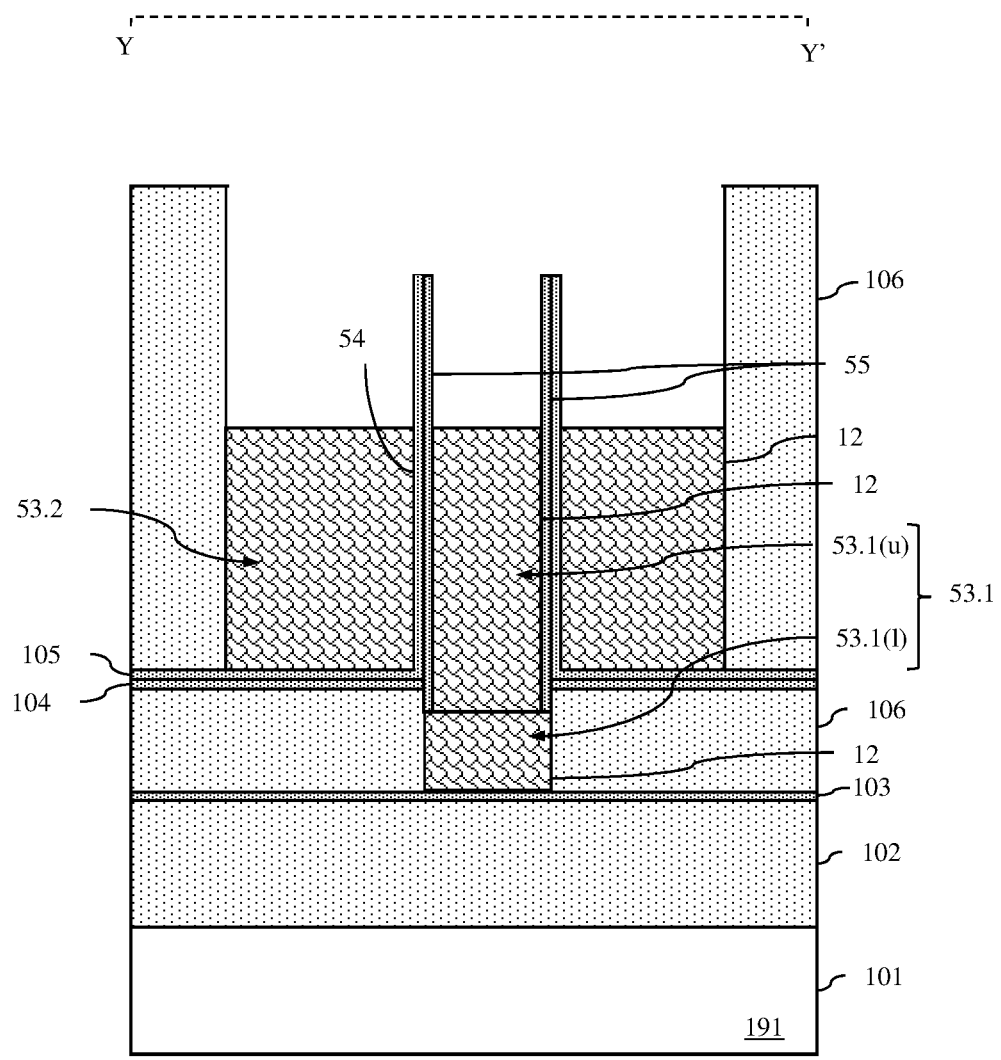

Once vertical surfaces of upper layer(s) of the first semiconductor material 191 are exposed, second source/drain regions 122a-122b, 142a-142b for second FETs (i.e., for upper FETs) can be formed (see process 334 and FIGS. 13A-13B). Specifically, the second FETs can have a second-type conductivity that is different from the first-type conductivity of the first FETs (e.g., the second FETs can be N-type FETs). The second source/drain regions 122a-122b, 142a-142b can be formed by epitaxial deposition of an in situ-doped semiconductor material on the exposed vertical surfaces of the first semiconductor material 191. Thus, the second source/drain regions 122a-122b, 142a-142b will be on opposing sides of the sacrificial gates 153, above and electrically isolated from the first source/drain regions 112a-b, 132a-b by the conformal dielectric layers 103 and 104.

Referring to FIGS. 14A-14E, after formation of the second source/drain regions, another conformal dielectric layer 105 of the first dielectric material (e.g., silicon nitride) can be deposited so as to cover the partially completed structure and, particularly, the second source/drain regions and another blanket dielectric layer of the second dielectric material 106 (e.g., an interlayer dielectric (ILD) material, such as silicon dioxide) can be deposited on the conformal dielectric layer 105. The second dielectric material 106 can be polished (e.g., using a CMP process) to expose the top of the sacrificial material 12 within the upper portion of the first section 23.1 of the to-be-formed irregular-shaped cavity (see process 336). The second dielectric material can then, optionally, be completely removed from above the conformal dielectric layer 105. An additional blanket dielectric layer of the second dielectric material 106 can be deposited to cover the sacrificial material 12 and an additional polishing process can be performed such that the sacrificial material 12 remains unexposed.

Next, second and third sections 53.2-53-3 of the to-be-formed multi-section irregular-shaped cavity can be formed in the second dielectric material 106 and at least partially filled with sacrificial material 12 (see processes 338-340 and FIGS. 15A-15D).

Specifically, multiple lithographic patterning and etch processes can be performed in order to form, in the second dielectric material 106 at the same level as the second source/drain region 122a, second and third sections 53.2-53.3 of the cavity. For example, a second section 53.2 can be lithographically patterned and etched in the second dielectric material 106 above the conformal dielectric layer 105 such that it is essentially horizontally oriented and abuts the first section 53.1. The second section 53.2 can specifically be patterned and etched as a wire trench that runs parallel to the second FET (i.e., along the length of the second FET) in a first direction and that has at least one vertical surface 54 positioned laterally adjacent to the dielectric spacer 55 within the upper portion of the first section 53.1 of the cavity (see FIGS. 15A, 15B and 15D). The second section 53.2 can further be patterned and etched such that it extends passed the gate sidewall spacer 107 and is positioned laterally adjacent to and, particularly, to one side of the second source/drain region 122a. Optionally, the second section 53.2 of the cavity can further be patterned and etched so that it traverses the first section 53.1. As a result, after the second section 53.2 is etched, the upper portion 53.1(u) of the first section 53.1 will extend vertically through and essentially bifurcate the second section 53.2 such that discrete portions (e.g., a left-side portion and a right-side portion) of the second section 53.2 are located on opposing sides of the upper portion 53.1(u) of the first section 53.1. In this case, the vertical surface 54 is an inner surface of the second section 53.2 as opposed to an end that terminates at the first section 53.1.

After the second section 53.2 of the cavity is formed, a mask layer can be deposited to fill the second section 53.2 and additional lithographic patterning and etch processes can be performed in order to form a third section 53.2 of the cavity that extends in a second direction, which is essentially perpendicular to the first direction, and connects the second section 53.2 to the second source/drain region 122a. More specifically, this third section 53.3 can be patterned and etched such that it is horizontally oriented and extends laterally from a side of the second section 53.2 to the second source/drain region 122a and, thus, such that a side surface of the second source/drain region 122a is exposed. Thus, in combination, the second section 53.2 and the third section 53.3 of the cavity wrap around the adjacent sacrificial gate 153 (or, more particularly, wrap around the gate sidewall spacer 107 on the adjacent sacrificial gate) from the dielectric spacer 55 within the first section 53.1 to the second source/drain region 122a (see FIG. 15A). The mask layer can then be selectively removed.

Next, the sacrificial material 12 can again be deposited (see FIGS. 15A-15D). The sacrificial material 12 can then be etched back so that, within all of the sections 53.1-53.3, the top surface of the sacrificial material 12 is at some predetermined depth below the top of the dielectric spacer 55 and, thus, such that an upper end of the dielectric spacer 55 is exposed (see FIG. 15D).

Figure 16A:
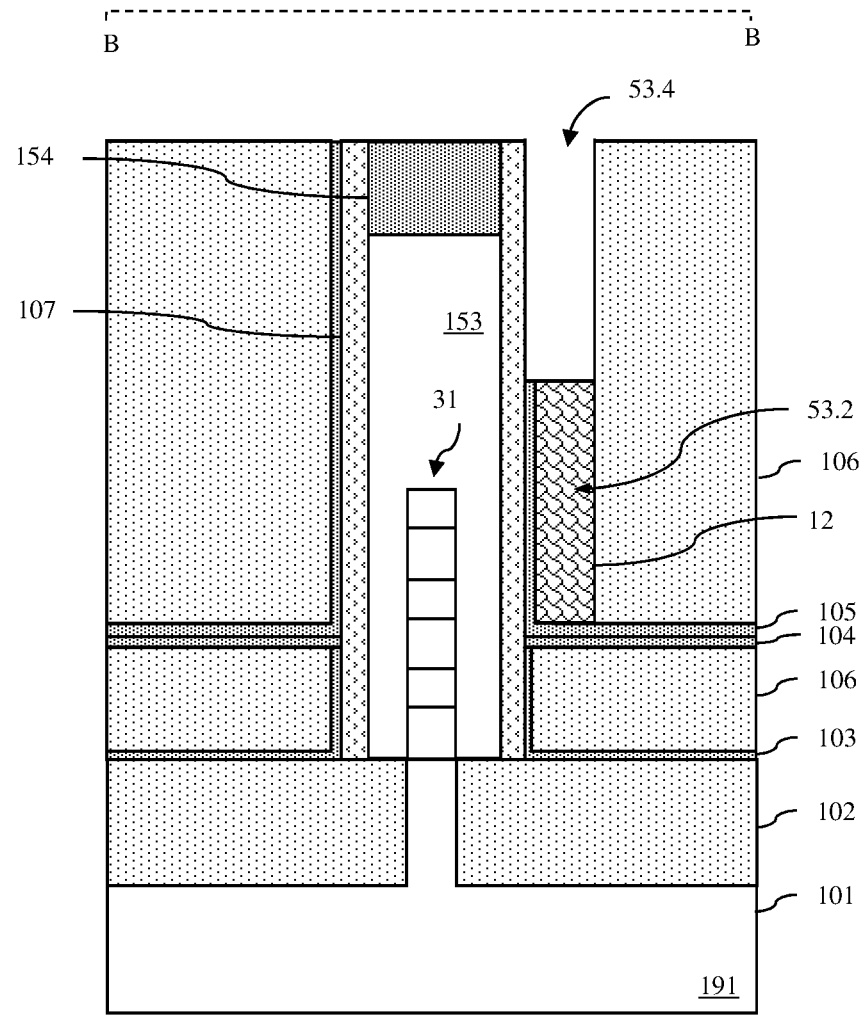
FIGS. 16A-16C are different cross-section diagrams illustrating a partially completed IC structure formed according to the flow diagram of FIGS. 3A-3B.
Figure 16B:
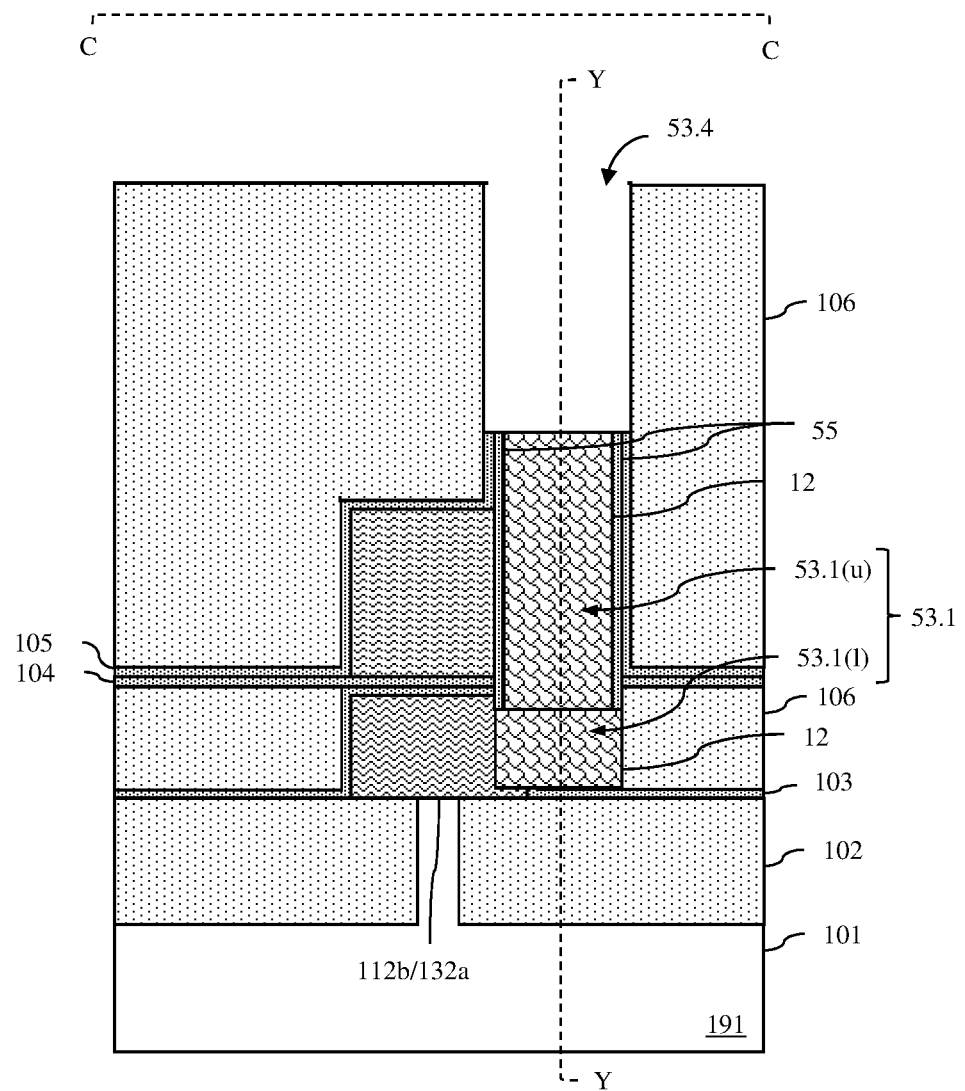
Figure 16C:
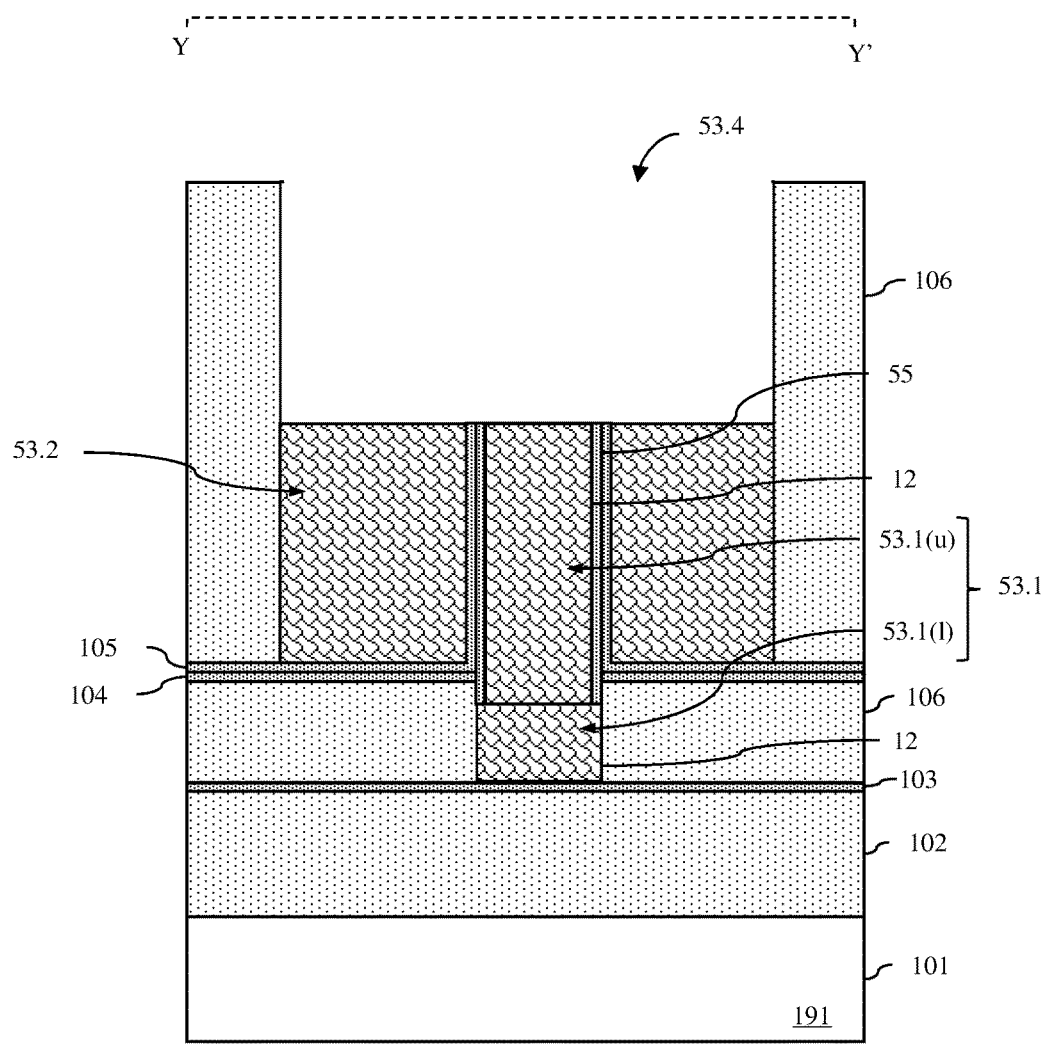
Figure 17A:
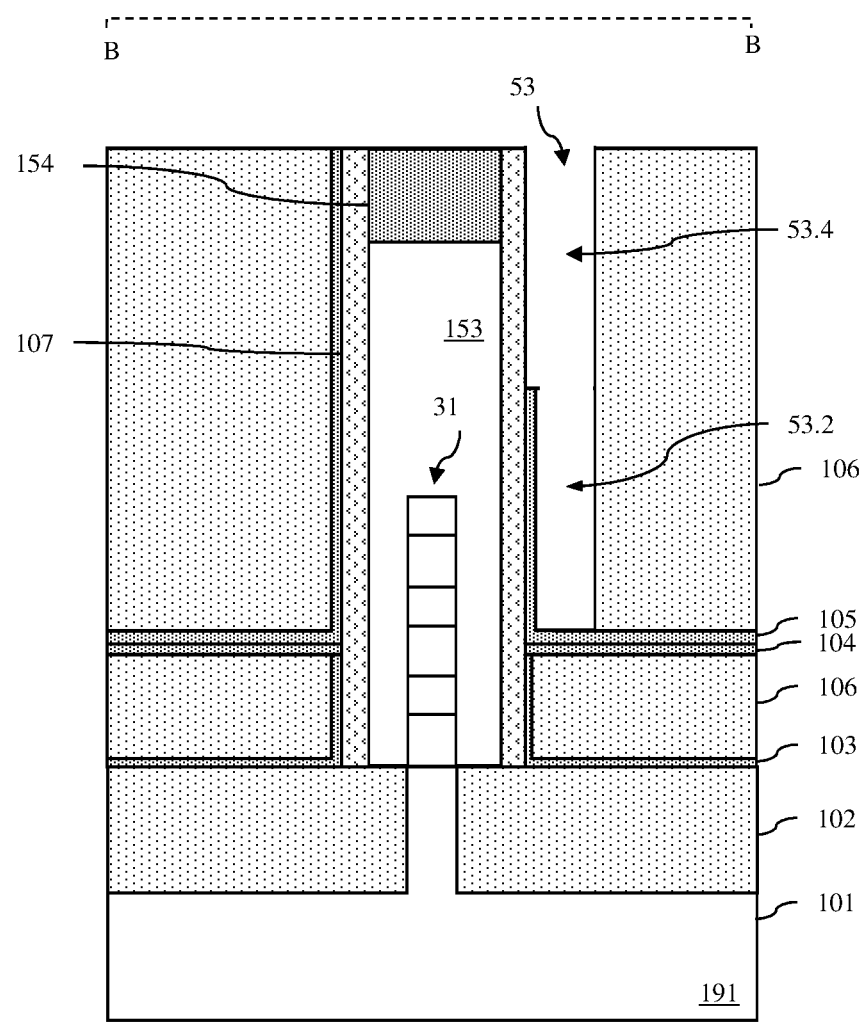
FIGS. 17A-17C are different cross-section diagrams illustrating a partially completed IC structure formed according to the flow diagram of FIGS. 3A-3B.
Figure 17B:
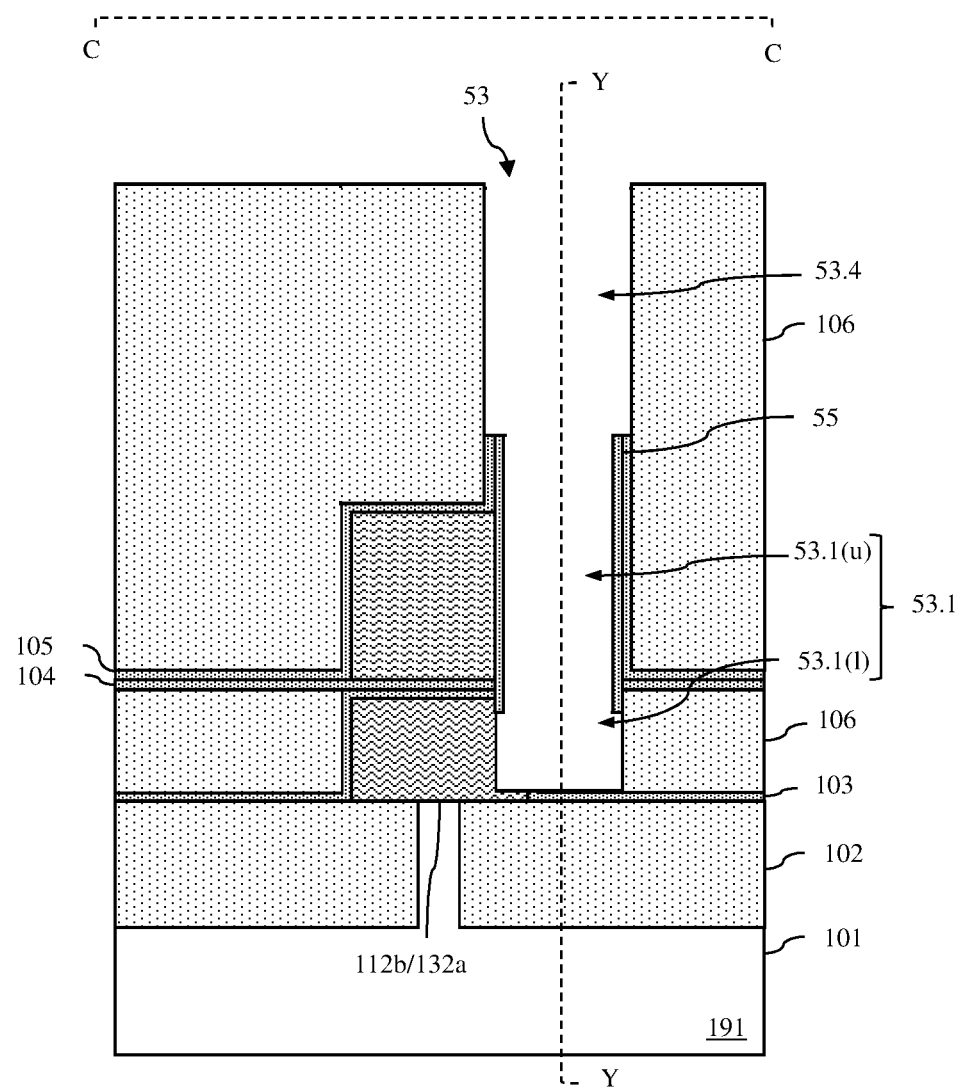
Figure 17C:
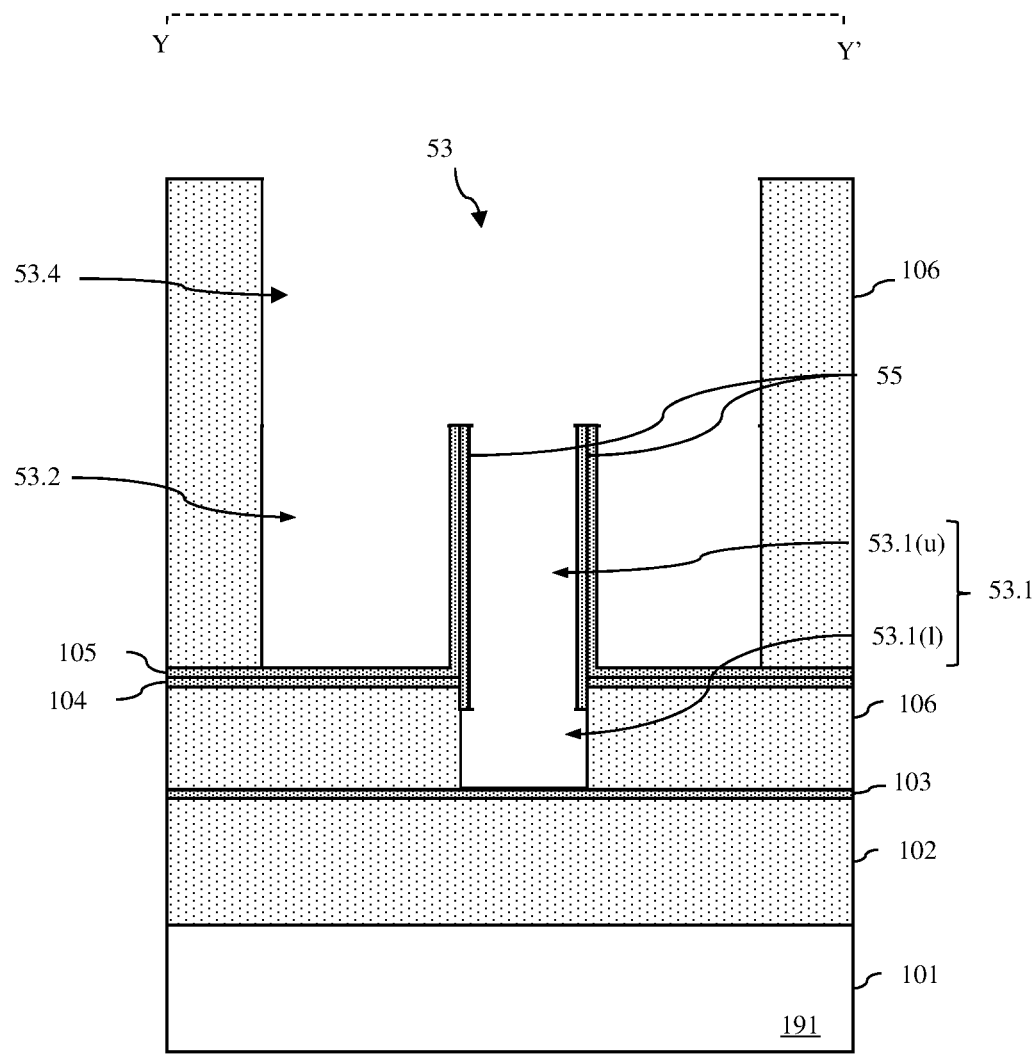

A selective isotropic etch process can then be performed in order to remove the exposed upper end of the dielectric spacer 55 (see process 342 and FIGS. 16A-16C). It should be noted that, at this point in the processing, the conformal dielectric layer 105 covers the gate sidewall spacer 107. Thus, this isotropic etch process can be stopped upon removal of the exposed upper end of the dielectric spacer 55 and, during this isotropic etch process, exposed portions of the conformal dielectric layer 105 above the sacrificial material 12 will also be removed, but the gate sidewall spacer 107 will remain essentially intact and the adjacent sacrificial gate 153 will remain unexposed (i.e., protected). As a result, process 342 effectively creates a fourth section 53.4 of the to-be-formed irregular-shaped cavity. This fourth section 53.4 is an open space in the second dielectric material 106 above and immediately adjacent to the dielectric spacer 55 as well as the sacrificial material 12 that fills the first section 53.1, the second section 53.2 and the third section 53.3. That is, the fourth section 53.4 traverses over the sacrificial material 12 in the first, second and third sections 53.1-53.3 and also over the dielectric spacer 44 that separates the first section 53.1 from the second section 53.2. The sacrificial material 12 can then be selectively removed from the sections 53.1-53.3 in order to complete formation of an irregular-shaped cavity 53 with multiple sections 53.1-53.4 that, in combination, expose dielectric surfaces and also semiconductor surfaces of both the first source/drain region 112b of the first FET 110 at one level and on a first side of the sacrificial gate and the second source/drain region 122a of the second FET 120 at a different level and on a second side of the sacrificial gate opposite the first side (see process 344 and FIGS. 17A-17C).

Figure 18A:
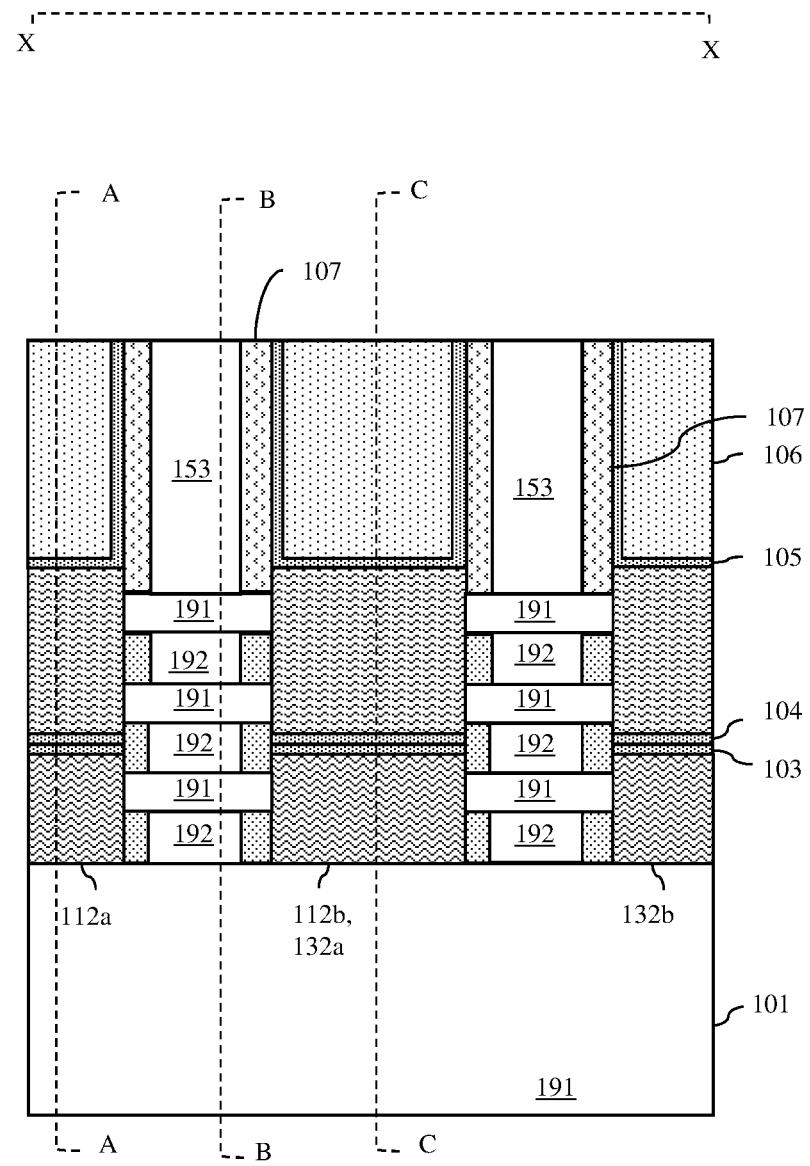
FIGS. 18A-18E are different cross-section diagrams illustrating a partially completed IC structure formed according to the flow diagram of FIGS. 3A-3B.
Figure 18B:
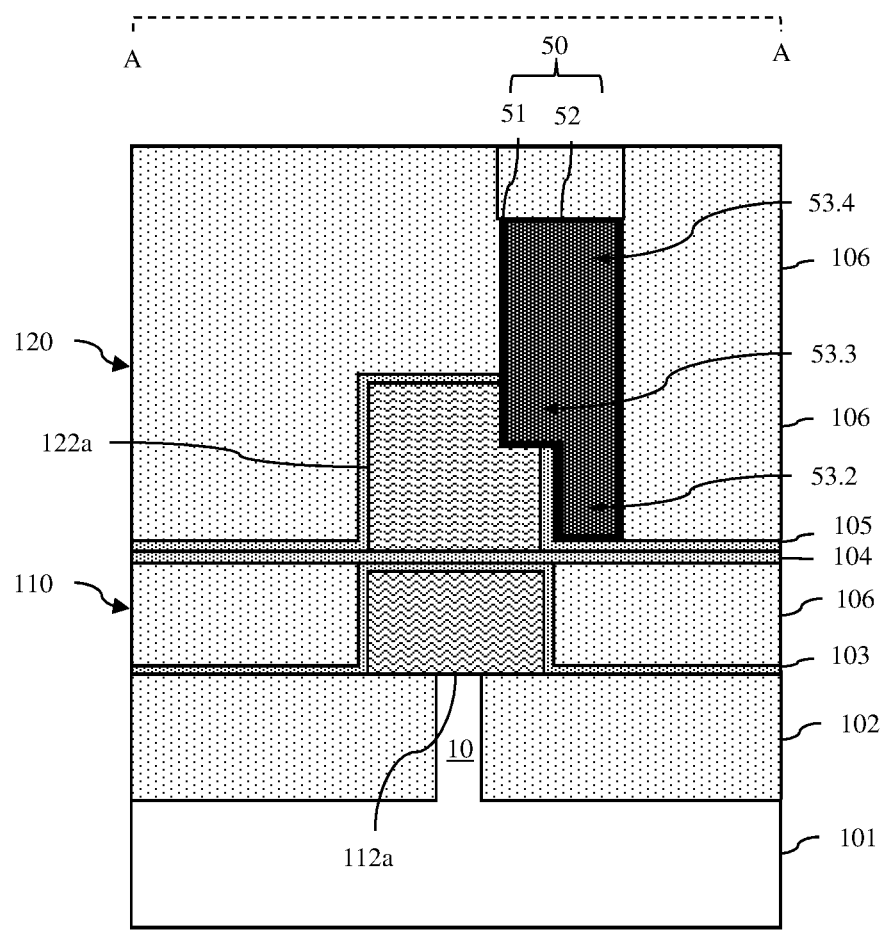
Figure 18C:
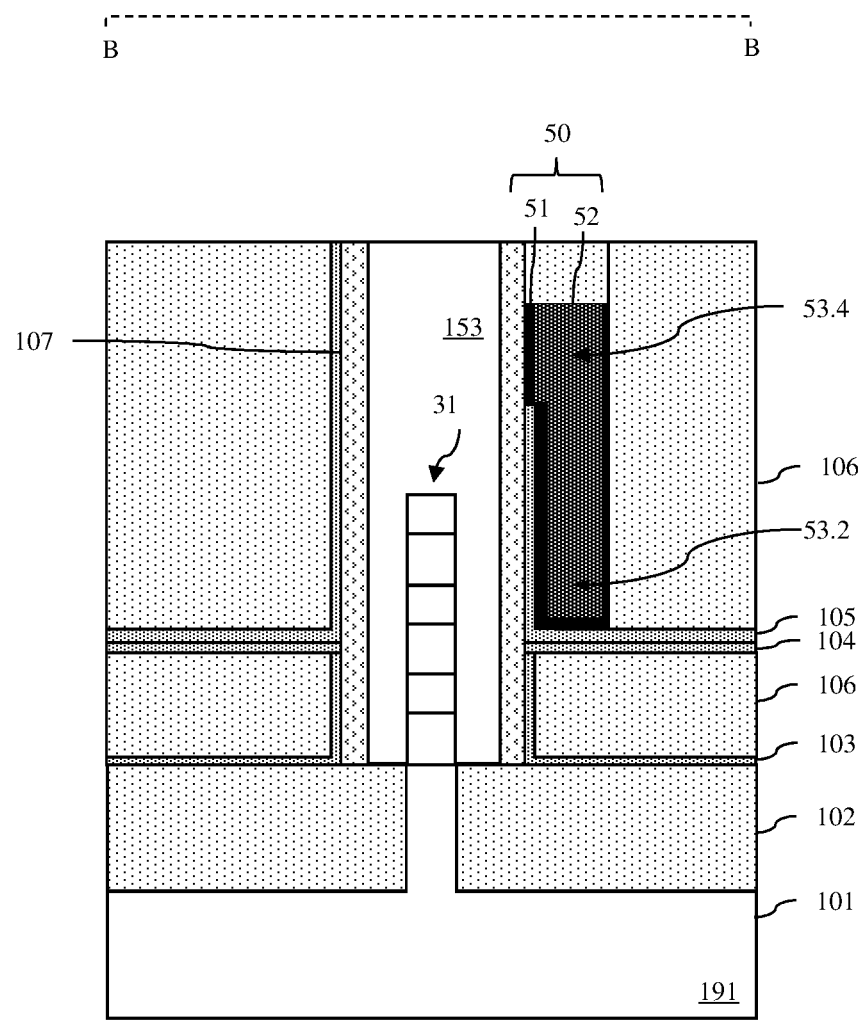
Figure 18D:
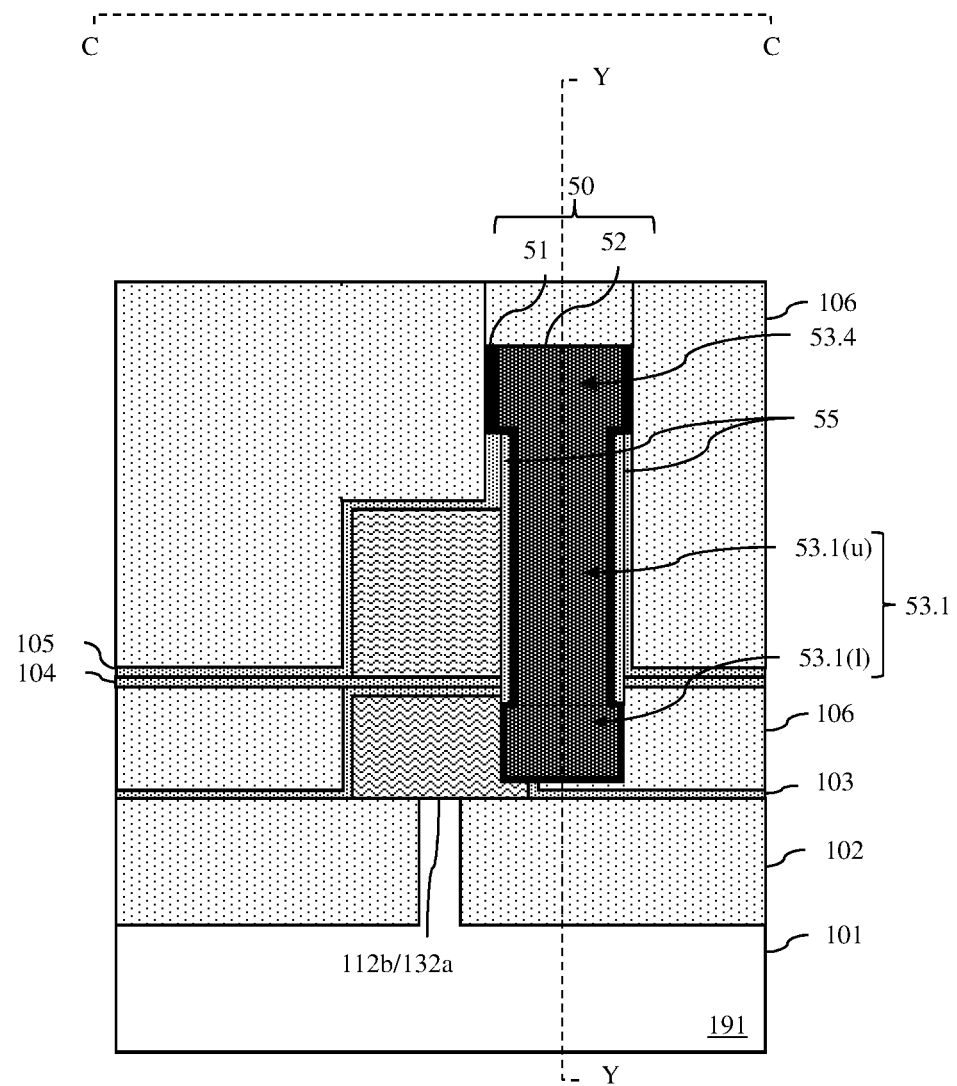
Figure 18E:
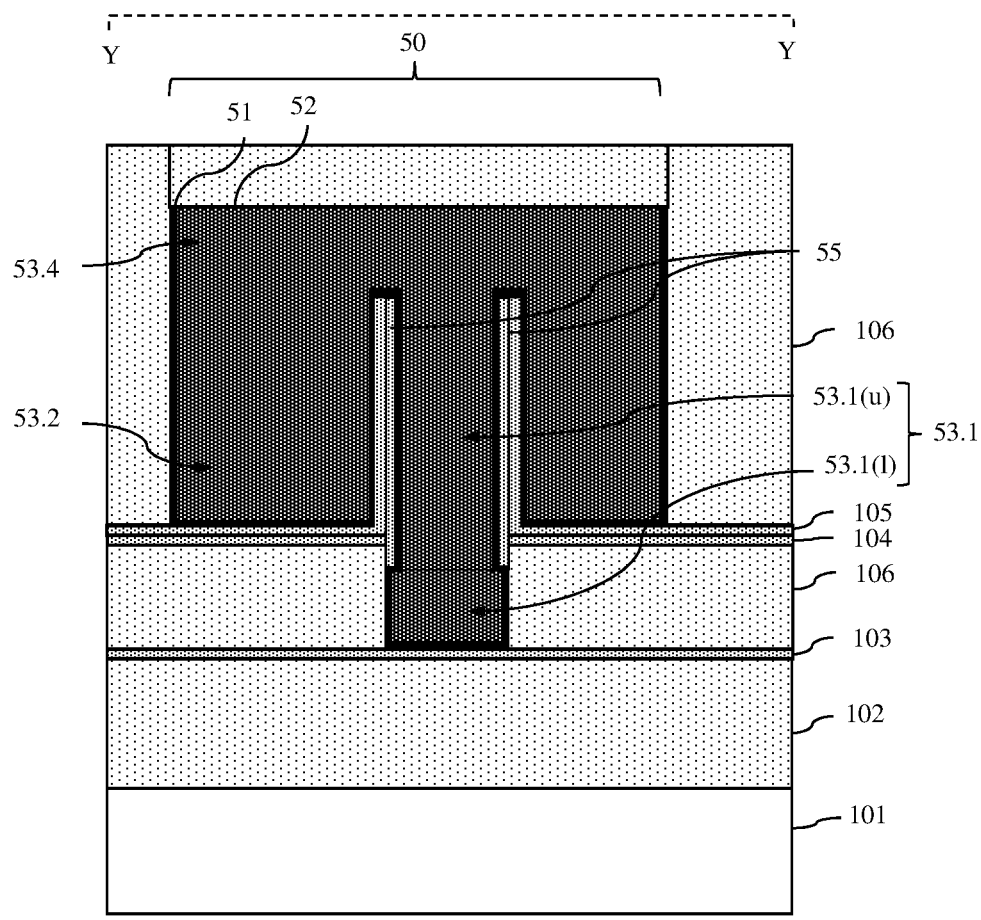

Once the irregular-shaped cavity 53 (with the sections 53.1-53.4 described above) is formed, a metallization process can be performed in order to form an irregular-shaped buried interconnect 50 within the irregular-shaped cavity 53 (see process 346 and FIGS. 18A-18E). The metallization process can include, for example, optional conformal deposition of a liner 51 that lines the irregular-shaped cavity 53. The liner 51 can include, for example, adhesion and/or diffusion barrier layers. The metallization process can further include deposition of a conductor 52 and, particularly, one or more layers of metal and/or metal alloy materials (e.g., ruthenium, tungsten, cobalt, nickel, aluminum, copper, or any other suitable conductor material) on the optional liner 51 so as to fill each of the sections 53.1-53.4 in a single process. Following metallization, the metal material can be etched back (i.e., recessed) so that the top of the conductor 52 in the cavity 53 is below the level of the top of the second dielectric material 106. The second dielectric material 106 or any other suitable dielectric material can be deposited to fill any remaining space within the cavity 53 above and a polishing polishing process (e.g., a CMP process) can be performed (see process 348 and FIGS. 18A-18E). It should be noted that the polishing process can be perform so as to form a dielectric cap over the buried interconnect 50 and further so as to expose the sacrificial gates 153 (i.e., so as to remove the sacrificial gate caps 154), as shown in FIG. 18A.

Referring to FIGS. 2A-2F, following exposure of the sacrificial gates 153, the sacrificial gates 153 can then be selectively removed, thereby creating first portions of gate openings (see process 350). That is, a selective etch process can be performed to selectively etch away the material of the sacrificial gate layer over the materials of the multi-layer fin (i.e., over the first semiconductor material 191 and the second semiconductor material 192) and also over the adjacent dielectric materials, thereby creating first portions of gate openings that expose the remaining portions of the multi-layer fin. Techniques for selectively removing sacrificial gates are well known in the art. Thus, these techniques are omitted from the specification in order to allow the reader to focus on the salient aspects of the disclosed methods.

Once the first portions of the gate openings are formed, the second semiconductor material 192 exposed within the first portions of the gate openings can be selectively etched away to form second portions of the gate openings, respectively (see process 352). Specifically, a selective isotropic etch process can be used to selectively and isotropically etch exposed second semiconductor material without etching the first semiconductor material or the various dielectric materials. Techniques for selectively and isotropically etching one material over others depend upon the different materials, are well known in the art and are omitted from the specification in order to allow the reader to focus on the salient aspects of the disclosed methods.

As a result of process 352 (i.e., as a result of forming the second portions of the gate openings), at least one discrete elongated nanoshape of the first semiconductor material 191 will extend laterally between the first sources/drain regions 112a-112b, 132a-132b, thereby forming first channel region(s) 111, 131. Furthermore, at least one discrete elongated nanoshape of the first semiconductor material 191 will extend laterally between the second source/drain regions 122a-122b, 142a-142b, thereby forming second channel region(s) 121, 141.

Shared gates 151, 156 can then be formed in the gate openings (see process 360). The shared gates can be formed using replacement metal gate (RMG) formation techniques. Specifically, the shared gate 151 can be formed in the gate opening adjacent to the first channel region(s) 111 and the second channel region(s) 121. Furthermore, the shared gate 156 can be formed in the gate opening adjacent to the first channel region(s) 131 and the second channel region(s) 141. In one exemplary embodiment, the shared gates 151, 152 can be formed as single work function RMGs. In another exemplary embodiment, as described below, the shared gates 151, 156 can be formed so as dual work function RMGs.

For example, the shared dual work function RMGs can each have a lower section (l) and an upper section (u) above the lower section. The lower section (l) can be on the substrate and can be adjacent to the first channel region(s) and the upper section (u) can be above the lower section (l) and can be adjacent to the second source/drain region(s). For example, in the case of a stacked pair of GAAFETs, the lower section (l) can wrap around the first channel region(s) (i.e. can be above, below and on the opposing sides of the first channel region(s)) and the upper section (u) can wrap around the second channel region(s) (i.e. can be above, below and on the opposing sides of the second channel region(s)). Furthermore, the lower section (l) can have a first work function optimal for performance of a FET with a first-type conductivity (e.g., for a P-type FET) and the upper section (u) can have a second work function optimal for performance of a FET with a second-type conductivity (e.g., for an N-type FET).

To form such shared dual work function RMGs 151, 156, a conformal gate dielectric layer (e.g., a conformal high-K gate dielectric layer) can be deposited so that it is immediately adjacent to the first and second channel regions. A conformal first work function metal layer can then be deposited, followed by deposition of a conductive fill material. These metals can be recessed to expose the second channel region(s) in each gate opening. Then, a conformal second work function metal layer, which is different from the first work function metal layer, can be deposited, followed again by deposition of the conductive fill material. These metals can then be recessed without exposing the second channel region(s) in each opening, thereby forming the shared RMGs 151, 156. Next, a dielectric gate cap material (e.g., silicon nitride) can be deposited and a polishing process (e.g., a CMP process) can be performed in order to remove any of the dielectric gate cap material from above the adjacent second dielectric material 106, thereby forming the dielectric gate caps 157 on the shared RMGs 151, 156 (see process 362).

Conventional middle of the line (MOL) and back end of the line (BEOL) processing can then be performed in order to compete the IC structure 100 (see process 364). MOL processing can include, but is not limited to, the formation of MOL contacts to the shared RMGs 151, 156 and to any of the source/drain regions, as necessary. BEOL processing can include, but is not limited to, the formation of the various metal level wires, such as BEOL wires connected to the MOL contacts, and any other BEOL wires required.

It should be understood that the method described above and illustrated in the figures is not intended to be limiting. Different techniques could, alternatively, be used to form the IC structure shown in FIGS. 2A-2F. Furthermore, it should be understood that additional process steps (not shown or discussed) could be integrated into the disclosed process steps in order to enable other power and/or signal connections to and/or between the source/drain regions of the FETs to be made. These additional process steps have been omitted from the specification and drawings in order to allow the reader to focus on the salient aspects of the disclosed method. However, these additional process steps could include, for example, the formation of any of the following features (not shown): the formation of buried wires in the isolation region 102 prior to formation of the stacked pairs of FETs; the formation of buried wires at the same level as the first source/drain regions and/or at the same level as the second source/drain regions; the formation of embedded contacts that allow for electrical connections from source/drain regions to buried wires and/or back end of the line (BEOL) wires; etc. Optionally, the buried wires and/or embedded contacts could be formed in conjunction with formation of some of the features described above. For example, an embedded contact opening in a first source/drain region 112a of the first FET 110 could be patterned and etched at the same time as the first section 53.1 of the cavity 53; wire trenches for buried wires at the same level as the second source/drain regions could be patterned and etched at the same times as the second section 53.2 of the cavity; etc.

In the above-described structure and method embodiments the first FETs 110, 130 are described as having the first-type conductivity (e.g., as being P-type) and the second FETs 120, 140 are described as having the second-type conductivity (e.g., as being N-type FET). For a P-type FET, the channel region(s) can have N-type conductivity at a relatively low conductivity level (or can be undoped) and the source/drain regions can have P-type conductivity at a relatively high conductivity level; whereas, for an N-type FET, the channel region(s) can have P-type conductivity at a relatively low conductivity level (or can be undoped) and the source/drain regions can have N-type conductivity and a relatively high conductivity level. Those skilled in the art will recognize that different dopants can be used to achieve the different conductivity types and that the dopants may vary depending upon the different semiconductor materials used. For example, a silicon-based semiconductor material (e.g., silicon, silicon germanium, etc.) having P-type conductivity is typically doped with a P-type dopant (e.g., a Group III dopant, such as boron (B) or indium (In)), whereas a silicon-based semiconductor material having N-type conductivity is typically doped with an N-type dopant (e.g., a Group V dopant, such as arsenic (As), phosphorous (P) or antimony (Sb)). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

Additionally, in the above-described structure and method embodiments the shared gates 151, 156 are described as, optionally, being shared dual work function RMGs with a lower section (l) having a first work function and an upper section (u) having a second work function. In these dual work function RMGs, the gate dielectric layer can be a high-K gate dielectric layer. The high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The different work function metals of the lower and upper section can be preselected in order to achieve the optimal gate conductor work function given the conductivity type of the FET. For example, the optimal gate conductor work function for the P-type FETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for N-type FETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. Any conductive fill material used can be a fill metal or fill metal alloy, such as tungsten, a tungsten alloy (e.g., tungsten silicide or titanium tungsten), cobalt, aluminum or any other suitable fill metal or fill metal alloy.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "second", "first", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
    a stacked pair of transistors comprising:
        a first transistor comprising: two first source/drain regions and at least one first channel region positioned laterally between the two first source/drain regions;
        a conformal dielectric layer above the two first source/drain regions;
        a second transistor comprising: two second source/drain regions on the conformal dielectric layer above the two first source/drain regions, respectively, and at least one second channel region positioned laterally between the two second source/drain regions; and
        a shared gate with a gate sidewall spacer, the shared gate being adjacent to the at least one first channel region and the at least one second channel region; and
    a buried interconnect electrically connecting a first source/drain region of the two first source/drain regions to a second source/drain region of the two second source/drain regions, wherein the first source/drain region is on a first side of the shared gate and the second source/drain region is on a second side of the shared gate opposite the first side and wherein the buried interconnect is electrically isolated from the shared gate by the gate sidewall spacer.

2. The integrated circuit structure of claim 1, wherein the buried interconnect comprises: an irregular-shaped cavity; a liner lining the irregular-shaped cavity so as to be immediately adjacent to surfaces of the first source/drain region and the second source/drain region; and a conductor on the liner and filling the irregular-shaped cavity such that the first source/drain region is electrically connected to the second source/drain region.

3. The integrated circuit structure of claim 2, wherein the irregular-shaped cavity has:
    a first section comprising:
        a lower portion in the first source/drain region; and
        an upper portion above the lower portion, the upper portion extending vertically through the conformal dielectric layer and an interface between an additional second source/drain region of the two second source/drain regions and a blanket dielectric layer, the upper portion having sidewalls lined with a dielectric spacer;
    a second section in the blanket dielectric layer above the conformal dielectric layer, the second section extending laterally from adjacent to the dielectric spacer to beyond the shared gate;
    a third section extending from the second section to the second source/drain region; and
    a fourth section in the blanket dielectric layer above and immediately adjacent to the first section, the dielectric spacer, the second section and the third section.

4. The integrated circuit structure of claim 3, wherein the upper portion of the first section extends vertically through the second section.

5. The integrated circuit structure of claim 3, wherein the lower portion of the first section extends vertically through the first source/drain region.

6. The integrated circuit structure of claim 1, the first transistor having a first type conductivity and the second transistor having a second type conductivity that is different from the first type conductivity.

7. The integrated circuit structure of claim 1, the stacked pair of transistors comprising a stacked pair of gate-all-around field effect transistors.

8. A method comprising:
    forming a stacked pair of transistors comprising:
        a first transistor comprising: two first source/drain regions and at least one first channel region positioned laterally between the two first source/drain regions;
        a conformal dielectric layer above the two first source/drain regions;
        a second transistor comprising: two second source/drain regions on the conformal dielectric layer above the two first source/drain regions, respectively, and at least one second channel region positioned laterally between the two second source/drain regions; and
        a gate with a gate sidewall spacer, the gate being adjacent to the at least one first channel region and the at least one second channel region; and
    during the forming of the stacked pair of transistors, forming a buried interconnect electrically connecting a first source/drain region of the two first source/drain regions and a second source/drain region of the two second source/drain regions, wherein the first source/drain region is on a first side of the gate and the second source/drain region is on a second side of the gate opposite the first side.

9. The method of claim 8, wherein the forming of the buried interconnect comprises:
    forming an irregular-shaped cavity that exposes surfaces of the first source/drain region and the second source/drain region;
    lining the irregular-shaped cavity with a liner such that the liner is immediately adjacent to the surfaces of the first source/drain region and the second source/drain region exposed within the irregular-shaped cavity; and
    depositing a conductor on the liner to fill the irregular-shaped cavity such that the first source/drain region is electrically connected to the second source/drain region.

10. The method of claim 9, wherein the irregular-shaped cavity is formed at different stages during the forming of the stacked pair of transistors so as to have:
    a first section comprising:
        a lower portion in the first source/drain region; and
        an upper portion above the lower portion, the upper portion extending vertically through the conformal dielectric layer and an interface between an additional second source/drain region of the two second source/drain regions and a blanket dielectric layer, the upper portion having sidewalls lined with a dielectric spacer;
    a second section in the blanket dielectric layer above the conformal dielectric layer, the second section extending laterally from adjacent to the dielectric spacer to beyond the gate;
    a third section extending from the second section to the second source/drain region; and a fourth section in the blanket dielectric layer above and immediately adjacent to the first section, the dielectric spacer, the second section and the third section, the buried interconnect being electrically isolated from the gate and the second source/drain region by the gate sidewall spacer and the dielectric spacer.

11. The method of claim 10, wherein the irregular-shaped cavity is further formed so that the upper portion of the first section extends vertically through the second section.

12. The method of claim 10, wherein the irregular-shaped cavity is further formed so that the lower portion of the first section extends vertically through the first source/drain region.

13. The method of claim 10, the first transistor having a first type conductivity and the second transistor having a second type conductivity that is different from the first type conductivity.

14. The method of claim 10, wherein the forming of the stacked pair of transistors comprising forming a stacked pair of gate-all-around field effect transistors.

15. A method comprising:
forming a stacked pair of transistors comprising:
a first transistor comprising: two first source/drain regions and at least one first channel region positioned laterally between the two first source/drain regions;
a conformal dielectric layer above the two first source/drain regions;
a second transistor comprising: two second source/drain regions on the conformal dielectric layer above the two first source/drain regions, respectively, and at least one second channel region positioned laterally between the two second source/drain regions; and
a sacrificial gate with a gate sidewall spacer, the sacrificial gate being adjacent to the at least one first channel region and the at least one second channel region; and during the forming of the stacked pair of transistors, performing the following:
forming an irregular-shaped cavity such that surfaces of the irregular-shaped cavity include dielectric material surfaces, a surface of a first source/drain region of the two first source/drain regions and a surface of a second source/drain region of the two second source/drain regions,
wherein the first source/drain region is on a first side of the sacrificial gate and the second source/drain region is on a second side of the sacrificial gate,
wherein different sections of the irregular-shaped cavity are formed at different stages during the forming of the stacked pair of transistors and filled with a sacrificial material, and
wherein, when all sections of the irregular-shaped cavity are completed, the sacrificial material is selectively removed to expose the dielectric material surfaces, the surface of the first source/drain region and the surface of the second source/drain region;

forming a buried interconnect in the irregular-shaped cavity, the buried interconnect electrically connecting the first source/drain region of the first transistor and the second source/drain region of the second transistor; and replacing the sacrificial gate with a shared gate.

16. The method of claim 15, wherein the forming of the buried interconnect comprises:
lining the irregular-shaped cavity with a liner; and
depositing a conductor on the liner to fill the irregular-shaped cavity such that the first source/drain region is electrically connected to the second source/drain region.

17. The method of claim 15, wherein the irregular-shaped cavity is formed so as to have:
a first section comprising:
a lower portion in the first source/drain region; and
an upper portion above the lower portion, the upper portion extending vertically through the conformal dielectric layer and an interface between an additional second source/drain region of the two second source/drain regions and a blanket dielectric layer, the upper portion having sidewalls lined with a dielectric spacer;
a second section in the blanket dielectric layer above the conformal dielectric layer, the second section extending in a first direction from the dielectric spacer to beyond the shared gate;
a third section extending in a second direction from the second section to the second source/drain region, the second direction being essentially perpendicular to the first direction; and
a fourth section in the blanket dielectric layer above and immediately adjacent to the first section, the dielectric spacer, the second section and the third section,
the buried interconnect being electrically isolated from the shared gate and the second source/drain region by the gate sidewall spacer and the dielectric spacer.

18. The method of claim 17, wherein the irregular-shaped cavity is further formed so that the upper portion of the first section extends vertically through the second section.

19. The method of claim 17, wherein the irregular-shaped cavity is further formed so that the lower portion of the first section extends vertically through the first source/drain region.

20. The method of claim 15, wherein the forming of the stacked pair of transistors comprising forming a stacked pair of gate-all-around field effect transistors with the first transistor having a first type conductivity and the second transistor having a second type conductivity that is different from the first type conductivity.

* * * * *